United States Patent [19]
Takashima et al.

[11] Patent Number: 5,761,109
[45] Date of Patent: Jun. 2, 1998

[54] SEMICONDUCTOR MEMORY DEVICE HAVING FOLDED BIT LINE ARRAY AND AN OPEN BIT LINE ARRAY WITH IMBALANCE CORRECTION

[75] Inventors: Daisaburo Takashima, Yokohama; Tsuneo Inaba, Ichikawa; Yukihito Oowaki; Takashi Ohsawa, both of Yokohama; Shinichiro Shiratake, Tokyo, all of Japan

[73] Assignee: Kabushiki Kaisha Toshiba, Kawasaki, Japan

[21] Appl. No.: 614,537

[22] Filed: Mar. 13, 1996

[30] Foreign Application Priority Data

Mar. 16, 1995 [JP] Japan .................... 7-083454
Apr. 12, 1995 [JP] Japan .................... 7-087170

[51] Int. Cl.⁶ ........................................ G11C 5/06
[52] U.S. Cl. .................. 365/63; 365/51; 365/149; 365/189.07; 365/189.08
[58] Field of Search ................. 365/63, 51, 149, 365/189.07, 189.08

[56] References Cited

U.S. PATENT DOCUMENTS

| | | | |
|---|---|---|---|
| 4,656,613 | 4/1987 | Norwood et al. | 365/208 |
| 5,339,273 | 8/1994 | Taguchi | 365/201 |
| 5,550,769 | 8/1996 | Hidaka et al. | 365/63 |
| 5,555,519 | 9/1996 | Takashima et al. | 365/63 |
| 5,602,772 | 2/1997 | Nakano et al. | 365/51 |
| 5,625,234 | 4/1997 | Suzuki et al. | 257/773 |

FOREIGN PATENT DOCUMENTS 0 240 155   10/1987   European Pat. Off.

OTHER PUBLICATIONS

IEICE Transaction on Electronics, vol. E77–C, No. 5, pp. 869–872, May 1, 1994, D. Takashima, et al., "Open/Folded Bit–Line Arrangement For Ultra–High Density Dram's".

Primary Examiner—David C. Nelms
Assistant Examiner—Hien Nguyen
Attorney, Agent, or Firm—Oblon, Spivak, McClelland, Maier & Neustadt, P.C.

[57] ABSTRACT

A dynamic semiconductor memory device according to the present invention comprises at least first and second memory cell arrays having a plurality of memory cells selectively arranged at respective intersections of a plurality of word lines and a plurality of bit lines, a first sense amplifier section connected at an end of the first cell array to a plurality of bit line pairs formed by part of the plurality of bit lines of the first cell array, the plurality of bit line pairs having a folded bit line configuration, a second sense amplifier section connected to sets of bit line pairs, each formed by one of the remaining bit lines of the first cell array and one of part of the plurality of bit lines of the second cell array, the plurality of bit line pairs having an open bit line configuration, and a correction circuit for correcting the level of ease for reading data "0" and that of reading data "1".

25 Claims, 53 Drawing Sheets

—φ₂  FIG. 17C

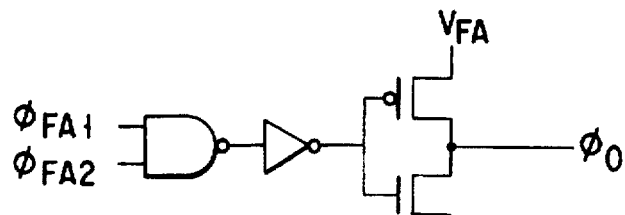
F I G. 18A
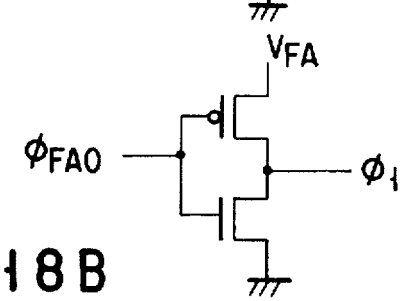
F I G. 18B
F I G. 18C
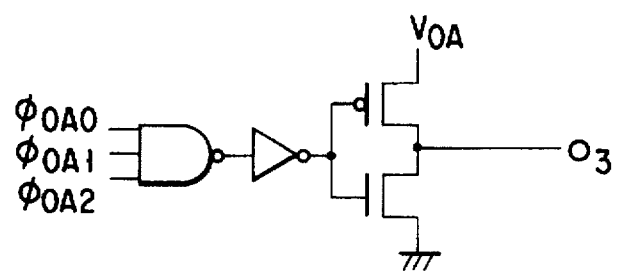
F I G. 18D
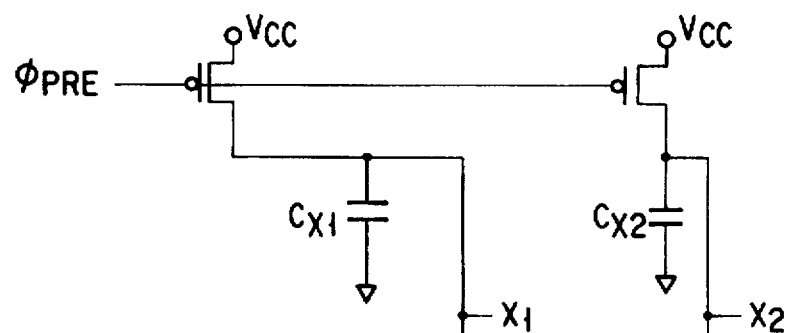
F I G. 19
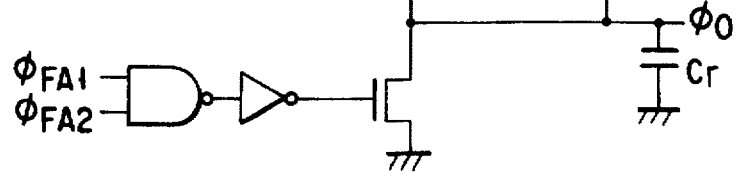

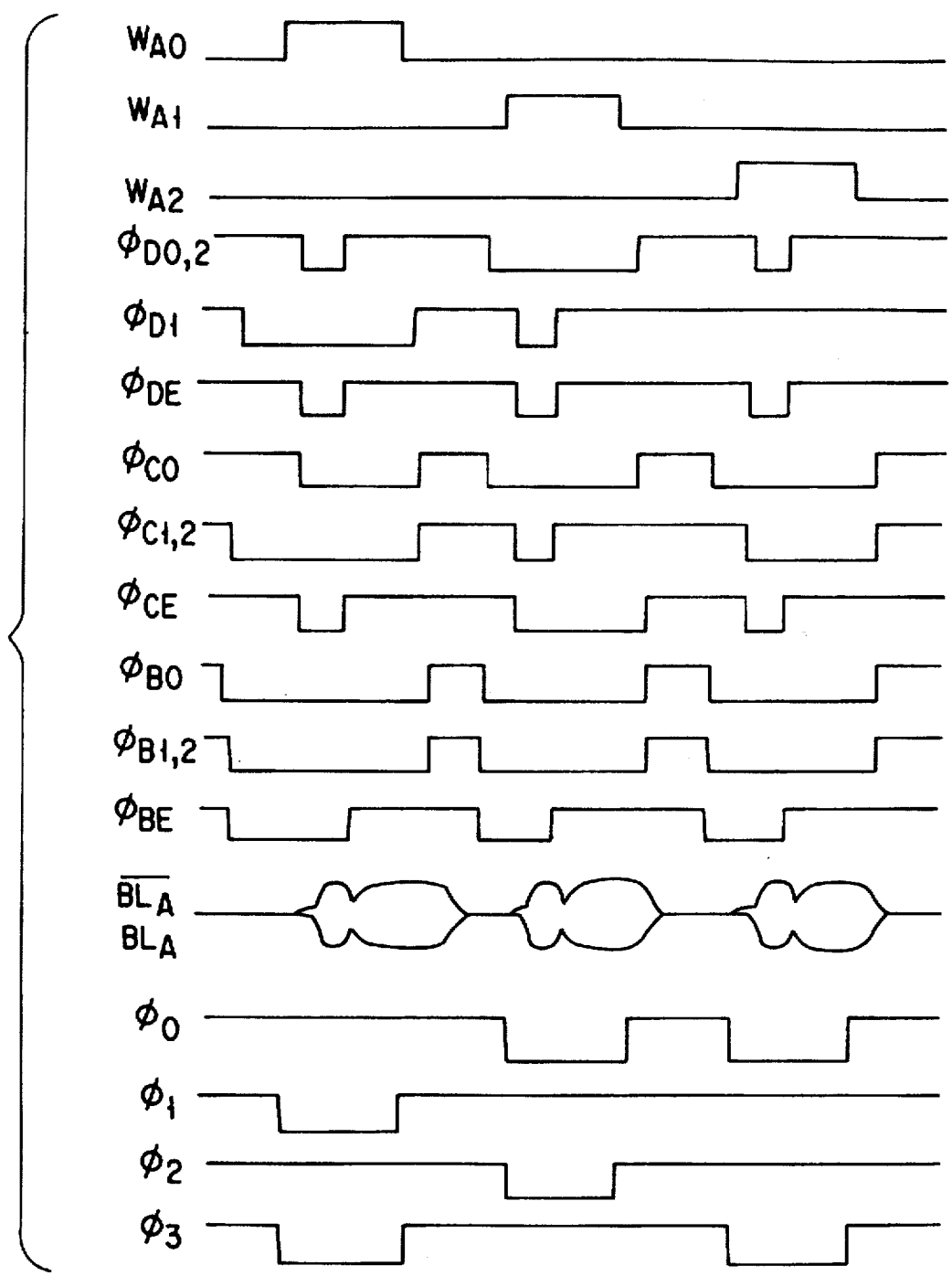
F I G. 21

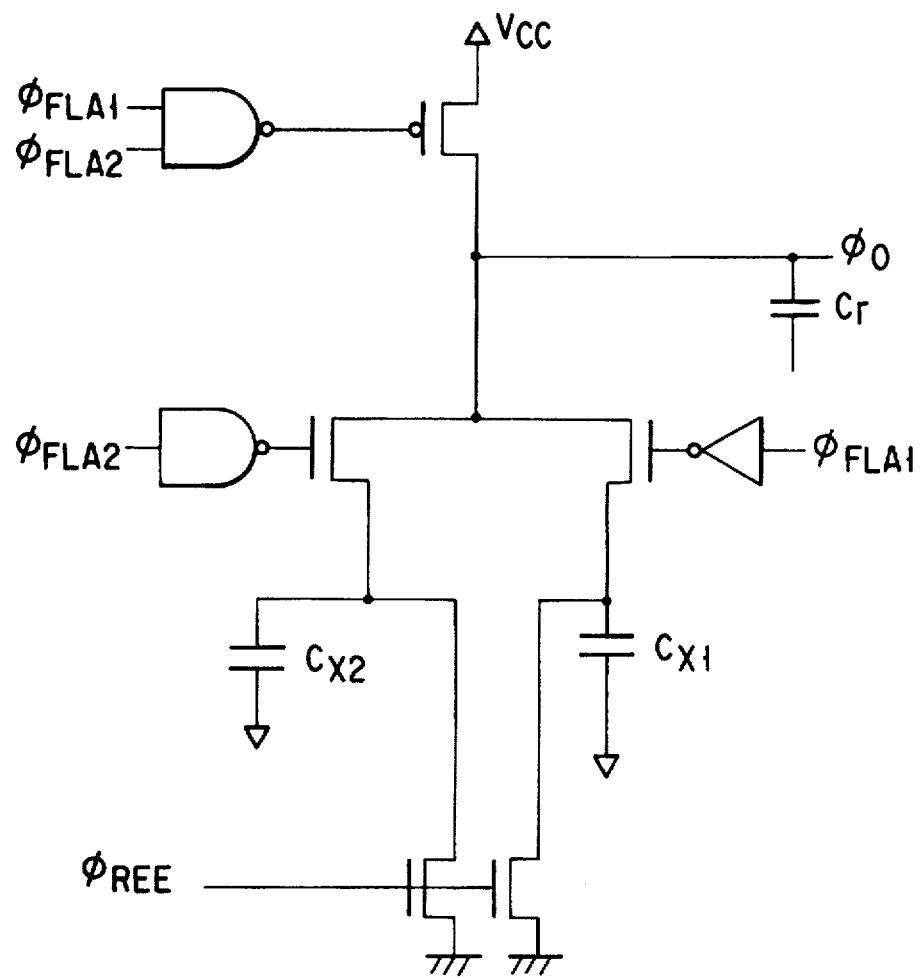
F I G. 25

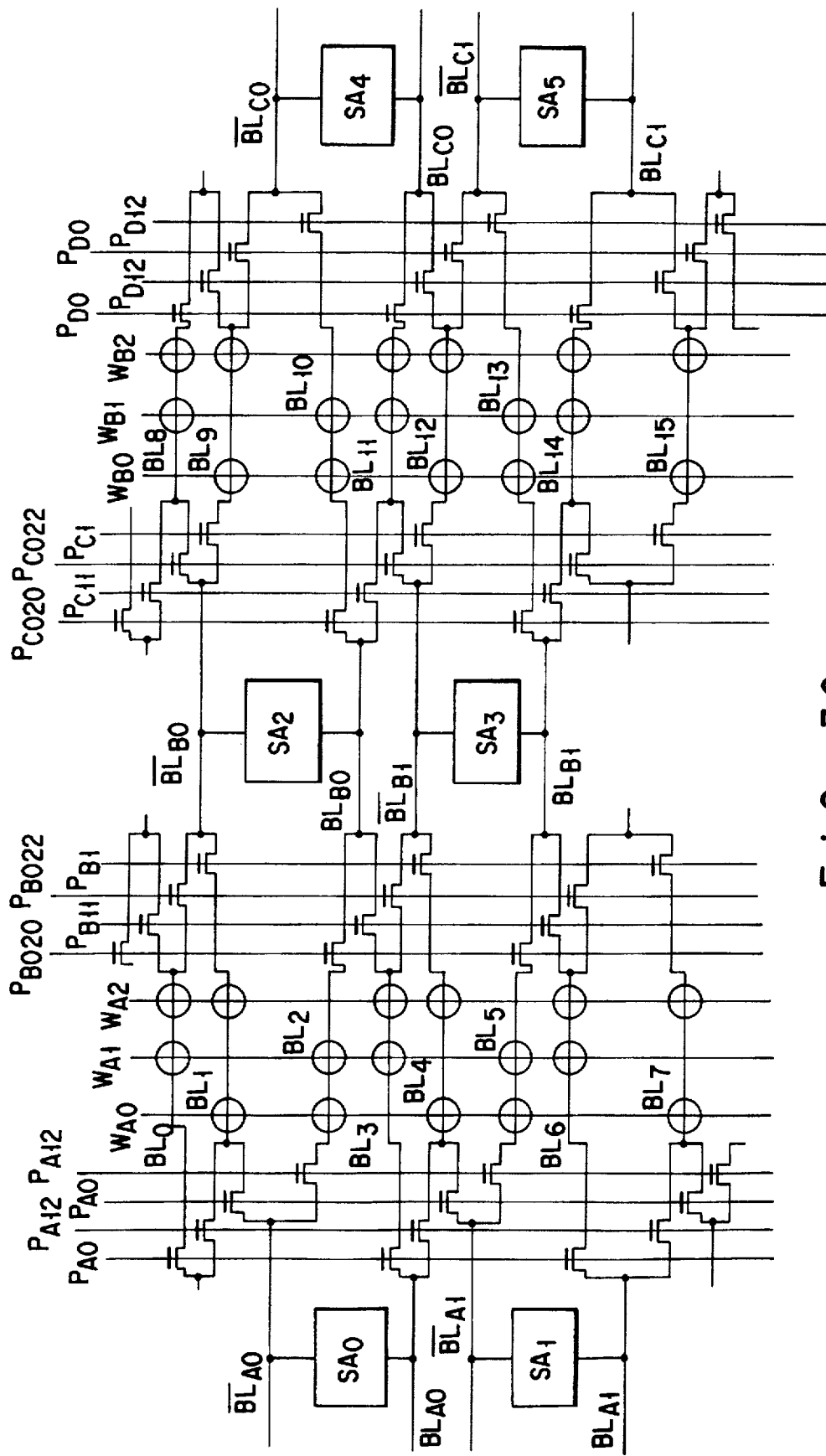
F I G. 30

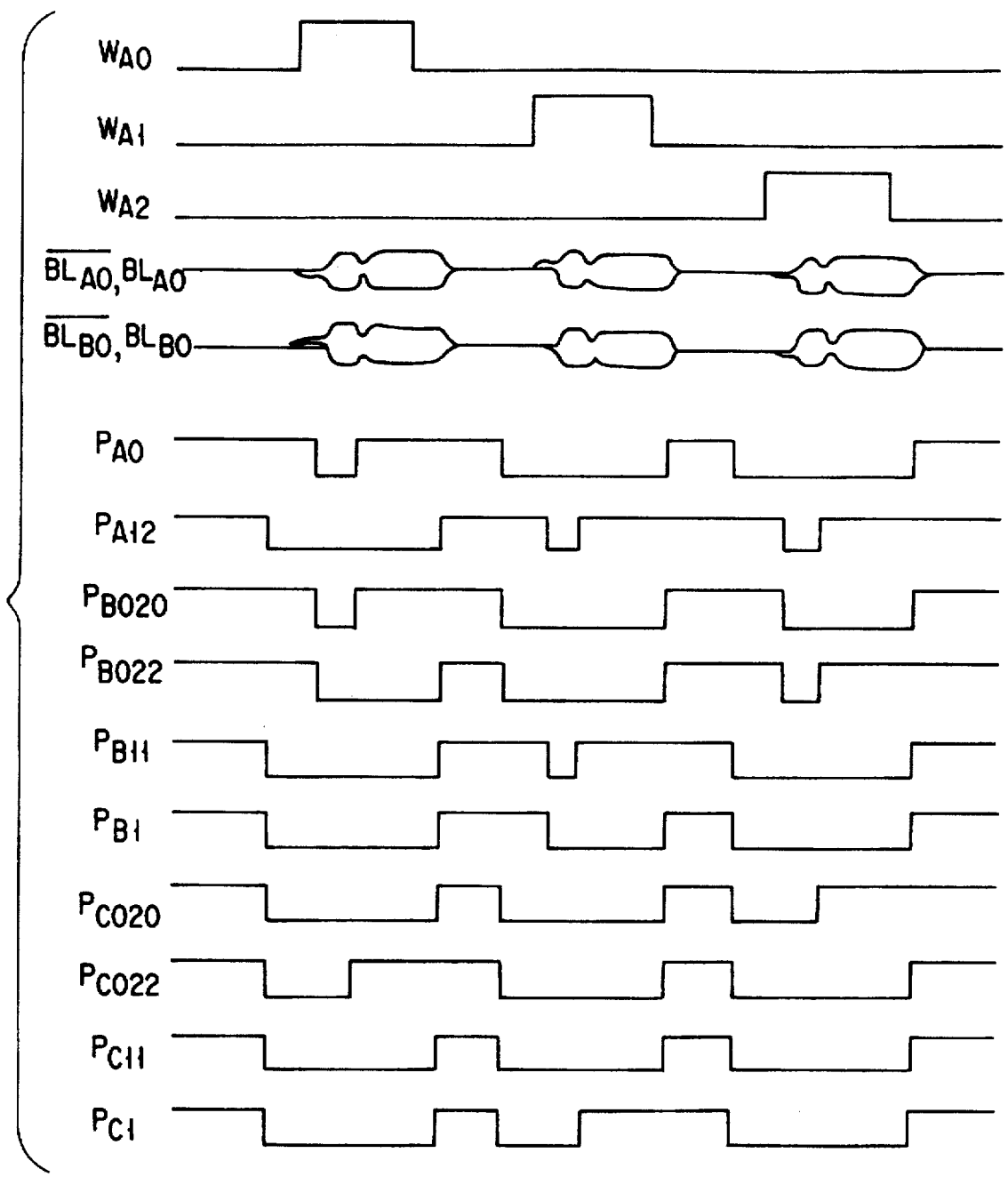
F I G. 31

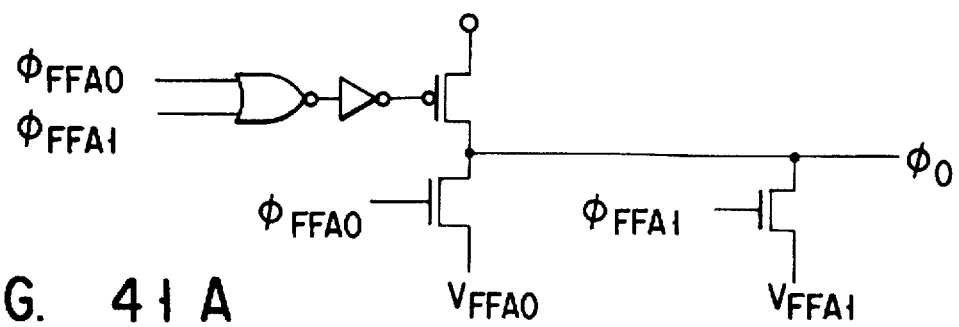
F I G. 41 A
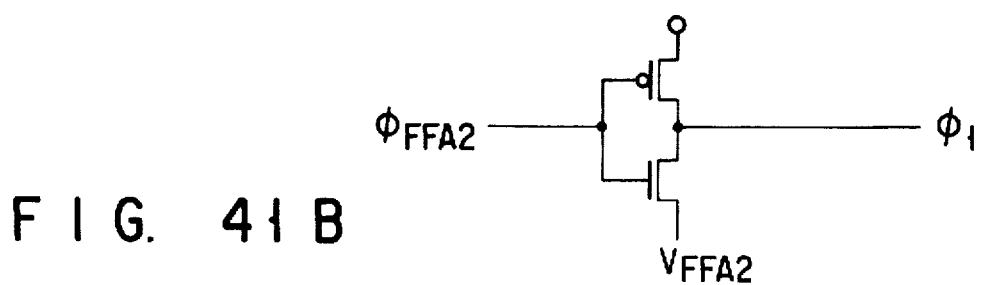
F I G. 41 B
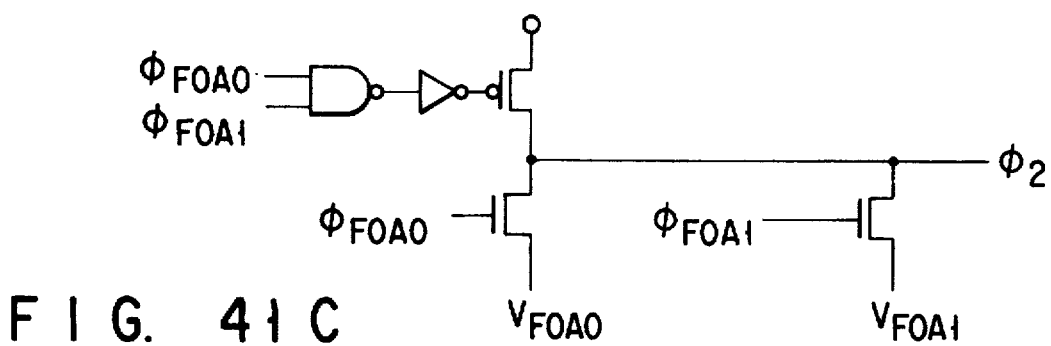
F I G. 41 C
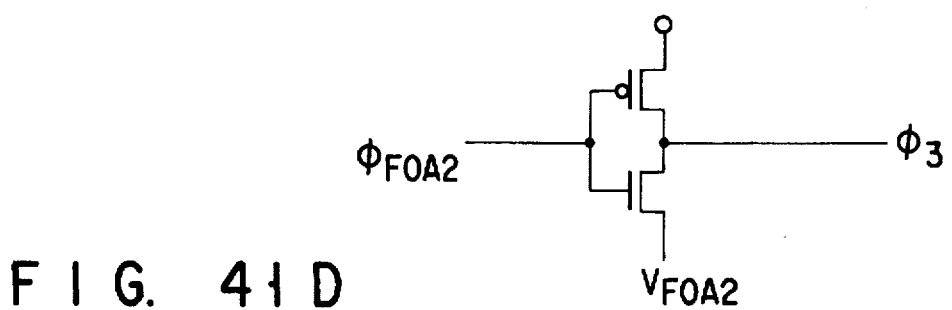
F I G. 41 D

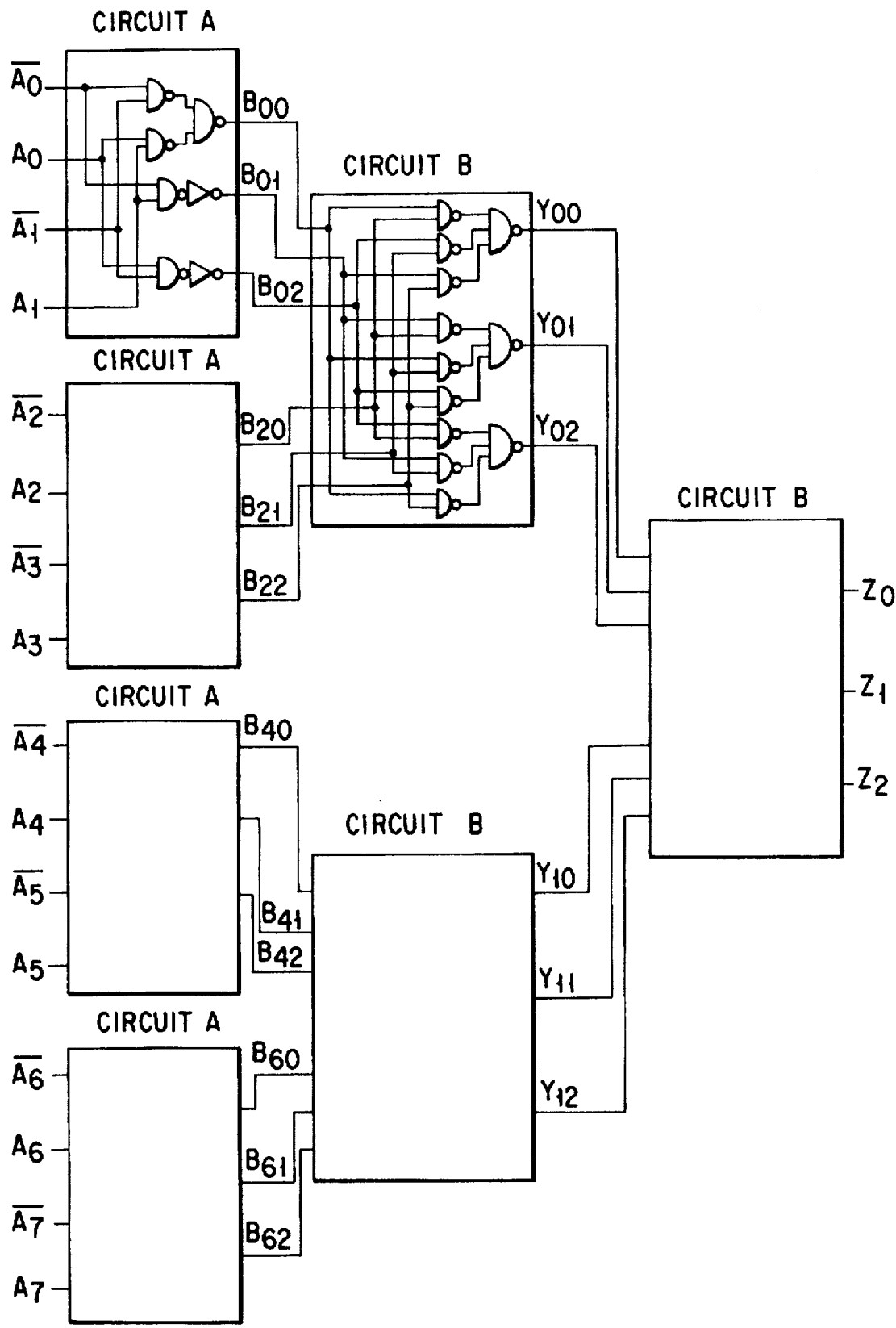
F I G. 44

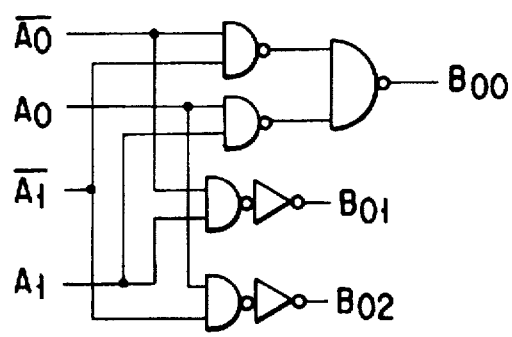
CIRCUIT A
F I G. 45A
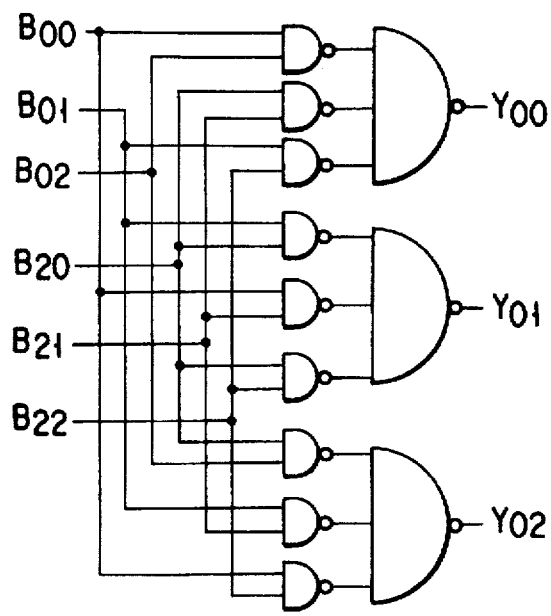
CIRCUIT B
F I G. 45B
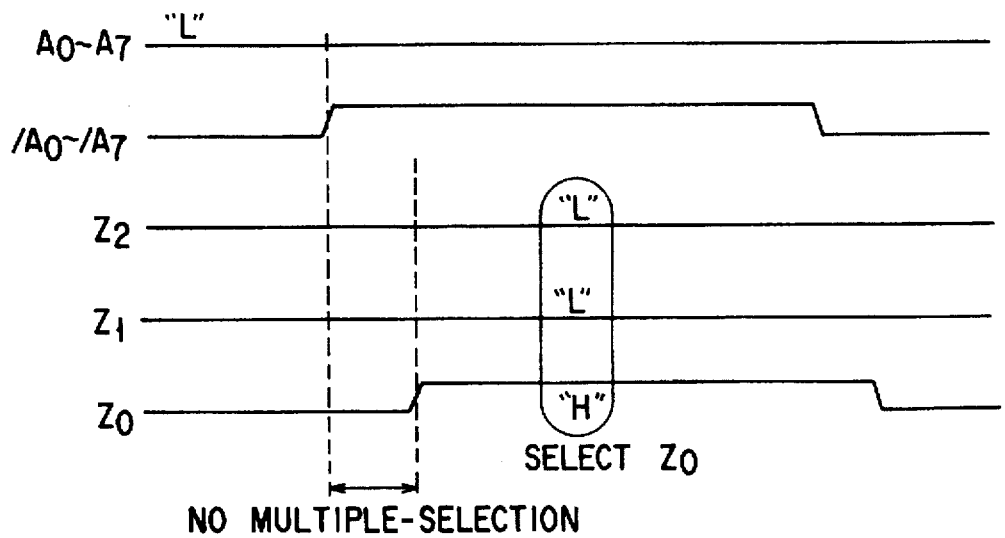
F I G. 46

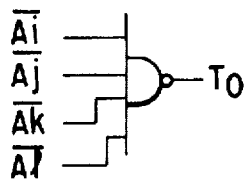 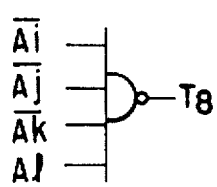 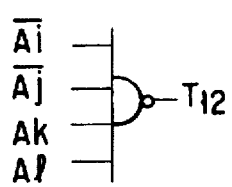
FIG. 48A    FIG. 48E    FIG. 48I    FIG. 48M
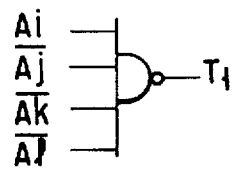 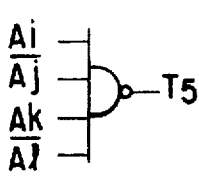 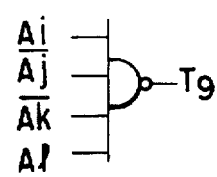 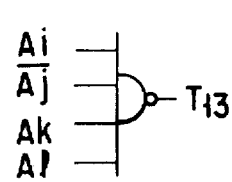
FIG. 48B    FIG. 48F    FIG. 48J    FIG. 48N
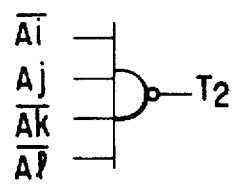 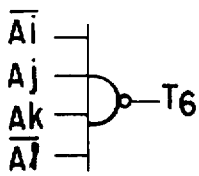 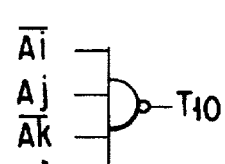 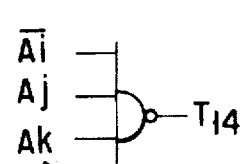
FIG. 48C    FIG. 48G    FIG. 48K    FIG. 48O
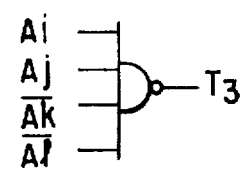 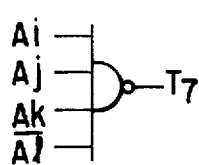 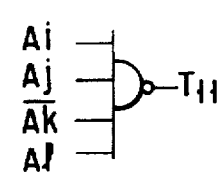 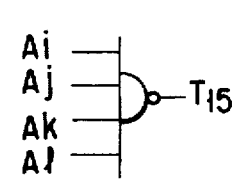
FIG. 48D    FIG. 48H    FIG. 48L    FIG. 48P
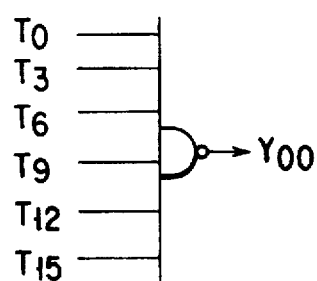 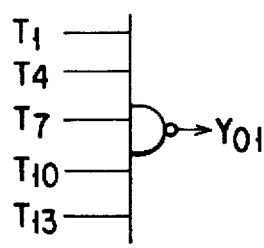 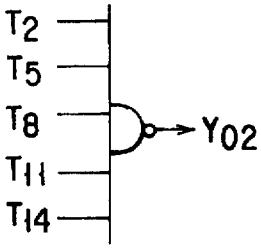
FIG. 48Q    FIG. 48R    FIG. 48S

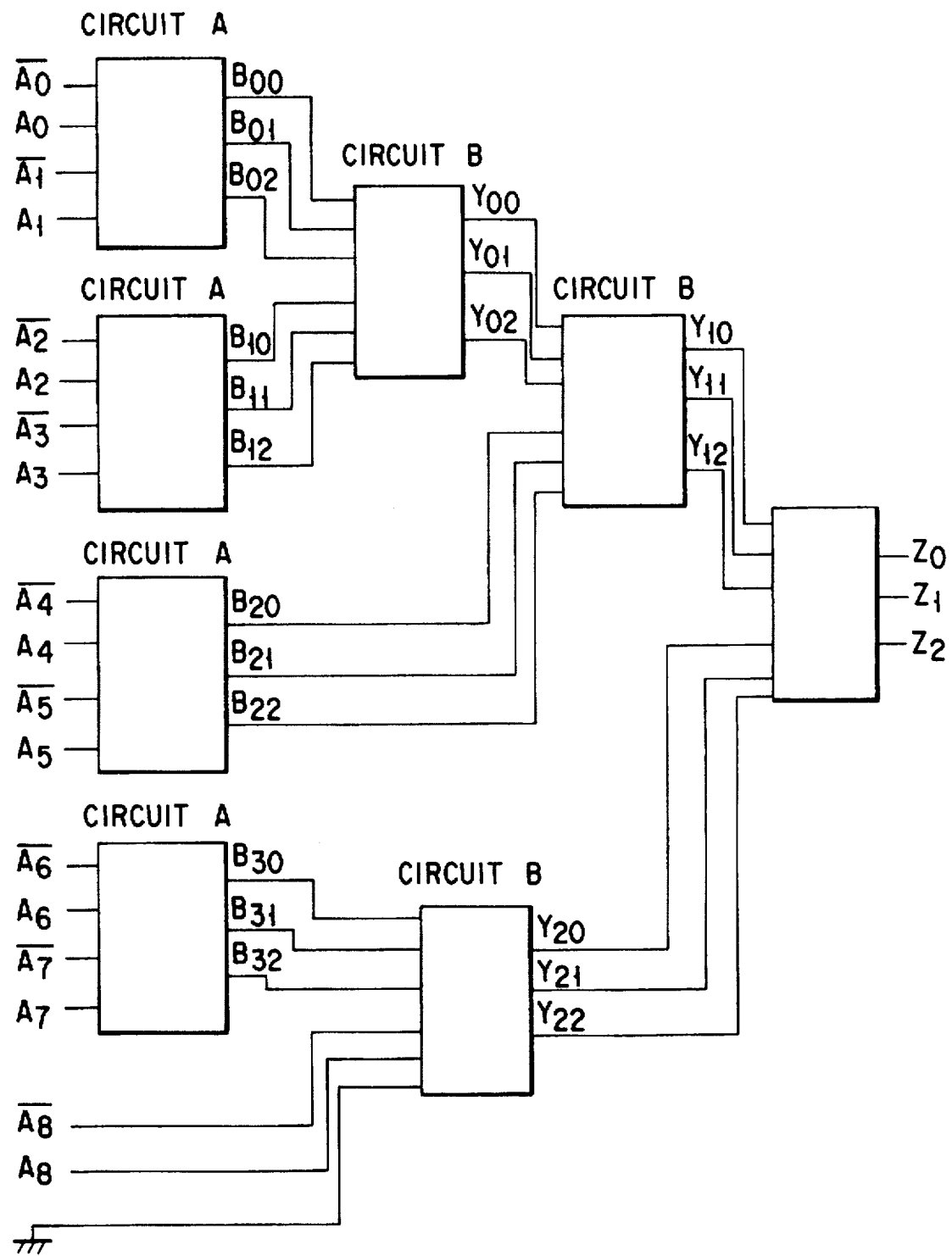
F I G. 50

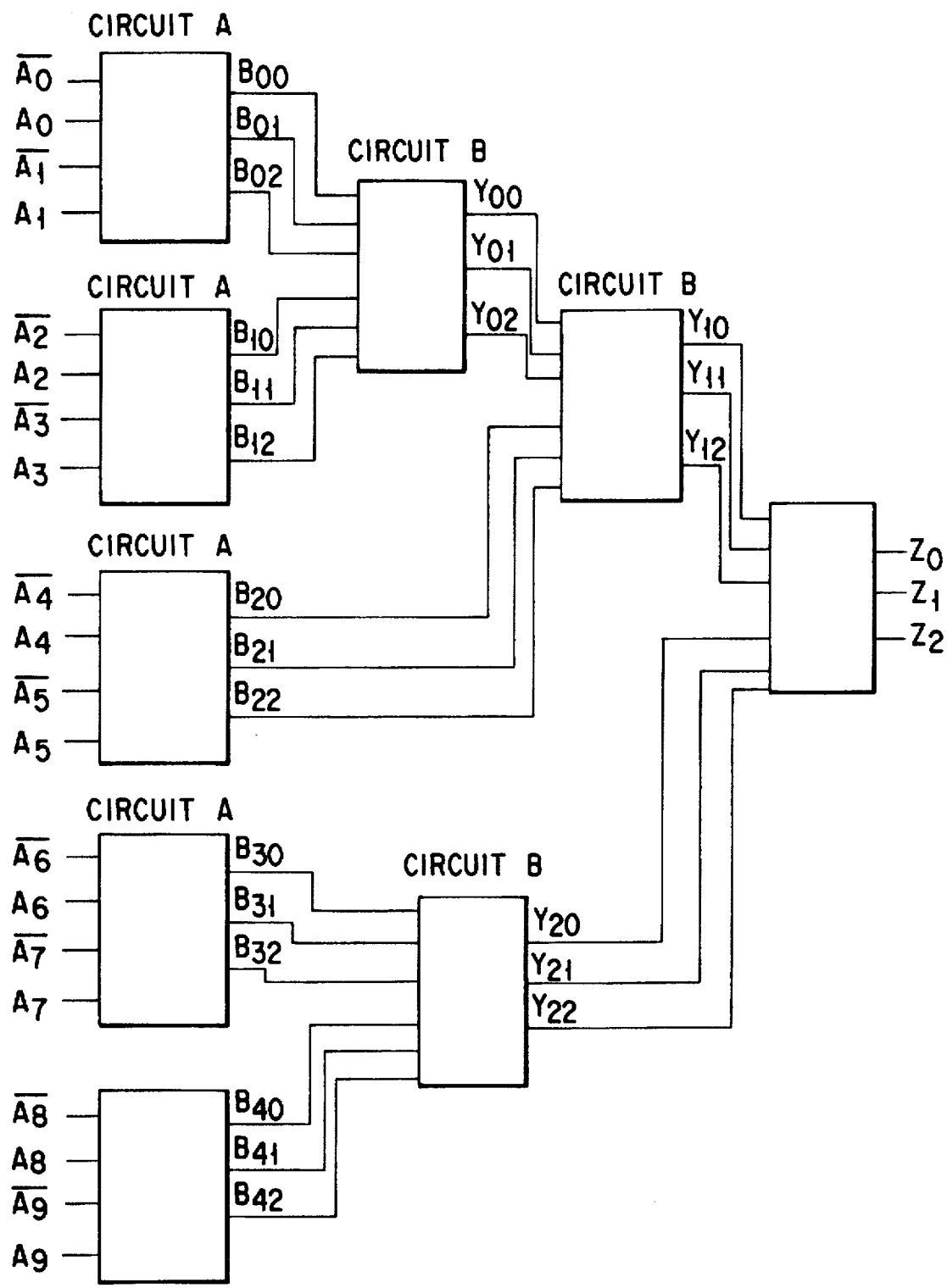
F I G. 52

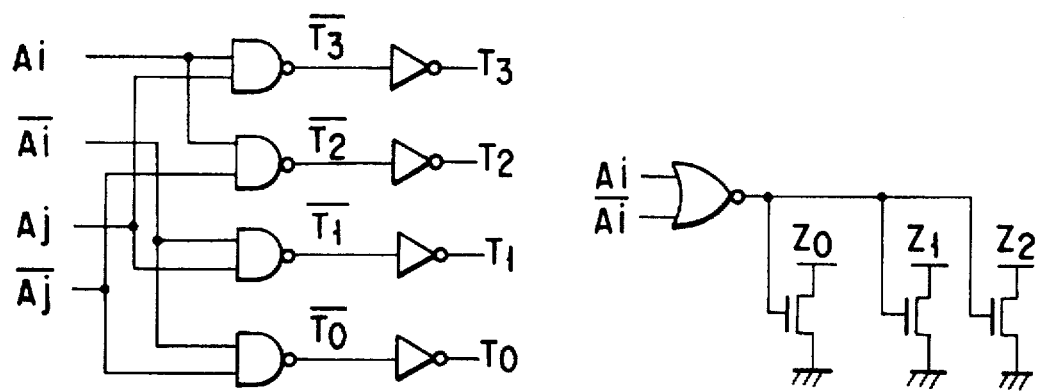
FIG. 56A
FIG. 56B  PRECHARGE CIRCUIT
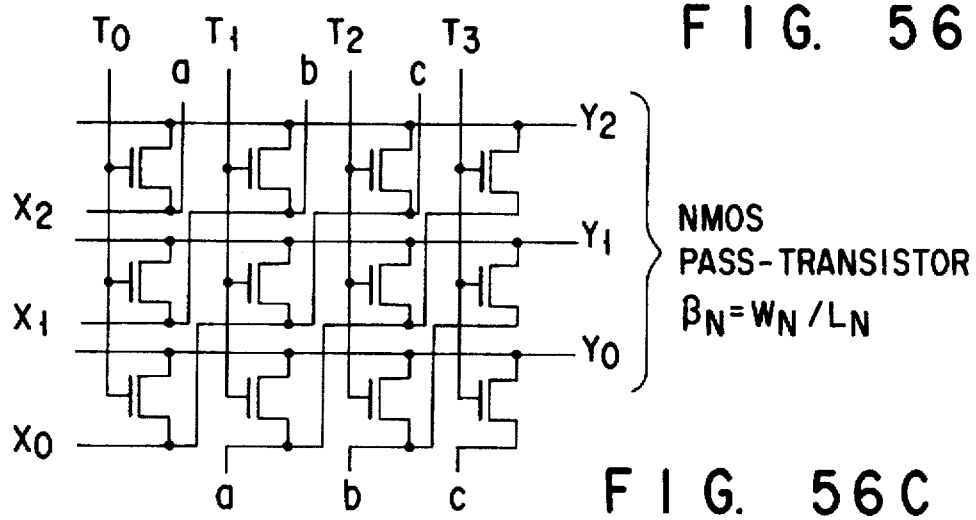
FIG. 56C  NMOS PASS-TRANSISTOR $\beta_N = W_N/L_N$
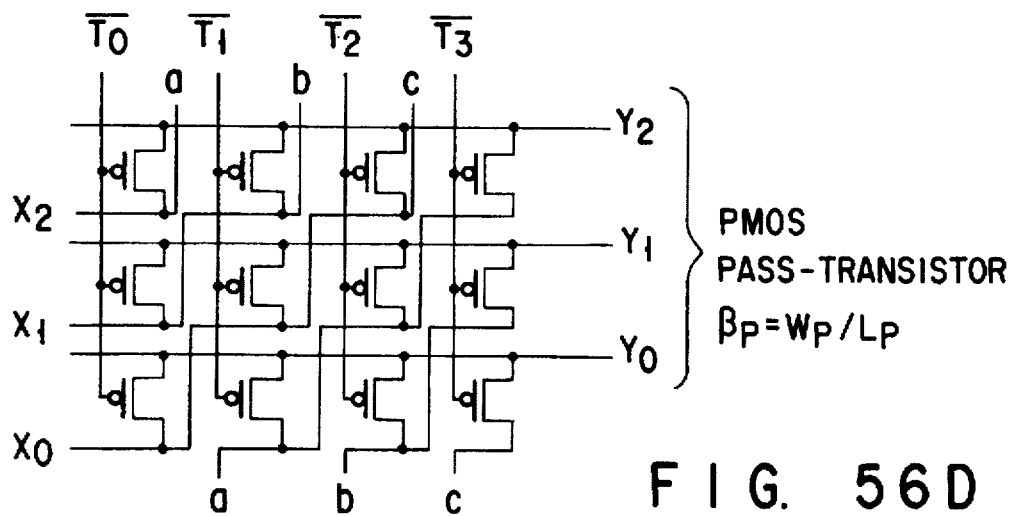
FIG. 56D  PMOS PASS-TRANSISTOR $\beta_P = W_P/L_P$

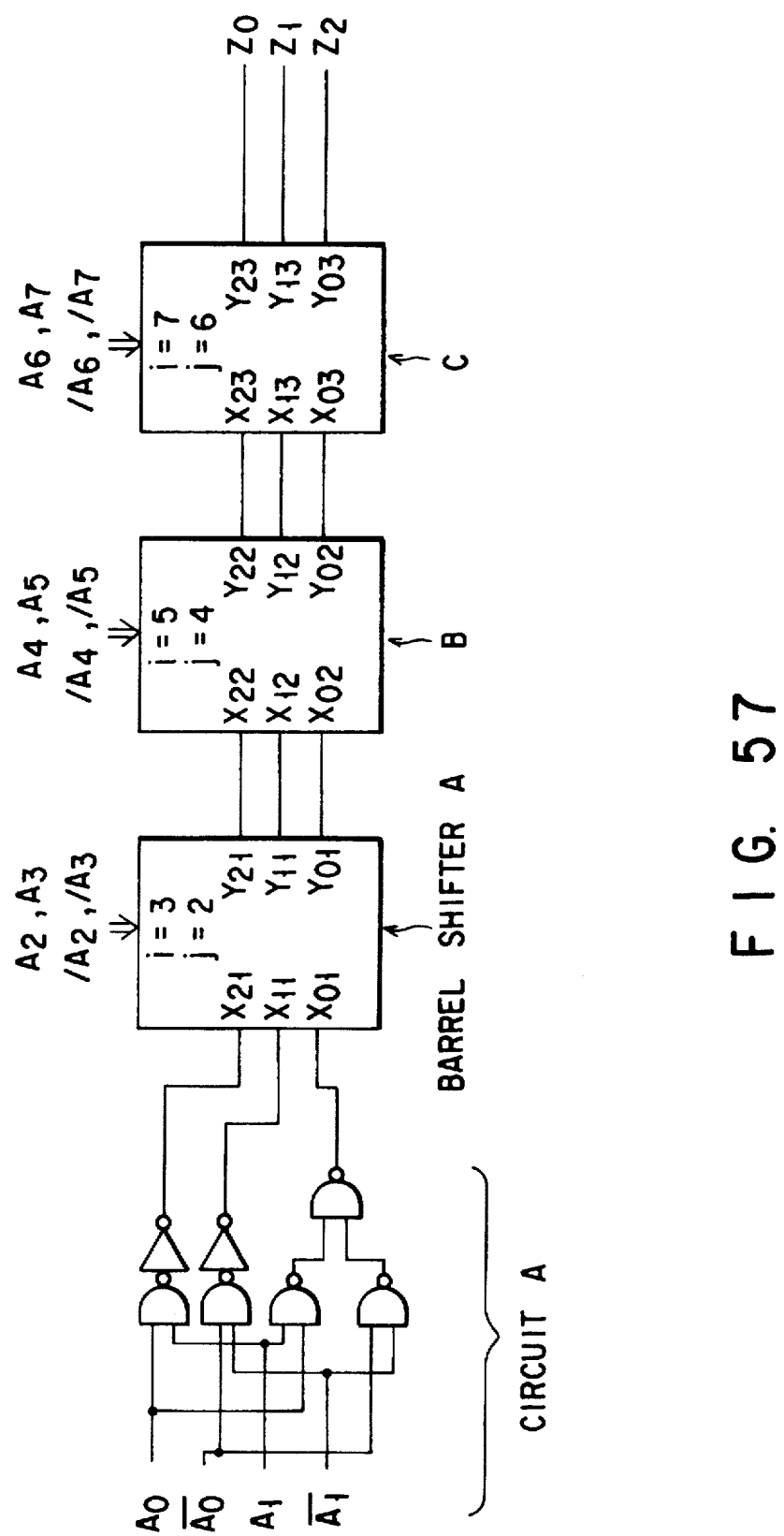
F I G. 57

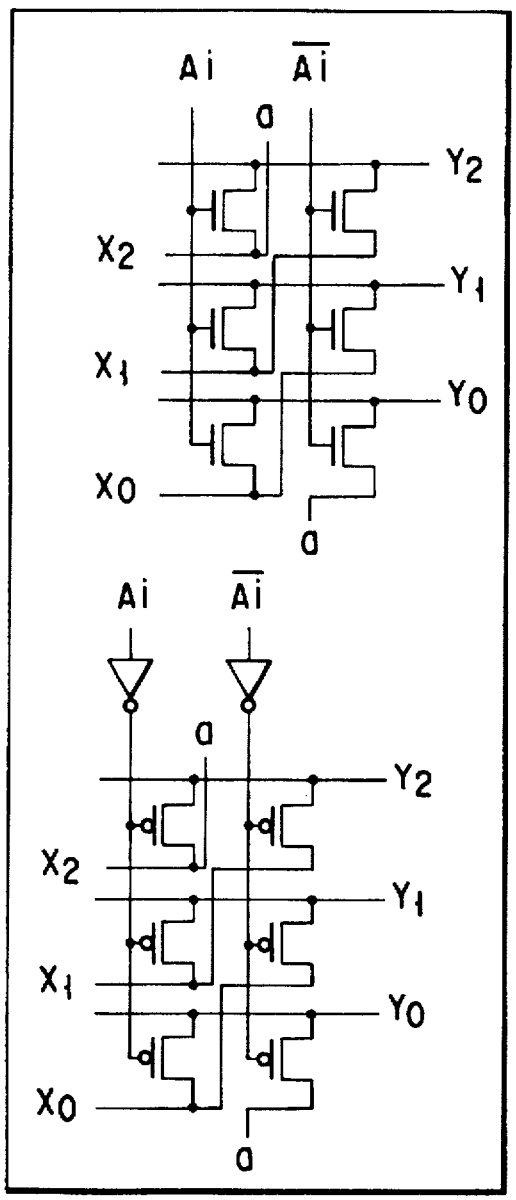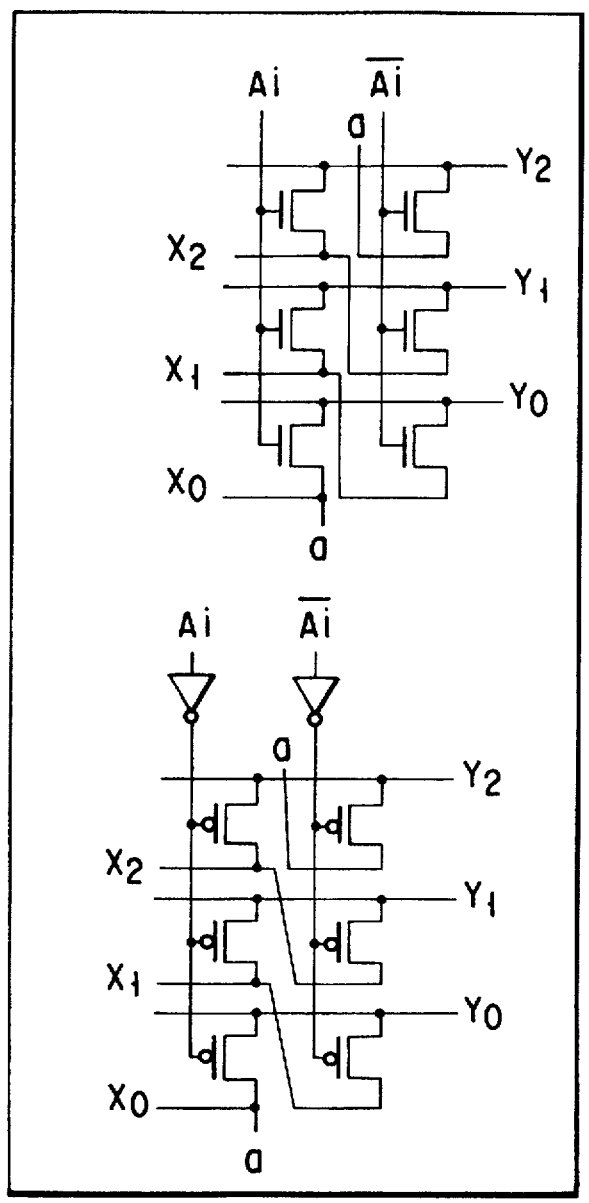
F I G. 59A    F I G. 59B

SEMICONDUCTOR MEMORY DEVICE HAVING FOLDED BIT LINE ARRAY AND AN OPEN BIT LINE ARRAY WITH IMBALANCE CORRECTION

BACKGROUND OF THE INVENTION

1. Field of the Invention

This invention relates to a dynamic semiconductor memory device and, more particularly, it relates to a dynamic semiconductor memory device designed to provide an improved sense amplifier system.

2. Description of the Related Art

In recent years, the developments in the technologies of ultrafine machining and the improvements in the memory cell structure have made it possible to produce, among others, remarkably highly integrated dynamic semiconductor memory devices having a 1-transistor/1-capacitor memory cell structure (hereinafter referred to as "DRAMs") so that less rigorous requirements may be applied to the arrangement of bit lines and word lines and the design of transistors. Currently, an open bit line configuration (hereinafter referred to as "open BL configuration") is used for memory devices up to 16K bits, whereas a folded bit line configuration (hereinafter referred to as "folded BL configuration") is used for devices between 16K bits and 64M bits, which represents the capacitance level of memory devices of the current generation.

FIGS. 1A and 1B respectively show schematic illustrations of conventional open BL and folded BL configurations comprising sense amplifiers SA, word lines WL, bit lines BL and memory cells MC. In FIGS. 1A and 1B, reference symbol $C_{BB}$ denotes the coupling capacitance of a bit line BL.

The open BL configuration is advantageous in that it can reduce the area occupied by the memory cell section of a memory device because all the intersections of the bit lines and the word lines can be used to arrange a memory cell, although it is accompanied by a difficult problem of arranging every sense amplifier within the width of a bit line because each bit line is extended for two cell arrays. The open BL configuration has an additional problem of rigorous design restrictions imposed on the sense amplifier section because of the fact that each pair of bit lines need a sense amplifier even when the sense amplifier is alternatively arranged among the cell arrays as shown in FIG. 1A (relaxed open BL configuration).

On the other hand, in a semiconductor memory device of the folded BL configuration that has been in the mainstream from the generation of 64K-bit DRAMs up to the present, because memory cells can be arranged at only a half of the intersections of the bit lines and the word lines and a bit line pair is formed in a single cell array, a sense amplifier may be used for every four bit lines if sense amplifiers are arranged alternately at the oppositely disposed ends of the cell arrays as shown in FIG. 1B (a double folded BL configuration). Thus, the folded BL configuration can greatly reduce the pitch of arrangement of sense amplifiers and the sense amplifier section whose design rule is strict can be easily arranged, thereby the folded BL configuration is widely used for DRAMs.

However, the folded BL configuration has a disadvantage that memory cells can be arranged at only a half of the intersections of the word lines and the bit lines so that the memory cell section of the device inevitably takes a large area as a whole to increase the dimensions of the final product or the chip. Particularly, it is extremely difficult to down-size the memory cell section of a dynamic semiconductor memory device having a folded BL configuration because of the rigorous design requirements imposed thereon if the device is of a 64M-bit type or of an above 256M-bit type.

In short, known DRAMs face the problem of sense amplifier arrangement because of the rigorous requirements for the design rule of sense amplifier in an open BL configuration, whereas they face the problem of a large memory cell area and hence a large chip size in a folded BL configuration, although the design rule of the sense amplifier can be extremely relaxed.

The inventors of the present invention have already proposed a dynamic semiconductor memory device having a reduced area occupied by the memory cell section if compared with a device with a folded BL configuration and, at the same time, subject to less rigorous requirements for the design of sense amplifier if compared with a device with the open BL configuration. In other words, the proposed dynamic semiconductor memory device is realized by optimally combining the open BL configuration and the folded BL configuration.

For example, in a preferred embodiment of dynamic semiconductor memory device of the invention comprising a plurality of cell arrays, the memory cells being selectively arranged on the intersections of word lines and bit lines, part of the bit lines of a first cell array form a plurality of bit line arrays and connected to a first sense amplifier at an end of a first cell array to realize a folded BL configuration. The remaining bit lines of the first cell array form pairs with corresponding bit lines of a second cell array located adjacent to the first cell array with a sense amplifier disposed therebetween to realize an open BL configuration. FIGS. 2 and 3A through 3C illustrate the configuration of the embodiment and its operation.

In another invention, the dynamic semiconductor memory device comprising a plurality of cell arrays, the memory cells being selectively arranged on the intersections of word lines and bit lines, part of the bit lines of a first cell array form a plurality of bit line arrays and connected to a first sense amplifier at an end of a first cell array to realize a folded BL configuration. The remaining bit lines of the first cell array form pairs with corresponding bit lines on the reference side of the bit line pairs of the folded BL configuration to form a folded BL configuration before the sense amplifier starts operating, whereas they forms pairs with corresponding bit lines of a second cell array located adjacent to the first cell array with a sense amplifier disposed therebetween to realize an open BL configuration in a restoring operation of rewriting data in the memory cells after the start of the operation of the sense amplifier. FIGS. 4 and 5A through 5C illustrate the configuration of the embodiment and its operation.

Referring FIG. 2, assume, for example, that word line $W_{A0}$ is selected. Then, the related memory data are read out onto $BL_0$ and $BL_1$ so that the data on $BL_0$, is read out onto the sense amplifier $SA_0$ when P01 is set to level "H" and $SA_0$ senses the data on $BL_2$ in the folded BL configuration, using as reference bit line $BL_2$ onto which no cell data are read out. The data on the $BL_1$ is read out onto $SA_1$ because P01 is at level "H" and $SA_1$ senses the data on $BL_1$ in the open BL configuration, using adjacently located $BL_4$ as reference bit line.

If word line $W_{A1}$ is selected, then, the folded BL configuration becomes applicable to $BL_0$ and $BL_3$ for sensing, whereas $BL_1$ and $BL_4$ are sensed in accordance with the open BL configuration. However, if word line $W_{A2}$ is selected, then, $P_2$ is brought to level "H" to read data onto $BL_1$ and the sense amplifier/cell array connection is changed in a manner as illustrated in FIGS. 3A through 3C for sensing with both the folded BL configuration and the open BL configuration.

Referring now to FIG. 4 and assuming again that word line $W_{A0}$ is selected, then, the related cell data are read out onto $BL_1$ and $BL_2$ and the data on $BL_1$ and $BL_2$ are read out to $SA_0$ and $SA_1$ respectively if $\phi_{DE}$, $\phi_{D02}$, $\phi_{CO}$ and $\phi_{CE}$ are at level "H". Then, $BL_0$ becomes a reference bit line common to $SA_0$ and $SA_1$ to bring all of $\phi_{DE}$, $\phi_{D02}$, $\phi_{CO}$ and $\phi_{CE}$ to level "L" so that the data are latched by $SA_0$ and $SA_1$, which are then sensed according to the folded BL configuration. The $SA_0$ side data are then restored to $BL_1$ and $BLD0$ according to the folded BL configuration as $\phi_{DE}$ and $\phi_{D02}$ are brought back to level "H".

Now, since the data on the $SA_1$ side cannot be used as long as the data on the $SA_0$ side are being restored, they are restored according to the open BL configuration by using bit line $BL_3$ of the cell array located adjacent to $BL_2$. If $W_{A1}$ and $W_{A2}$ are selected, then the sense amplifier/cell array connection is changed in a manner as illustrated in FIGS. 5A through 5C because of the difference of cell arrangement.

However, the embodiments of FIGS. 2 and 4 are accompanied by the following problems. Namely, both the open BL configuration and the folded BL configuration are used for reading data with the embodiment of FIG. 2, whereas both the open BL configuration and the folded BL configuration are used for rewriting data with the embodiment of FIG. 4.

It is well known that the open BL configuration and the folded BL configuration produce array noises with different levels and have different combination patterns of cell data "0" or "1" that determines the worst array noise level, different sense amplifier locations and different numbers and configurations of circuits for switches.

With the conventional folded BL configuration, the difference between the writing voltage required for reading "0" and the writing required for reading "1" is compensated by using a technique of using dummy word line for coupling. However, with the circuit arrangements of FIGS. 2 and 4, not only the voltage required for reading "0" and the voltage required or reading "1" have to be compensated but also there arises, as described above, a difference between the writing voltage required for reading "0" and the writing voltage required for reading "1" on the open BL configuration side and also between the voltage required for reading "0" and the voltage required for reading "1" on the folded BLs side. Thus, the performance of the arrays is determined by the poorer performance of reading "0" and that of reading "1".

The above described differences may be also occurred when some of the switches are used. Additionally, for example, such differences may be also occurred when P2 in FIG. 2 is arranged close to the sense amplifier side relative to the P01. Still additionally, they may be also occurred when the bit line pairs in FIGS. 5A through 5C are formed by adjacently located lines or by those having another bit line disposed in-between as a result of selecting $WL_0$, $WL_1$, or $WL_2$.

On the other hand, with the circuit configuration of FIG. 4, while the number of memory cells is small than that obtainable from an open BL configuration, the cell area can be greatly reduced if compared with that obtainable from a conventional folded BL configuration. Additionally, sense amplifiers can be arranged along a direction perpendicular to the bit lines at a pitch much reduced than the pitch at which they are arranged with the open BL configuration, where only a single sense amplifier is allowed to be arranged for every two bit lines, although it is greater than the pitch at which they are arranged with the folded BL configuration, where only a sense amplifier may well be arranged for every four bit lines. In short, a dynamic semiconductor memory device according to the above invention is subjected to design restrictions that are more rigorous than those applied to the folded BL configuration but by far less rigorous than those applied to the open BL configuration.

FIGS. 6A through 6C illustrate drives signals that can be used for a dynamic semiconductor memory device according to the above identified invention. Since a folded BL configuration is applied to the device for reading data, it is free from noises coming by way of word lines and specific to the open BL configuration and noises coming by way of unselected WLs can be eliminated to reduce the overall noise level as in the case of the folded BL configuration.

However, inter-bit lines (hereinafter referred to inter BL—BL) noises that rise with the increase in the inter-bit line capacitance have been highlighted with the increase in the degree of integration of DRAMs.

Inter BL—BL noises will now be discussed by referring to FIG. 4. FIG. 7 schematically illustrates a folded BL configuration to be used for data reading operation of the arrangement of FIG. 4.

Looking at sense amplifier $SA_0$, if the inter BL—BL capacitance is $C_{BB}$ and the reading signal is $V_S$, $BL_1$ is subject to a noise with a level of $+C_{BB}V_S$ coming from $BL_0$ while $BL_2$ is subject to a noise of $-2C_{BB}V_S$ coming from both $BL_1$ AND $BL_3$ to make the overall maximum noise it receives equal to a level of $3C_{BB}V_S$. Contrary to this, the maximum inter BL—BL noise of a conventional device with a folded BL configuration or a relaxed open BL configuration is equal to a level of $2C_{BB}V_S$ as seen from FIGS. 1A and 1B.

With the configuration of FIG. 4, the level of the noises coming through the word lines, the plate and the substrate of the device that are specific to the open BL configuration are reduced because a folded BL configuration is adopted for reading data but the level of the inter BL—BL noise is one and a half times greater than that of the inter BL—BL noise of a conventional device with an open BL configuration. What is worse, since the reference bit lines can be positionally shifted depending on the positions of word lines WL of the device and a set of lines is formed by every three bit lines, the technique of reducing noise by dividing the bit lines by $2^n$ (n=natural number) and twisting the bit lines BL as shown in FIG. 7 cannot be applied to it.

In view of the above identified problems, the inventors of the present invention have also proposed a method of noise reduction of twisting two of the three bit lines of each set of lines located at a position of 1/(3n). While noises can be reduced by forming 3n twists in cell arrays with the proposed method, the twists take an additional area to consequently increase the size of the finally produced memory chip.

Additionally, with an open/folded hybrid BL configuration realized by combining an open BL configuration and a folded BL configuration in a manner as described above, the bit lines of the cell arrays and the sense amplifiers are connected in different ways depending on the addresses of the word lines. More specifically, the connection changes periodically for every three word lines as illustrated in FIG. 8.

Assume now, for example, that word line $WL_0$ is selected, then control signal $\phi_{0,1}$, goes to "H" to close the gate controlled by $\phi_{0,1}$. On the other hand, $\phi_2$ goes to "L" to open the gate controlled by $\phi_2$. As a result, the bit lines, the memory cells and the sense amplifiers are connected in a manner as illustrated in FIG. 9A so that the data in memory cell $M_1$ is read out onto folded A and the data in memory cell $M_2$ is read out onto open sense amplifier B.

If, on the other hand, word line $WL_1$ is selected, then the gate controlled by $\phi_{0,1}$ is closed and the gate controlled by $\phi_2$ is opened as shown in FIG. 9B so that, as a result, the data in memory cells $M_3$ and $M_4$ are read out onto folded sense amplifier A and open sense amplifier B respectively. If word line $WL_2$ is selected, then the gate controlled by $\phi_2$ is closed and the gate controlled by $\phi_{0,1}$, is opened as shown in FIG. 9C so that, as a result, the data in memory cells $M_5$ and $M_6$ are read out onto folded sense amplifier A and open sense amplifier B respectively.

In reality, the word lines of the three different types are arranged cyclically so that control signal $\phi$ for the connecting gates of the bit lines and the sense amplifiers cyclically changes for every three addresses of the word lines. Thus, a 3-phase address system is needed for controlling control signal $\phi$.

On the other hand, addresses that are used in a dynamic semiconductor memory device are typically expressed in binary digits of "0" and "1". Therefore, a word line address selected for controlling $\phi_{0,1}$ and $\phi_2$ and expressed in binary digits has to be converted into a 3-phase address that represents one of three different word lines. If word lines $WL_0$ and $WL_1$ are selected, the gate of $\phi_{0,1}$ is closed (to connect a bit line and a sense amplifier) and the gate of $\phi_2$ is opened (to disconnect them). In other words, there is required a circuit that determines the remainder produced after dividing the address of a word line by three.

FIG. 10 schematically illustrates known circuits that can carry out the above described conversion. Circuit A converts a two-digit binary number into a one-digit ternary number, whereas circuit B produces a ternary number equal to the digit of the lowest order of a ternary number obtained by adding two ternary numbers.

Address input $A_i$ and $/A_i$ ($i=1$ to 7) are complementary input addresses. For example, if $A_i$="0", $/A_i$="1". When a word line is selected by address $A_i$, the circuit produces outputs $Z_0$, $Z_1$, and $Z_2$ as remainders. For example, if $A_0=A_1=\ldots =A_7=$"0" $(/A_0=/A_1=\ldots =/A_7=$"1"), then the outputs will be $Z_0$="1", $Z_1$="0", $Z_2$="0" and so on. Table 1 below illustrates the correspondence of inputs and outputs.

TABLE 1

| $A_7$ | $A_6$ | $A_5$ | $A_4$ | $A_3$ | $A_2$ | $A_1$ | $A_0$ | $Z_0$ | $Z_1$ | $Z_2$ |
|---|---|---|---|---|---|---|---|---|---|---|
| 0 | 0 | 0 | 0 | 0 | 0 | 0 | 0 | 1 | 0 | 0 |
| 0 | 0 | 0 | 0 | 0 | 0 | 0 | 1 | 0 | 1 | 0 |
| 0 | 0 | 0 | 0 | 0 | 0 | 1 | 0 | 0 | 0 | 1 |
| 0 | 0 | 0 | 0 | 0 | 0 | 1 | 1 | 1 | 0 | 0 |
| 0 | 0 | 0 | 0 | 0 | 1 | 0 | 0 | 0 | 1 | 0 |
| 0 | 0 | 0 | 0 | 0 | 1 | 0 | 1 | 0 | 0 | 1 |
| 0 | 0 | 0 | 0 | 0 | 1 | 1 | 0 | 1 | 0 | 0 |
| 0 | 0 | 0 | 0 | 0 | 1 | 1 | 1 | 0 | 1 | 0 |
| 0 | 0 | 0 | 0 | 1 | 0 | 0 | 0 | 0 | 0 | 1 |
| 0 | 0 | 0 | 0 | 1 | 0 | 0 | 1 | 1 | 0 | 0 |
| 0 | 0 | 0 | 0 | 1 | 0 | 1 | 0 | 0 | 1 | 0 |
| 0 | 0 | 0 | 0 | 1 | 0 | 1 | 1 | 0 | 0 | 1 |
| 0 | 0 | 0 | 0 | 1 | 1 | 0 | 0 | 1 | 0 | 0 |
| 0 | 0 | 0 | 0 | 1 | 1 | 0 | 1 | 0 | 1 | 0 |
| 0 | 0 | 0 | 0 | 1 | 1 | 1 | 0 | 0 | 0 | 1 |

TABLE 1-continued

| $A_7$ | $A_6$ | $A_5$ | $A_4$ | $A_3$ | $A_2$ | $A_1$ | $A_0$ | $Z_0$ | $Z_1$ | $Z_2$ |
|---|---|---|---|---|---|---|---|---|---|---|
| 0 | 0 | 0 | 0 | 1 | 1 | 1 | 1 | 1 | 0 | 0 |
| ... |  |  |  |  |  |  |  |  | ... |  |
| 1 | 1 | 1 | 1 | 1 | 1 | 1 | 1 | 0 | 1 | 0 |

As seen from the above table, when the remainder obtained by dividing an address by three is 0, then $Z_0$=1, whereas $Z_1$ and $Z_2$ are equal to 1 when the remainder is equal to 1 or 2 respectively.

On the other hand, the internal addresses of a dynamic semiconductor memory device are normally held unchanged regardless of the state of the external addresses when the device under a stand-by condition. Thus, when internal address $A_i=/A_i=$"0", circuit A produces outputs $B_{00}=$"0", $B_{01}=$"1" and $B_{02}=$"1" and the last outputs $Z_0$, $Z_1$ and $Z_2$ of $Z_0=Z_1=Z_2=$"1".

It should be noted here that $Z_i$"1" ($i=0$, 1 or 2) represents that the remainder after dividing the address by three is equal to i and $Z_0=Z_1=Z_2=$"1" represents a multiple selection. Thus, there exists a hazard of multiple selection in the selection of gate pi and dummy word line DWLi by means of surplus address $Z_i$ during a delay time after binary addresses $A_i$, $/A_i$ are unequivocally defined and before surplus address $Z_i$ is unequivocally defined as the device moves from a stand-by state into an operating state.

FIG. 11 illustrates such a hazard. As the device moves from a stand-by state into an operating state, there occurs a delay time after an address is unequivocally defined and decoded by the surplus circuit to unequivocally define a remainder or between an input operation and a corresponding output operation of the surplus circuit. The control signal being applied to the device may be inactivated in order to prevent a multiple selection from taking place before a surplus address is defined but the arrangement for such a configuration of inactivation can make the circuit complicated and the entire operation may become so much more time consuming because such a configuration inevitably involves a safety margin for the operation time.

Thus, if a memory cell array shows more than one differences in the minimum writing voltage required for reading "0" and "1" in a conventional DRAM, the operating speed of the memory cell array is dominated by the worst performance for reading "0" and the worst performance for reading "1".

Additionally, if a set of lines is formed by every three bit lines, the technique of twisting the bit lines to reduce interference noises among the bit lines cannot be applied to it. Still additionally, if two of the three bit lines of each set is twisted at a position of 1/3n, such twists take an additional area to consequently increase the size of the finally produced memory chip, although interference noises among the bit lines may be reduced.

If internal addresses are decoded by means of a surplus circuit in a dynamic semiconductor memory device, there exists a hazard of multiple selection for the gates connecting the sense amplifiers and the bit lines and for the dummy word lines as the device moves from a stand-by state into an operating state.

SUMMARY OF THE INVENTION

Therefore, it is an object of the present invention to provide a dynamic semiconductor memory device that has an improved safety margin for the operating time if a memory cell array shows more than one differences in the minimum writing voltage required for reading "0" and "1".

It is another object of the present invention to provide a DRAM having a reduced memory cell area if compared with a comparable device with a folded BL configuration and subjected to less rigorous requirements for the design of sense amplifiers if compared with a device with an open BL configuration so that the DRAM may meet the demand for a reduced memory cell area and at the same time the demand for less rigorous requirements on the design of the sense amplifiers and for a reduced noise level among the bit lines.

It is still another object of the present invention to provide a DRAM equipped with a surplus circuit that is free from the hazard of multiple section for the gates connecting the sense amplifiers and the bit lines and for the dummy word lines.

According to a first aspect of the invention, there is provided a dynamic semiconductor memory device which comprises at least first and second memory cell arrays having a plurality of memory cells selectively arranged at respective intersections of a plurality of word lines and a plurality of bit lines; a first sense amplifier section connected at an end of the first cell array to a plurality of bit line pairs formed by part of the plurality of bit lines of the first cell array, the plurality of bit line pairs having a folded bit line configuration; a second sense amplifier section connected to sets of bit line pairs, each formed by one of the remaining bit lines of the first cell array and one of part of the plurality of bit lines of the second cell array, the plurality of bit line pairs having an open bit line configuration; and a correction circuit for correcting the level of ease for reading data "0" and that of reading data "1".

According to the first aspect of the invention, there is also provided a dynamic semiconductor memory device at least first and second memory cell arrays having a plurality of memory cells selectively arranged at respective intersections of a plurality of word lines and a plurality of bit lines; a sense amplifier section connected at an end of the first cell array to a plurality of bit line pairs formed by part of the plurality of bit lines of the first cell array; and a correction circuit for correcting the level of ease for reading data "0" and that of reading data "1", characterized in that the plurality of bit line pairs have a folded bit line configuration, and the remaining bit lines of the first cell array form bit line pairs respectively with the reference side bit lines of the bit line pairs having a folded bit line configuration to show a folded bit line configuration until the sense amplifiers start operating and then form bit line pairs having a open bit lines configuration respectively with part of the plurality of bit lines of a second cell array located adjacent to the first cell array with a sense amplifier section interposed therebetween during a subsequent restoring operation for rewriting data into the memory cells after the operation of the sense amplifiers.

Preferable manners according to the first aspect of the invention are as follows:

(1) The correction circuit performs at least either a capacitor coupling operation or an electric charge distributing operation for either the bit line or the reference bit line of a memory cell selected for reading data therefrom.

(2) The correction circuit have two or more than two levels of ease of reading data.

(3) Correction amounts corrected by the correction circuit are different between an open bit line structure and a folded bit line structure.

(4) Correction amounts corrected by the correction circuit are different in types of selected word lines.

(5) Two-thirds of the intersections of the plurality of word lines and the plurality of bit lines carry respective memory cells.

(6) The bit lines having the folded bit line configuration and those having the open bit line configuration change positions depending on the positions of the selected word lines.

(7) Two-thirds of the bit lines have a folded bit line configuration and the remaining one-third have an open bit line configuration.

(8) A bit line with an open BL configuration is placed between each bit line pair with a folded BL configuration.

(9) A set of lines is formed by every three bit lines, two of which form a bit line pair with a folded bit line configuration and the remaining bit line form an open bit line pair with a bit line of an adjacent cell array.

A dynamic semiconductor memory device according to a first aspect of the invention is provided with a correction circuit for correcting each of the voltage differences between the level for reading data "1" necessary for cell writing voltage and the level for reading data "0" necessary for cell writing voltage if there are more than one such differences. By-changing a correction amount of voltage by using the correction circuit for the above different types, the difference of correction amount between "0" reading and "1" reading can be eliminated.

Thus, the area occupied by the memory cells of a dynamic semiconductor memory device according to the first aspect of the invention can be reduced than a conventional device with a folded BL configuration because the device of the invention combines an open BL configuration for arranging memory cells on all the intersections of the bit lines and the word lines and a folded BL configuration for arranging memory cells on half of the intersections of the bit lines and the word lines. Additionally, sense amplifiers can be arranged along a direction transversal to the bit lines at a pitch by far improved if compared with the pitch of sense amplifier arrangement of the open BL configuration that allows at most a sense amplifier to be arranged at every two bit lines, although less advantageous if compared with the open BL configuration with which a sense amplifier may be arranged at most at every four bit lines.

The so-called relax open BL configuration with which a sense amplifier is arranged for every two bit lines is accompanied by a drawback of involving a large number of cell arrays if compared with the proper open BL configuration with which a sense amplifier is arranged for each bit line to tighten the pitch of sense amplifier arrangement. However, a dynamic semiconductor memory device according to the invention allows a pitch of sense amplifier arrangement less tight than that of the-relax open BL configuration. In, short, the present invention exploits the most remarkable advantages of the conventional open BL configurations and those of the conventional folded BL configuration, overcoming the most remarkable drawbacks of those formats.

According to a second aspect of the invention, there is provided a dynamic semiconductor memory device which comprises a plurality of memory cell arrays having a plurality of memory cells selectively arranged at respective intersections of a plurality of word lines and a plurality of bit lines; a amplifier section connected at an end of the first cell array to a plurality of bit line pairs formed by two-third of the plurality of bit lines of the cell array, the plurality of bit line pairs having a folded bit line configuration; and a switch for changing over the connection between the bit lines in the memory cell and the sense amplifier section to make the bit line selected for reading a memory cell with a folded bit line configuration to be disposed between a bit line pair regardless of the position of the selected word line, and characterized in that the remaining one-third bit lines of the plurality of bit lines of the cell array form bit line pairs respectively with the reference side bit lines of the bit line pairs having a folded bit line configuration to show a folded bit line configuration until the sense amplifiers start operating, and then form bit line pairs having a open bit lines configuration respectively with one third of the plurality of bit lines of a cell array located adjacent to the cell array with a sense amplifier section interposed therebetween during a subsequent restoring operation for rewriting data into the memory cells after the operation of the sense amplifiers. The device further comprises a correction circuit for correcting each of the voltage differences between the level of easy for reading data "1" and the level of easy for reading data "0" if there are more than, one such differences.

Preferable manners according to the second aspect of the invention are as follows:

(1) The correction circuit performs at least either a capacitor coupling operation or an electric charge distributing operation for either the bit line or the reference bit line of a memory cell selected for reading data therefrom.

(2) The correction circuit have two or more than two levels of ease of reading data.

(3) Correction amounts corrected by the correction circuit are different between an open bit line structure and a folded bit line structure.

(4) Correction amounts corrected by the correction circuit are different in types of selected word lines.

(5) Two-thirds of the intersections of the plurality of word lines and the plurality of bit lines carry respective memory cells.

In a dynamic semiconductor memory device according to the second aspect of the invention, the bit line of a first bit line pair selected for reading a memory cell is disposed between a second bit line pair regardless of the selected word line so that, when data in the memory cell is read out onto the selected one of a second bit line pair, the inter-bit line cell array noise that is applied to an adjacent bit lines as a result of the capacitive coupling and for which a change in the signal volume read out by the bit line of the first bit line pair shows an identical phase, on the two bit lines of the first bit line pair. Thus, the voltage difference between the two bit lines of the first bit line pair is not changed by the noise and consequently the level of the cell array noise can be reduced.

According to a third aspect of the invention, there is provided a dynamic semiconductor memory device which comprises a logic circuit for receiving a binary number having a plurality of digits as input, dividing it by three and producing a signal representing the remainder of "0", "1" or "2" as output to be used as a signal representing different states for driving memory cell arrays; the logic circuit provides a fourth state except for the state of "0", "1" nor "2".

(1) The output of the logic circuit comprises three signal lines ($Z_0$, $Z_1$, $Z_2$), which is equal to (1, 0, 0) when the remainder obtained by dividing the input by three is 0, (0, 1, 0) when the remainder obtained by dividing the input by three is 1, (0, 0, 1) when the remainder obtained by dividing the input by three is 2 and (0, 0, 0) in a stand-by state of the memory cell arrays.

(2) The logic circuit comprises a first circuit for dividing a binary number of a plurality of digits by two or four orders starting from the lowest bit, dividing each of the products further by three and producing the remainders as outputs and a second circuit for adding the outputs of the first circuit and producing the lowest order digit of the sum expressed as a ternary number and the output of the logic circuit terminal consists of three signal lines ($Z_0$, $Z_1$, $Z_2$) that satisfy the relationships of ($Z_0$, $Z_1$, $Z_2$)=(1,0,0) when the remainder of the division of the input by three is 0, ($Z_0$, $Z_1$, $Z_2$)=(0,1,0) when the remainder of the division of the input by three is 1, ($Z_0$, $Z_1$, $Z_2$)=(0,0,1) when the remainder of the division of the input by three is 2 and ($Z_0$, $Z_1$, $Z_2$)=(0,1,0) when the memory cell array is in the stand-by state.

(3) The input of the first circuit consists of a set of a plurality of address signals and complementary address signals, which address signals and complementary address signals being fixed to "0" or "1" in the stand-by state.

(4) The input of the first circuit may consist of a pair of address signals $A_0$ and $A_1$ and another pair of signals /$A_0$ and /$A_1$ complementary to the former and the memory device may further comprise a first NAND element having its input gates connected respectively to $A_0$ and $A_1$, a second NAND element having its input gates connected respectively to /$A_0$ and /$A_1$, a third NAND element having its input gates connected respectively to $A_0$ and /$A_1$, a fourth NAND element having its input gates connected respectively to /$A_0$ and $A_1$, a fifth NAND element having its input gates connected respectively to the output of the first NAND element and that of the second NAND element and its output connected to $Z_0$, a first inverter having its input and output connected respectively to the output of the third NAND element and $Z_1$ and a second inverter having its input and output connected respectively to the output of the fourth NAND element and $Z_2$.

(5) The logic circuit is connected in series or in parallel with a circuit unit having first inputs $X_0$, $X_2$, $X_2$, . . . . , $X_n$, first outputs that are electrically connected to the respective first inputs to form a one-to-one correspondence when operating and second inputs for controlling the correspondence of the first inputs and the first outputs along with a circuit for holding the outputs to respective predetermined fixed potential levels regardless of the state of the first input signals when the memory cell arrays are in the stand-by state.

(6) Alternatively, the logic circuit may be connected in series or in parallel with a circuit having first inputs of three signals $X_0$, $X_1$ and $X_2$, outputs of three signals $Z_0$, $Z_1$, and $Z_2$, and a second input of a 2-bit or 4-bit address signal, wherein, in the operating state, the outputs are ($Z_0$, $Z_1$, $Z_2$)=($X_0$, $X_2$, $X_2$) if the second input is exactly divisible by three, ($Z_0$, $Z_1$, $Z_2$)=($X_2$, $X_0$, $X_2$) if one is produced as remainder when the second input is divided by three and ($Z_0$, $Z_1$, $Z_2$)=($X_2$, $X_2$, $X_0$) if two is produced as remainder when the second input is divided by three, whereas, in the stand-by state, the outputs are ($Z_0$, $Z_1$, $Z_2$)=(0, 0, 0) regardless of the values of the inputs.

According to the third aspect of the invention, in a logic circuit for dividing the address of each word line by three and producing the remainder as an output operating as a signal for driving a memory cell array, a fourth state other than "0", "1" and "2" is defined as a stand-by state for the memory cell array. With this arrangement, the operation of the gate of selectively connecting a dummy word line or a sense amplifier and a bit line of a cell array does not encounter any hazard when moving from a stand-by state into an operating state and, therefore, the device can operate stably.

As described above, according to the invention, by combining the open BL configuration and the folded BL configuration, there is provided a DRAM having a reduced memory cell area if compared with a comparable device with a folded BL configuration and subjected to less rigorous requirements for the design of sense amplifiers if compared with a device with an open BL configuration so that the DRAM may meet the demand for a reduced memory cell area and at the same time the demand for less rigorous requirements on the design of the sense amplifiers and for a reduced noise level among the bit lines. Such a device has the following additional advantages.

(1) By arranging a correction circuit for correcting the difference between the cell writing voltage necessary for reading "0" and the cell writing voltage for reading "1", two or more than two differences of voltage that may exists between reading "1" and reading "0" in a cell array can be corrected to improve the safety margin of reading data from the chip.

(2) By arranging a switching circuit for changing over the connection between the bit lines in the memory cell and the sense amplifier to make the bit line selected for reading a memory cell to be disposed between a bit line pair regardless of the position of the selected word line without resorting to techniques such a twist bit lines leading to a greater chip area, the level of interference noise among bit line can be reduced. Additionally, by arranging a circuit for shifting the potential of the bit line up and down by coupling two or more than two level of easiness of reading "1" and "0", any unbalanced easiness of reading "1" and "0" that may exist among bit pairs can be corrected.

(3) By providing a dynamic semiconductor memory device having an open/folded hybrid BL configuration with a surplus circuit for controlling the operation of selecting gates connecting the sense amplifiers and the bit lines and the dummy word lines on the basis of cyclicity of the addresses of three word lines or by providing a circuit for holding the outputs of the surplus circuit to respective predetermined fixed potential levels regardless of the state of the first input signals when the memory cell arrays are in the stand-by state, the potential hazard of the control circuit when the chip is activated can be effectively avoided and a stable operation can be ensured for the device.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 17A through 17D are circuit diagrams of exemplary drive circuits for generating control signals $\phi_0$ through $\phi_4$ to be used for the circuit of FIG. 15;

FIGS. 18A through 18D are circuit diagrams of other exemplary drive circuits for generating control signals $\phi_0$ through $\phi_4$ to be used for the circuit of FIG. 15;

FIG. 19 is a circuit diagram of still another exemplary drive circuit for generating control signals $\phi_0$ through $\phi_4$ to be used for the circuit of FIG. 15;

FIG. 21 is a timing chart for driving the fourth embodiment;

FIG. 25 is a circuit diagram of an exemplary drive circuit for generating control signals $\phi0$ through $\phi4$ to be used for the circuit of FIG. 23;

FIG. 30 is a circuit diagram of an eleventh embodiment of DRAM according to the invention;

FIG. 31 is a timing chart for driving the eleventh embodiment;

FIGS. 41A through 41D are circuit diagrams of exemplary drive circuits for generating control signals $\phi_0$ through $\phi_4$ to be used for the thirteenth embodiment;

FIG. 44 is a schematic circuit diagram of the surplus circuit used for the fourteenth embodiment;

FIGS. 45A and 45B are circuit diagrams of circuit A and circuit B used for the surplus circuit of FIG. 44;

FIG. 46 is a graph of waveforms showing the operation of the fourteenth embodiment;

FIGS. 48A through 48S are circuit diagrams of exemplary circuits that can be used for circuit C of the surplus circuit of FIG. 47;

FIG. 50 is a schematic circuit diagram of the surplus circuit used for the sixteenth embodiment;

FIG. 52 is a schematic circuit diagram of the surplus circuit used for the seventeenth embodiment;

FIGS. 56A through 56D are circuit diagrams of exemplary barrel shifters that can be used for the surplus circuit of the nineteenth embodiment;

FIG. 57 is a schematic circuit diagram of the surplus circuit used for a twentieth embodiment;

FIGS. 59A and 59B are circuit diagrams of exemplary barrel shifters that can be used for the surplus circuit of the twenty first embodiment.

DETAILED DESCRIPTION OF THE PREFERRED EMBODIMENTS

The present invention will be described in greater detail by referring to the accompanying drawings that illustrate preferred embodiments of the invention.

(Embodiment 1)

Figure 12:
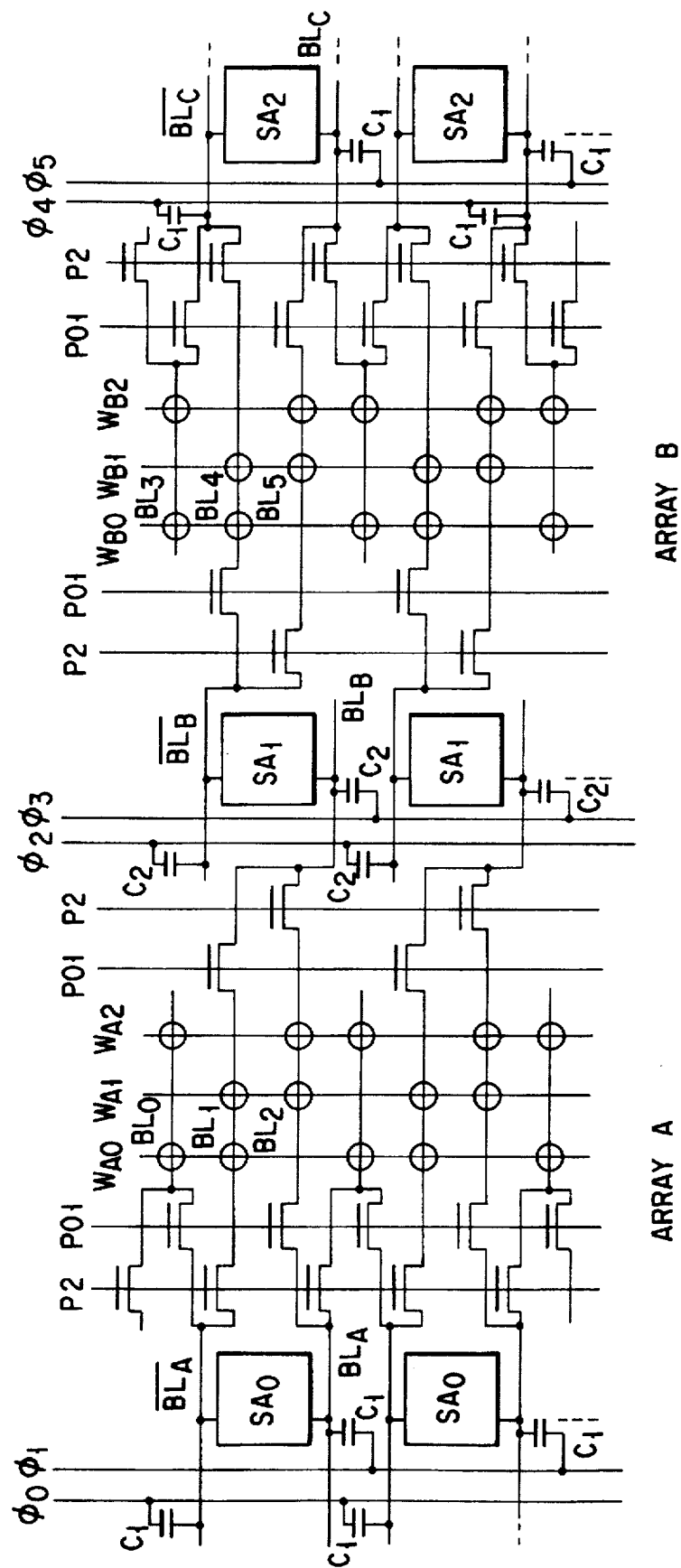
FIG. 12 is a circuit diagram of a first embodiment of DRAM according to the invention.
Figure 13A:
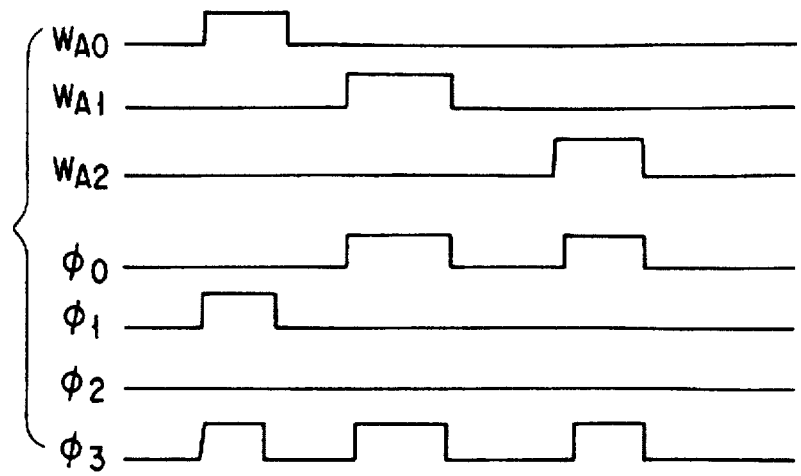
FIGS. 13A and 13B are timing charts for driving the first embodiment.
Figure 13B:
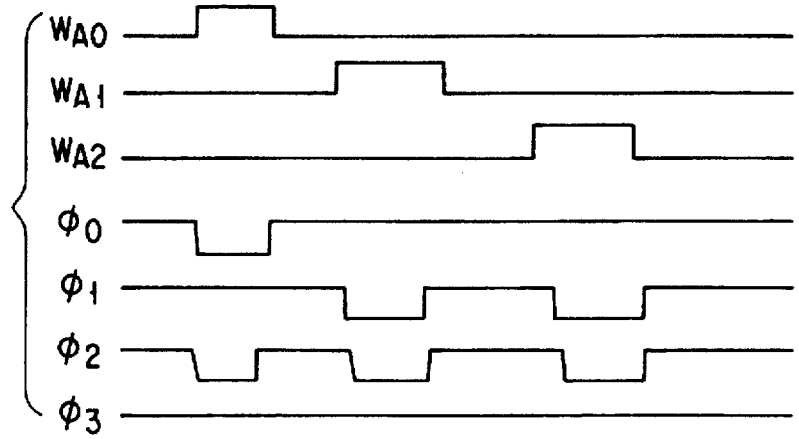

FIG. 12 is a circuit diagram of a first embodiment of DRAM according to the invention, showing two cell arrays (A, B) as examples. FIGS. 13A and 13B are timing charts for driving the embodiment.

Figure 1A:
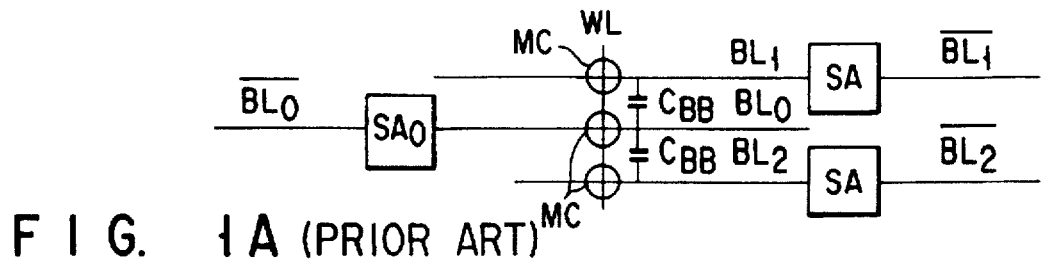
FIGS. 1A and 1B are schematic diagrams respectively showing a conventional open BL configuration and a conventional folded BL configuration.
Figure 1B:
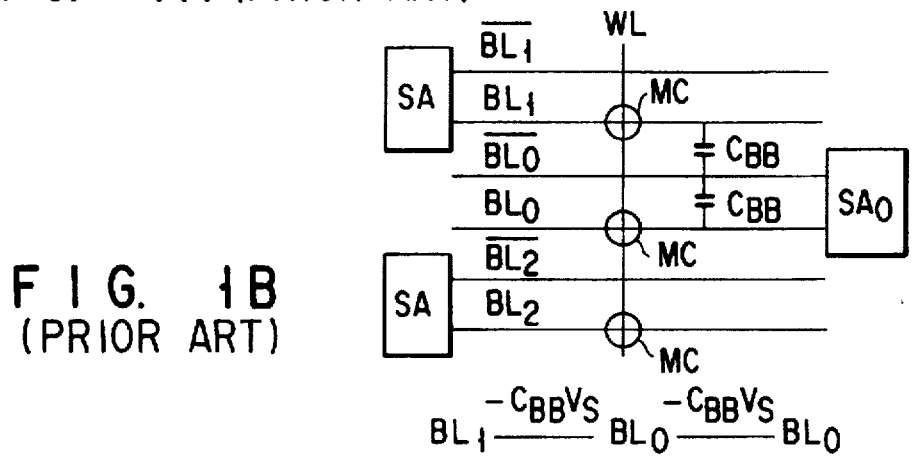
Figure 3A:
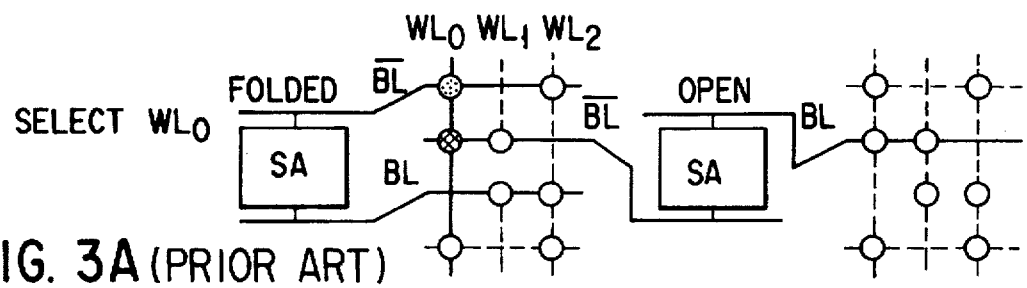
FIGS. 3A through 3C are schematic diagrams illustrating the operation of the DRAM of FIG. 2.
Figure 3B:
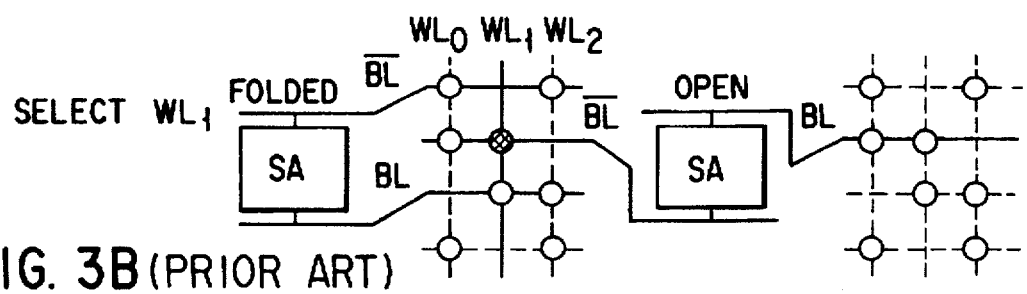
Figure 3C:
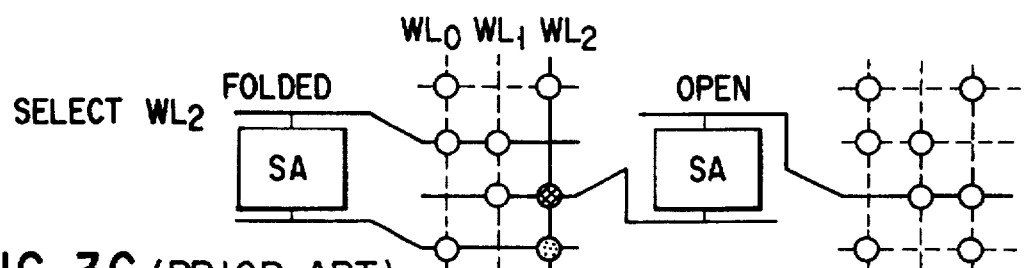
Figure 2:
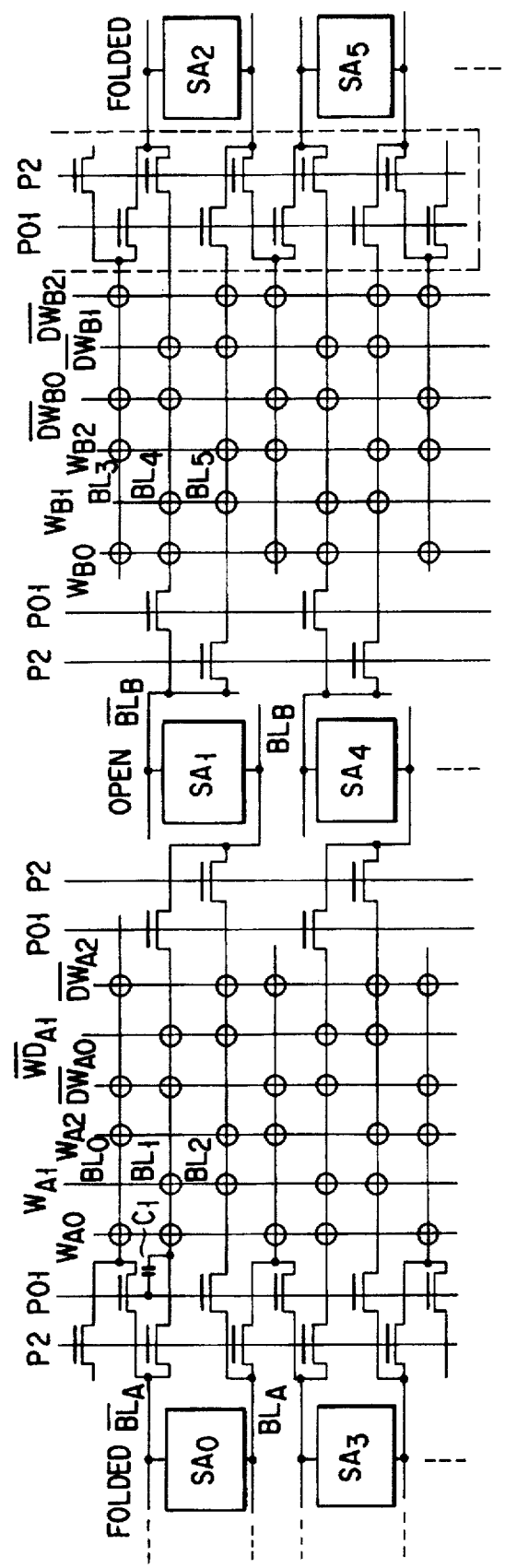
FIG. 2 is a schematic diagram of a conventional DRAM realized by combining an open BL configuration and a folded BL configuration.

This embodiment is in fact provides an improvement to the DRAM illustrated in FIG. 2. The embodiment differs from the DRAM of FIG. 2 in that it additionally comprises control clocks $\phi_0$, $\phi_2$, $\phi_3$, $\phi_4$ and $\phi_5$, of which $\phi_0$ is connected to bit line $BL_A$ of a corresponding sense amplifier section by way of capacitors $C_1$ and $\phi_1$ is connected to bit line $BL_A$ of a corresponding sense amplifier section by way of capacitors $C_1$. Similarly, $\phi_2$ and $\phi_3$ are respectively connected to bit lines /$BL_B$ and $BL_B$ of a corresponding sense amplifier section by way of capacitors $C_2$, whereas $\phi_4$ and $\phi_5$ are respectively connected to bit lines /$BL_C$ and $BL_C$ of a corresponding sense amplifier section by way of capacitors $C_1$, the capacitances $C_1$ and $C_2$ having different values ($C_1$ is not equal to $C_2$).

Thus, assuming that $WA_0$ is selected to read out memory cell data onto $BL_0$ and $BL_1$, the data on $BL_0$ is transferred to /$BL_A$ and sensed by $SA_0$, using $BL_2$ as a reference bit line because P01 is at level "H". As the potential of $BL_0$ is raised because of the coupling of $W_{A0}$ and $BL_0$, occurring as a result of raising $W_{A0}$ in addition to the cell data, $SA_0$ reads "1" with ease but "0" with difficulty.

However, in this embodiment, since $\phi_1$ is raised as shown in FIG. 13A, the capacitance of $C_1$ is coupled to the $BL_A$ side to raise the potential of $BL_A$. Consequently, the situation where "1" is read with ease and "0" is read with difficulty is compensated to provide a same level of ease for reading both "1" and "0".

Likewise, the data on $BL_1$ is transferred to $BL_B$ and sensed by $SA_1$, using $BL_5$ as a reference bit line. As the potential of $BL_1$ is raised because of the coupling of $W_{A0}$ and $BL_1$, occurring as a result of raising $W_{A0}$ in addition to the cell data, $SA_1$ reads "1" with ease but "0" with difficulty. However, since $\phi2$ is raised as shown in FIG. 13A, the capacitance of $C_2$ is coupled to the /$BL_A$ side to raise the potential of /$BL_B$. Consequently, the situation where "1" is read with ease and "0" is read with difficulty is compensated to provide a same level of ease for reading both "1" and "0".

Note that the level of ease with which $SA_0$ reads "1" differs from the level with which $SA_1$ reads "1". Similarly, the level of difficulty with which $SA_0$ reads "0" differs from the level with which $SA_1$ reads "0". For instance, both $W_{A0}$ and $BL_2$ give rise to a small coupling when $W_{A0}$ is raised (because of a parasitic capacitance existing at the intersection of $BL_2$ and $W_{A0}$ although no memory cell is located there) so that the level of ease for $SA_0$ to read "1" is lower than the level of ease for $SA_1$ to read "1". This is due to the fact that reference bit line $BL_2$ FOR $SA_0$ is slightly raised because of the above described coupling. This difference can be eliminated by differentiating the capacitance value of $C_1$ from that of $C_2$ or selecting a capacitance value for $C_2$ smaller than that of $C_1$.

In additional, there may be a difference in the level of ease of reading "1" and the level of difficulty of reading "0"

between $SA_0$ for folded reading and $SA_1$ for open reading attributable to the exposure to array noises and the difference in the worst reading pattern and such a difference can also be corrected by selecting values for $C_1$ and $C_2$ that satisfy $C_1 \neq C_2$.

FIG. 13B shows a timing chart with which the reference bit line is raised not by a coupling action but, conversely, by lowering the coupling of the bit line from which the data in the corresponding memory cell is read in order to correct the level of ease with which "1" is read and the level of difficulty with which "0" is read. In this case, a difference can also be corrected by selecting values for $C_1$ and $C_2$ that satisfy $C_1 \neq C_2$.

(Embodiment 2)

Figure 14:
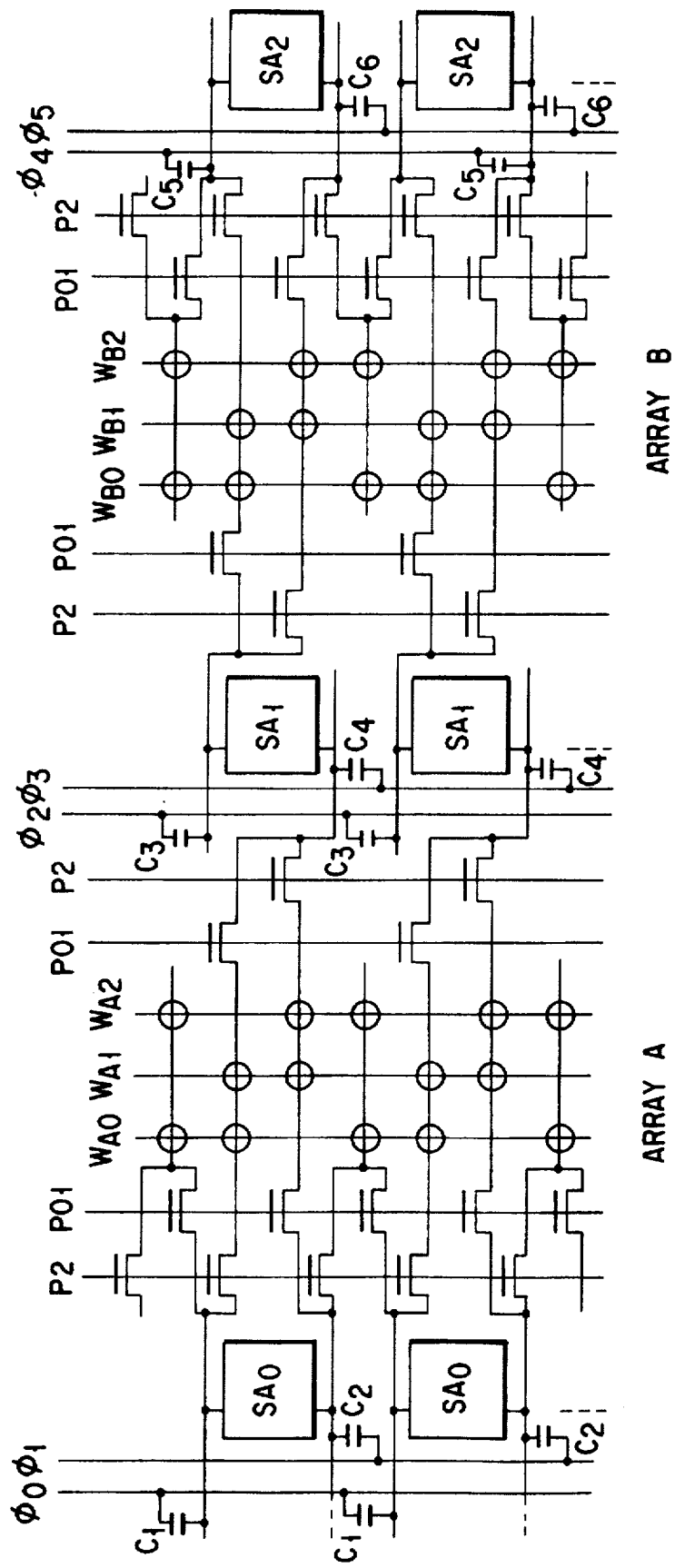
FIG. 14 is a circuit diagram of a second embodiment of DRAM according to the invention.

FIG. 14 is a circuit diagram of a second embodiment of DRAM according to the invention, showing two cell arrays (A, B) as examples.

This embodiment differs from the first embodiment in that $C_1$, $C_2$, $C_3$, $C_4$, $C_5$ and $C_6$ in the sense amplifier sections have different capacitance values. As described above, the level of ease with which "1" is read and that of difficulty with which "0" is read by same $SA_0$ for folded reading may vary depending on which of word lines $W_{A0}$, $W_{A1}$, and $W_{A2}$ is selected. This situation can be appropriately corrected by selecting capacitance values that satisfy $C_1 \neq C_2$, $C_3 \neq C_4$ and $C_5 \neq C_6$.

(Embodiment 3)

Figure 16A:
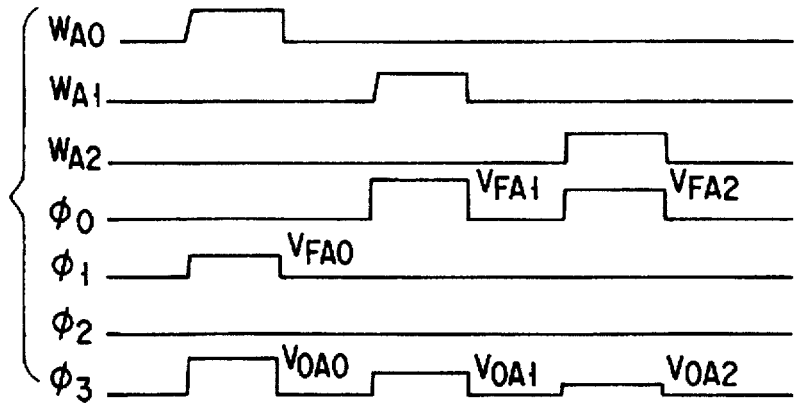
FIGS. 16A and 16B are timing charts for driving the third embodiment.
Figure 16B:
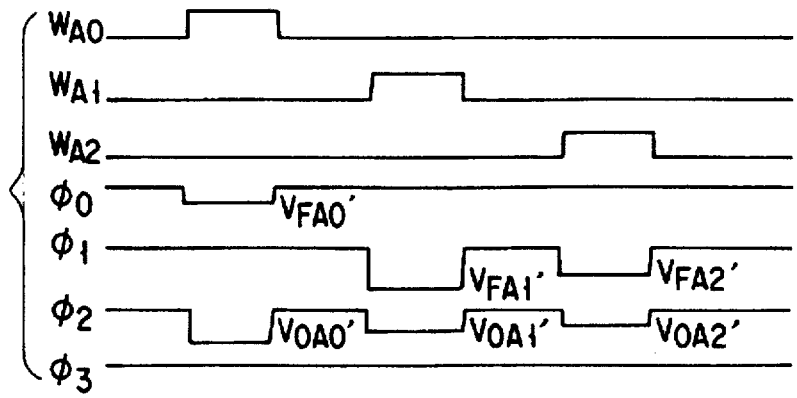
Figure 15:
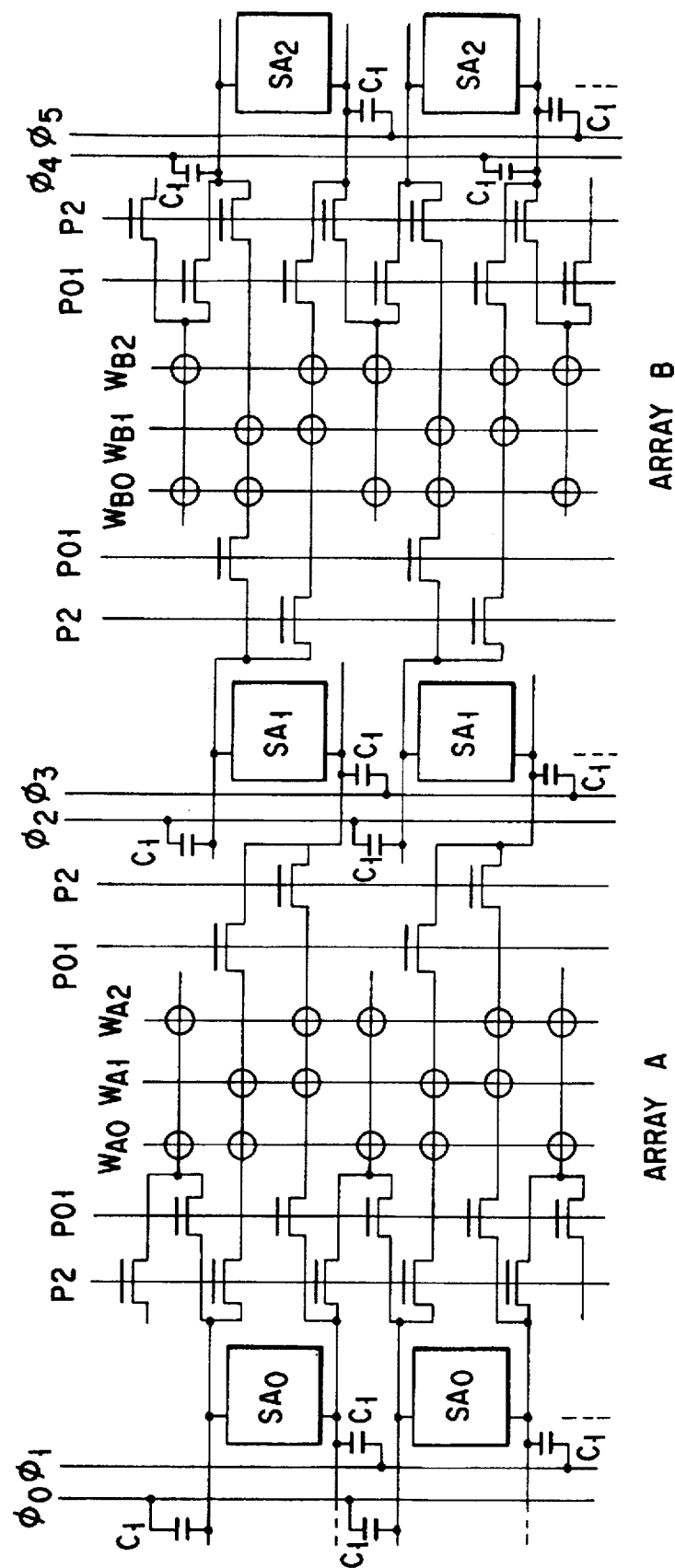
FIG. 15 is a circuit diagram of a third embodiment of DRAM according to the invention.
Figure 17A:
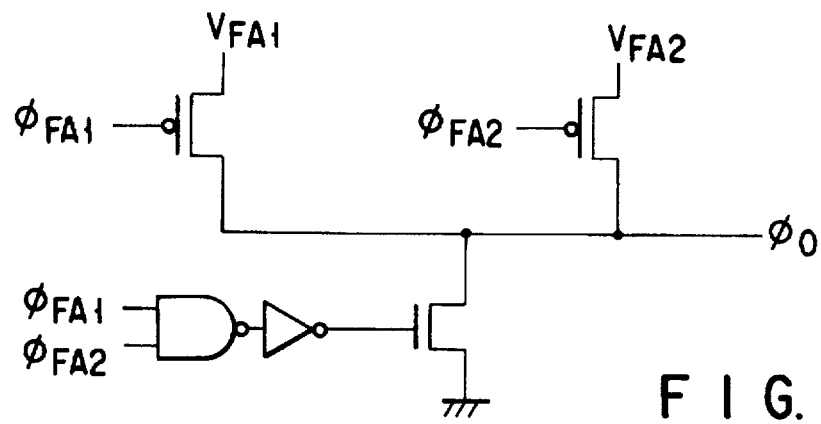
Figure 17B:
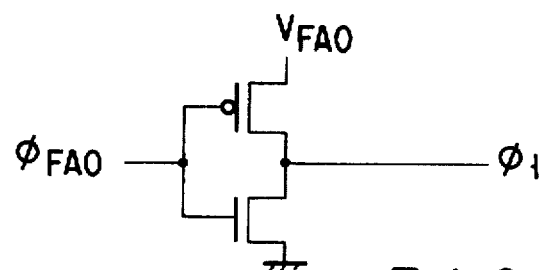
Figure 17D:
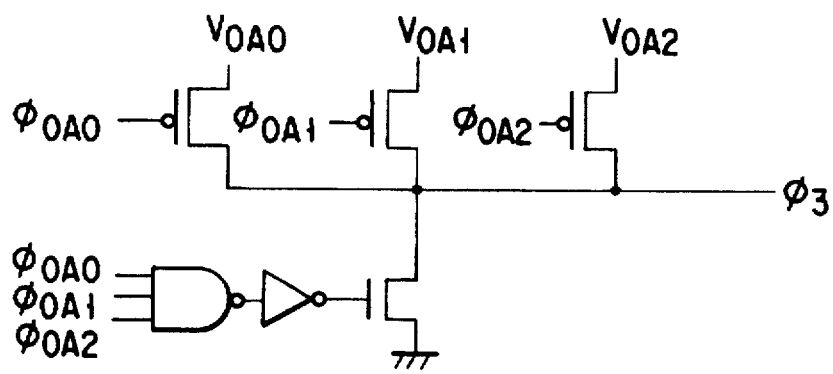

FIG. 15 is a circuit diagram of a third embodiment of DRAM according to the invention, showing two cell arrays (A, B) as examples. FIGS. 16A and 16B are timing charts for driving the embodiment.

With this embodiment, the differences that may arise between the open reading and the folded reading and from the selection of one of $W_{A0}$ through $W_{A2}$ can be corrected by varying the amplitudes of control signals $\phi_0$ through $\phi_5$, holding coupling capacitance $C_1$ of the sense amplifier sections.

For instance, the difference between the reading of "1" and that of "0" varies for all the combinations of $W_{A0}$ through $W_{A2}$ of the open BL configuration and the folded BL configuration, this situation can be corrected by selecting values that satisfy $V_{FA0} \neq V_{FA1} \neq V_{FA2} \neq V_{OA0} \neq V_{OA1} \neq V_{OA2}$. As in the case of FIGS. 13A and 13B, the arrangement of FIG. 16A differs from that of FIG. 16B in that the difference is corrected by raising the reference side in the former while it is corrected by lowering the cell reading side.

FIGS. 17A through 18D are circuit diagrams of exemplary drive circuits for generating control signals $\phi 0$ through $\phi 3$ to be used for the circuit of FIG. 15.

Referring to FIGS. 17A through 17D, $\phi_{FA0}$ goes to level "L" and the potential of $\phi_1$ is shifted from $V_{SS}$ to $V_{FA0}$ when $W_{A0}$ is selected. $\phi_{FA1}$ goes to level "L" and the potential of $\phi_0$ is shifted from $V_{SS}$ to $V_{FA1}$ when $W_{A1}$ is selected. In this manner, the operation of the embodiment can be controlled by arranging reference potentials $V_{FA0}$ through $V_{FA2}$ and $V_{OA0}$ through $V_{OA2}$.

FIGS. 18A through 18D illustrates arrangements for dealing with a situation where the level of ease of reading "1" and that of reading "0" differ only on the open BL side and the folded BL side. Only two reference potentials $V_{FA}$ and $V_{OA}$ are required.

FIG. 19 illustrates a circuit arrangement that requires no reference potential. With this circuit arrangement, $\phi_{PRE}$ is brought to "L" and capacitances $C_{X1}$ and $C_{X2}$ are precharged to $V_{CC}$ in the stand-by state. When, for example, $W_{A1}$ is selected, $\phi_{FA1}$ is brought to "L" to energize transistor $Q_1$. If the capacitance of control signal is made equal to $C_Y$ under this condition, the potential of $\phi_0$ shifts from $V_{SS}$ to $C_{X2}/(C_Y+C_{X2})\cdot V_{CC}$. As in the case of FIGS. 17A through 17D and FIGS. 18A through 18D, the amplitudes of the control signals can be varied freely by selecting $C_{X1}=C_{X2}$. Note that similar circuits can be arranged for $\phi_0$, $\phi_2$ and $\phi_3$.

In a preliminary stage of operation, $\phi_{PRE}$ may be simply made equal to $V_{CC}$ and the discrepancy between the level of ease of reading "1" and that of reading "0" may be determined by externally applying a reference voltage to $X_1$, $X_2$ to differentiate the values of $C_{X1}$ and $C_{X2}$ by that discrepancy so that the device may operate without external inputs for $X_1$ and $X_2$.

(Embodiment 4)

Figure 20:
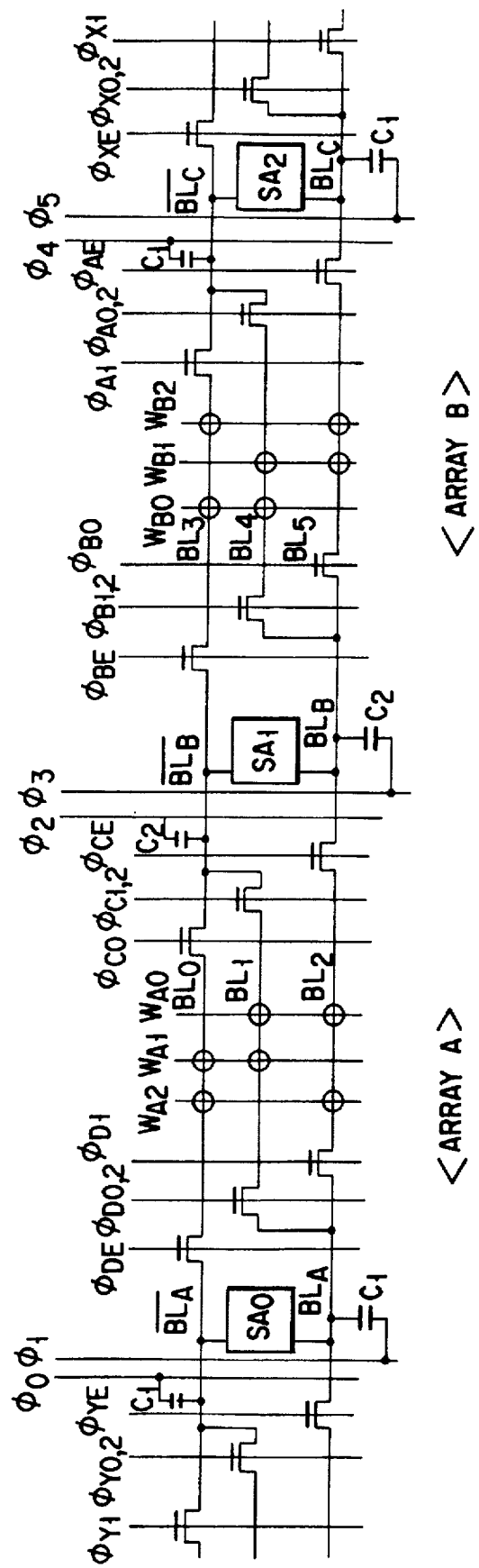
FIG. 20 is a circuit diagram of a fourth embodiment of DRAM according to the invention.

FIG. 20 is a circuit diagram of a fourth embodiment of DRAM according to the invention, showing two cell arrays (A, B) as examples. FIG. 21 is a timing charts for driving the embodiment.

Figure 4:
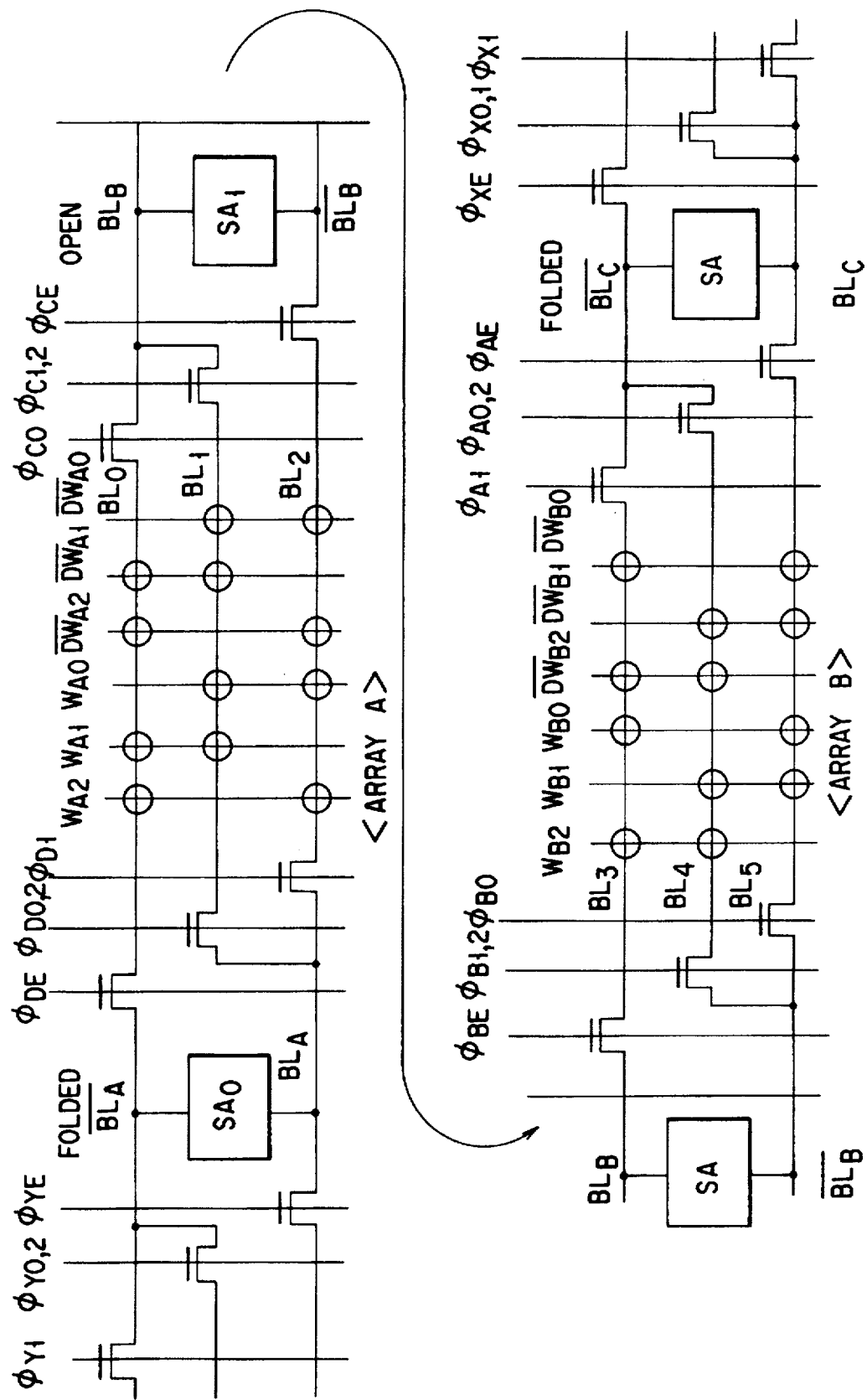
FIG. 4 is a schematic diagram of another conventional DRAM realized by combining an open BL configuration and a folded BL configuration.
Figure 5A:
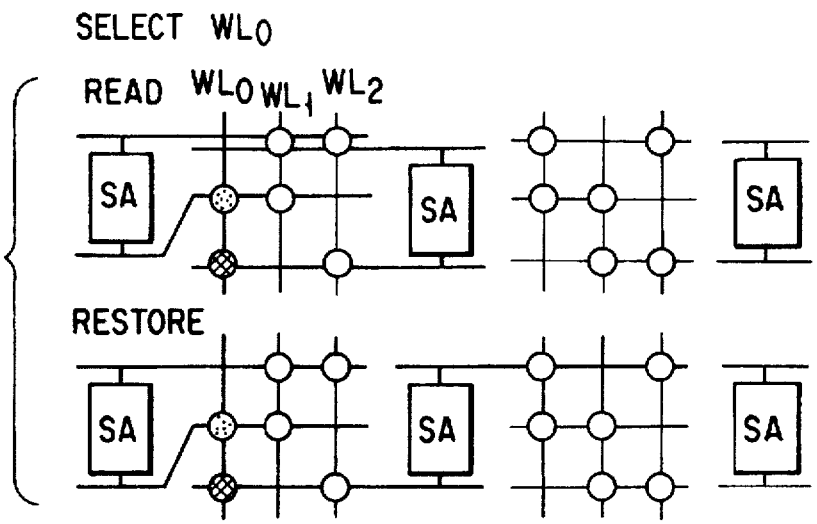
FIGS. 5A through 5C are schematic diagrams illustrating the operation of the DRAM of FIG. 4.
Figure 5B:
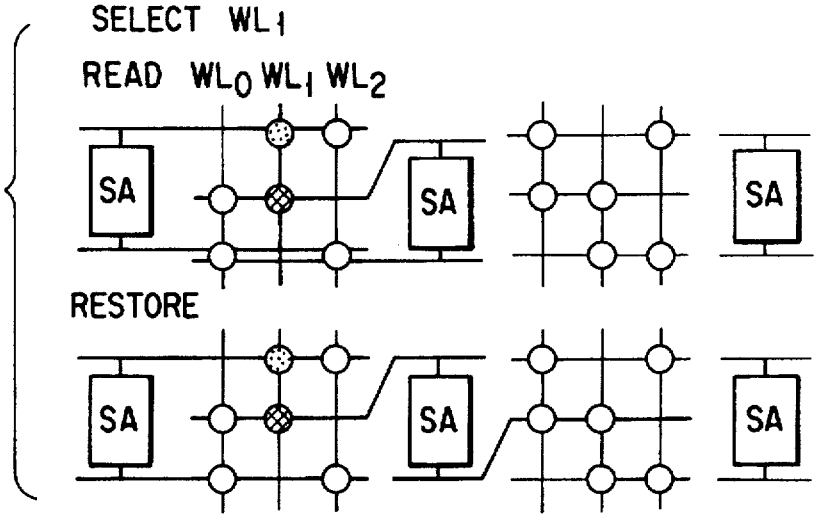
Figure 5C:
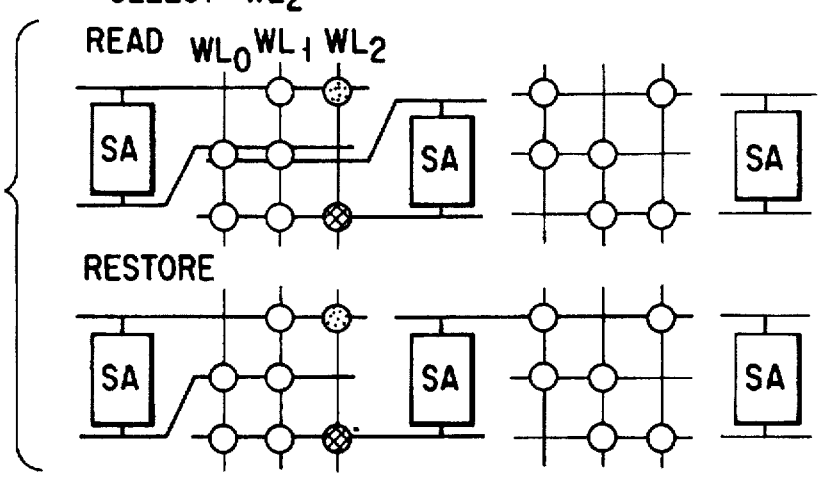
Figures 6A, 6B, 6C:
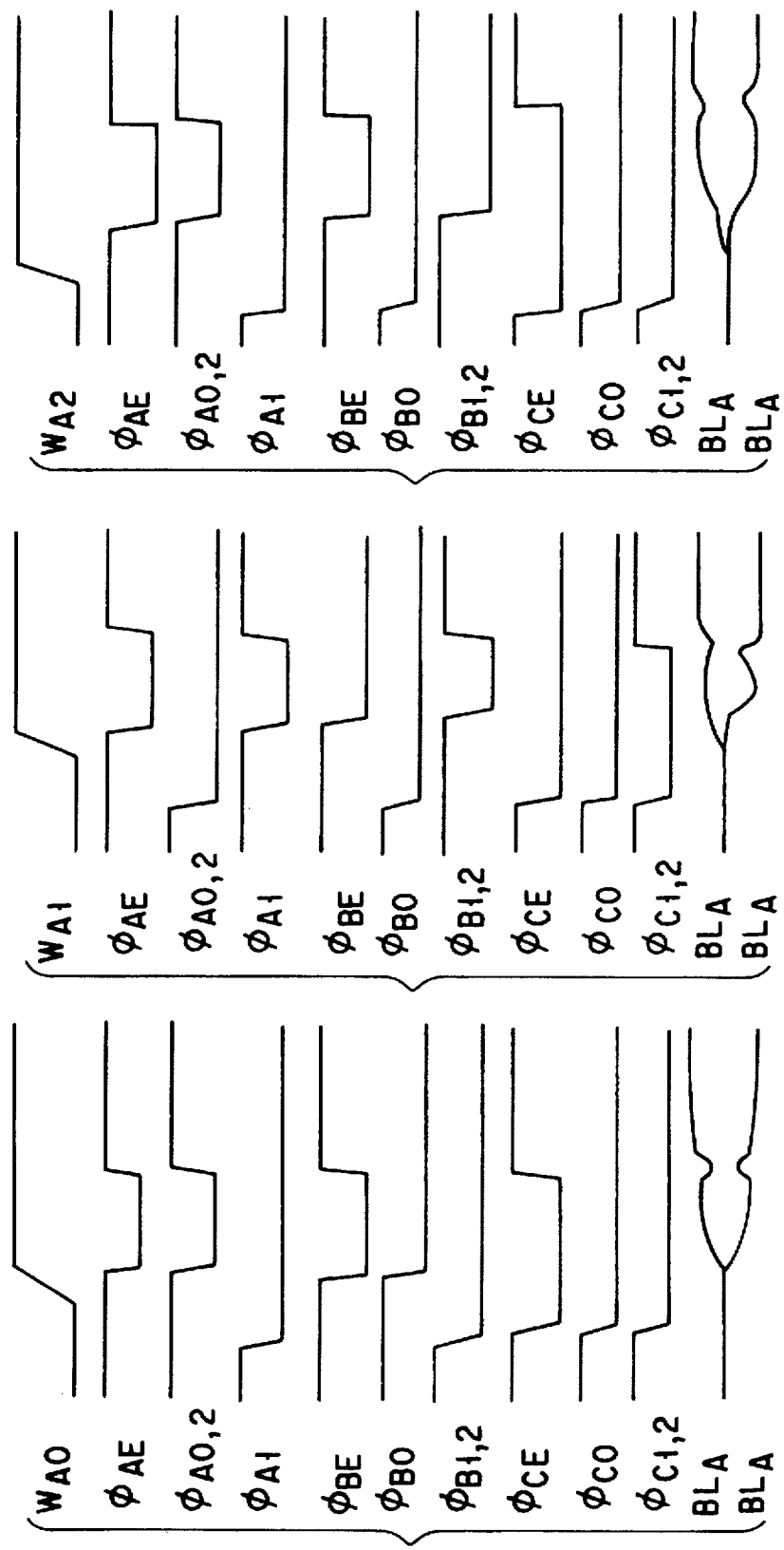
FIGS. 6A through 6C are timing charts for driving the DRAM of FIG. 4.
Figure 7A:
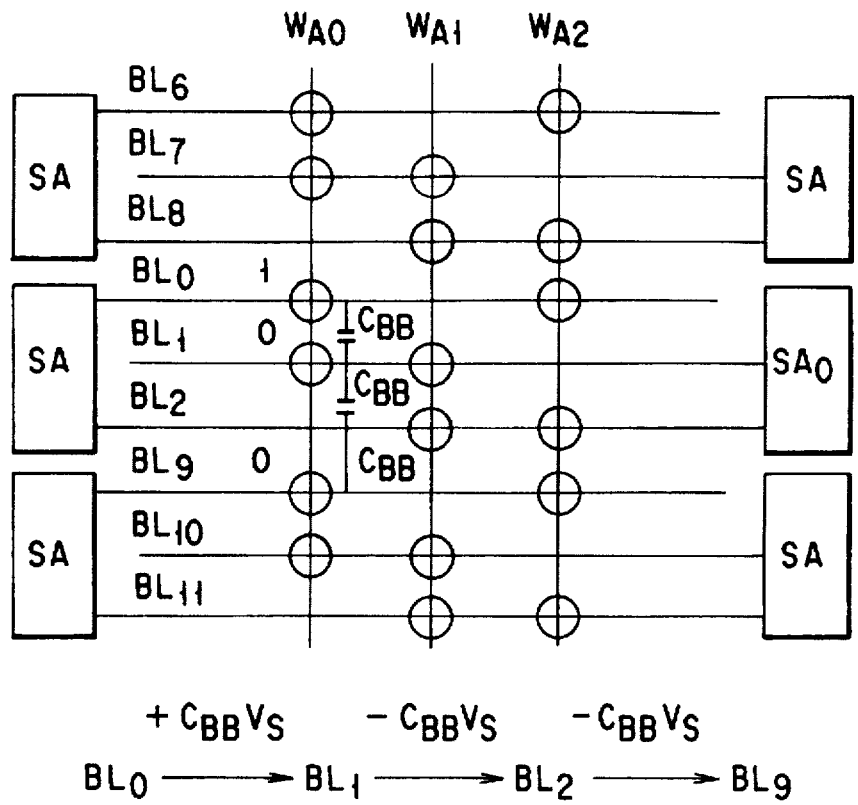
FIGS. 7A and 7B are schematic diagram of a conventional DRAM illustrating how inter-bit line noises are generated.
Figure 7B:
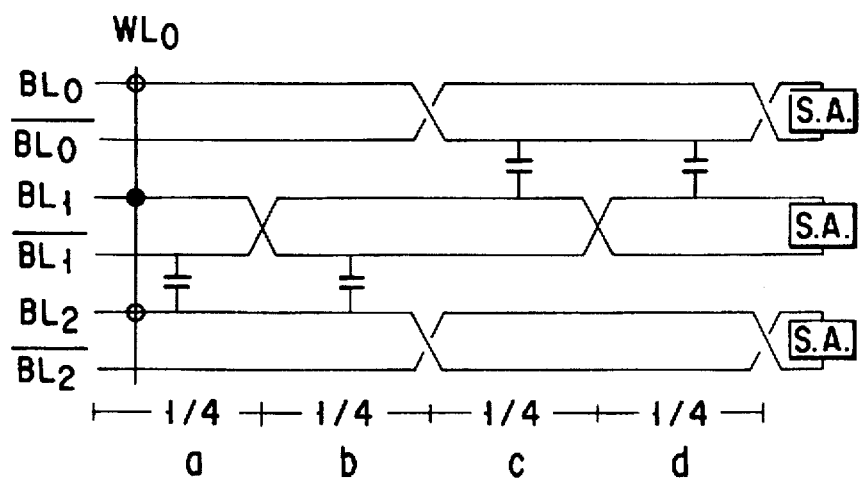
Figure 8:
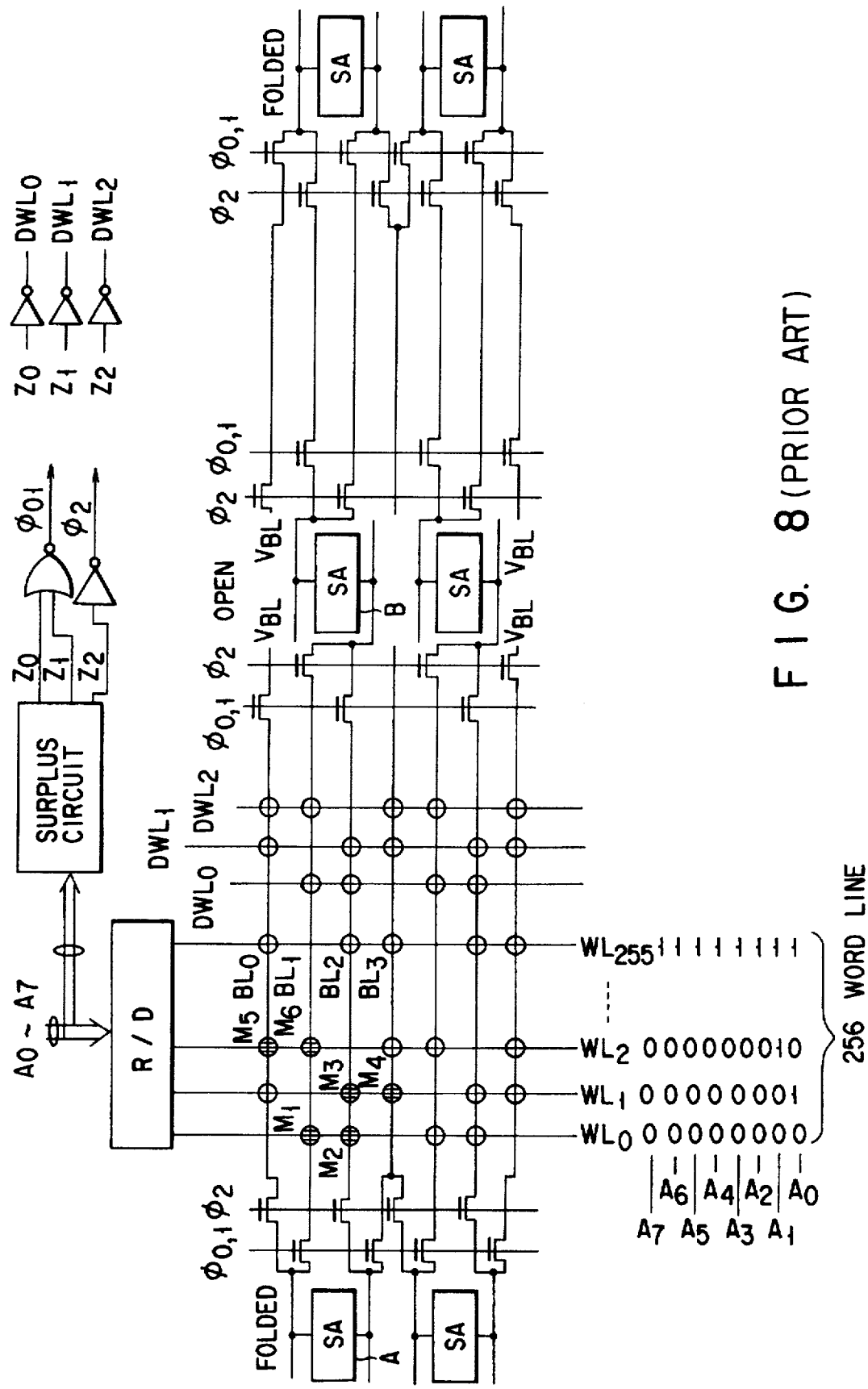
FIG. 8 is a schematic circuit diagram of a conventional DRAM having an open/folded hybrid BL configuration.
Figure 9A:
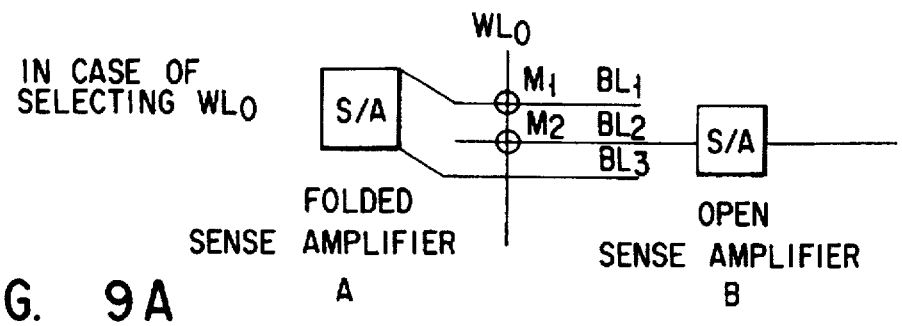
FIGS. 9A through 9C are diagrams showing different connections of bit lines, memory cells and sense amplifiers.
Figure 9B:
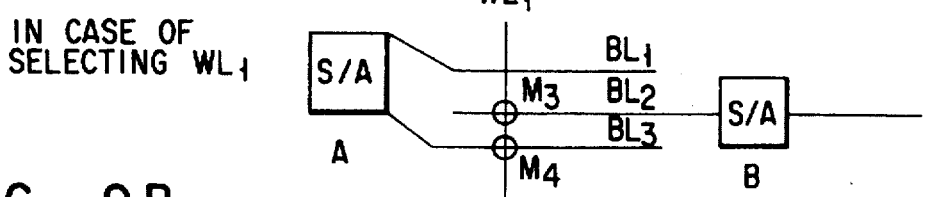
Figure 9C:
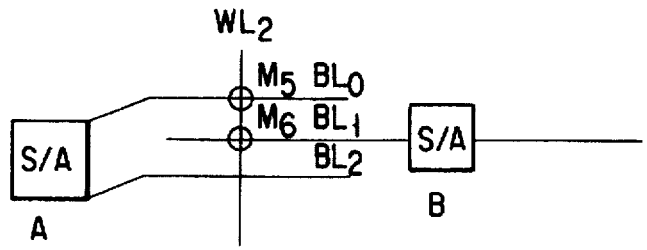

This embodiment is in fact provides an improvement to the DRAM illustrated in FIG. 4. Like the case of the first embodiment, this embodiment differs from the DRAM of FIG. 4 in that it additionally comprises control clocks $\phi_0$, $\phi_1$, $\phi_2$, $\phi_3$, $\phi_4$ and $\phi_5$, which are connected to the respective bit lines of a corresponding sense amplifier section by way of capacitors $C_1$ and $C_2$.

As in the case of FIG. 12, the respective differences of the level of ease of reading "1" and that of reading "0" for $SA_0$ side (folded reading and folded rewriting) and those for $SA_1$ side (folded reading and open rewriting) can be corrected by selecting $C_1 \neq C_2$.

FIG. 21 shows an arrangement for slightly lowering the read-out side by coupling the sense amplifier section.

(Embodiment 5)

Figure 22:
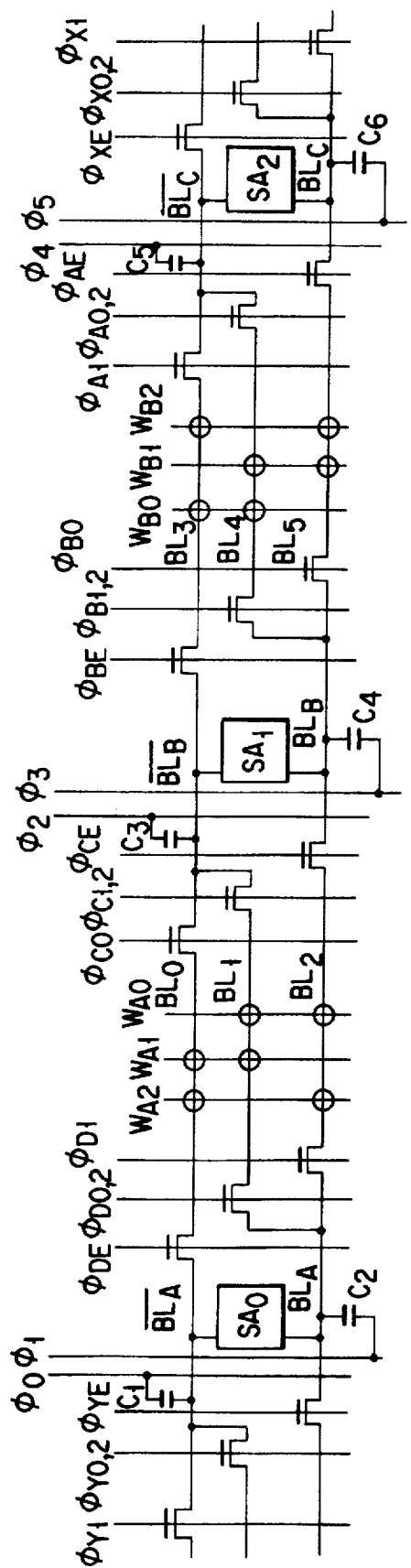
FIG. 22 is a circuit diagram of a fifth embodiment of DRAM according to the invention.

FIG. 22 is a circuit diagram of a fifth embodiment of DRAM according to the invention, showing two cell arrays (A, B) as examples.

If the levels of ease of reading "1" and "0" for $W_{A0}$, $W_{A1}$, and $W_{A2}$ differ from each other, they may be corrected by selecting $C_1 \neq C_2$, $C_3 \neq C_4$ and $C_5 \neq C_6$ as in the case of FIG. 14.

(Embodiment 6)

Figure 23:
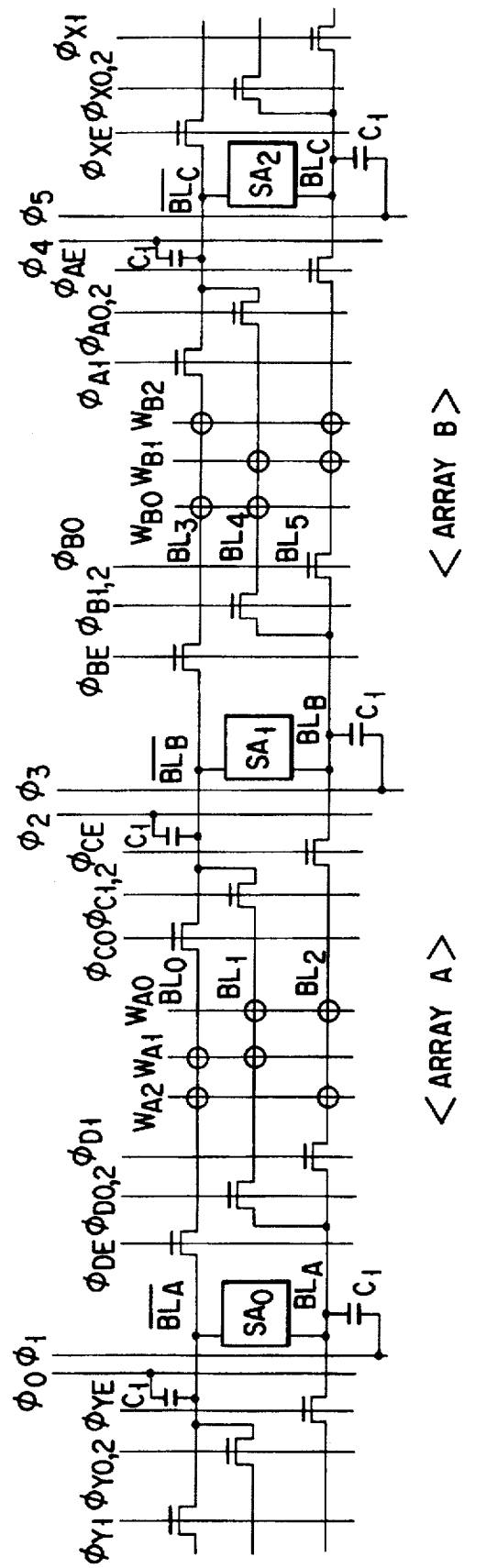
FIG. 23 is a circuit diagram of a sixth embodiment of DRAM according to the invention.
Figure 24:
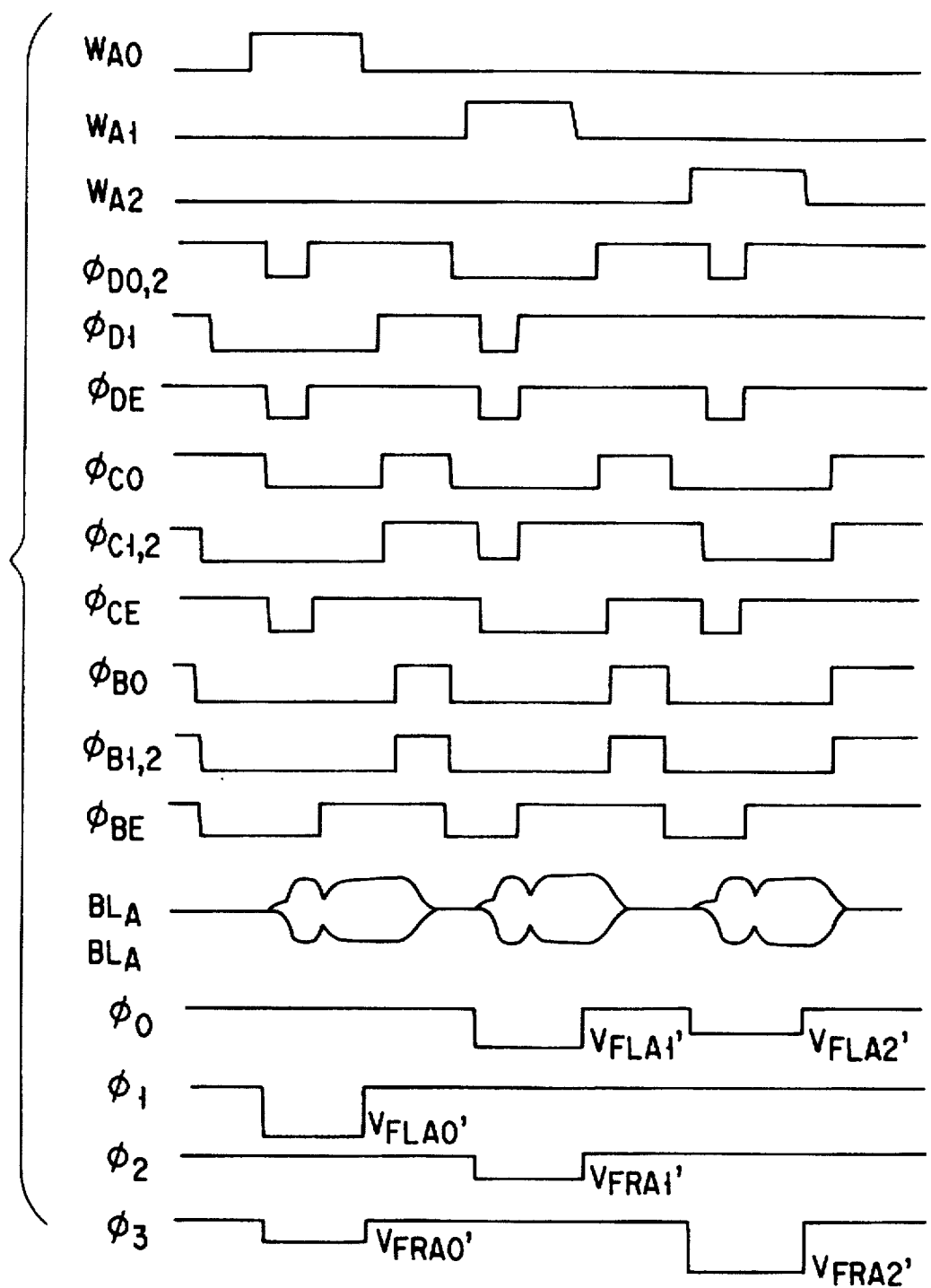
FIG. 24 is a timing chart for driving the sixth embodiment.

FIG. 23 is a circuit diagram of a sixth embodiment of DRAM according to the invention, showing two cell arrays (A, B) as examples. FIG. 24 is a timing charts for driving the embodiment.

As in the case of the embodiment of FIG. 15, corrections can be made for this embodiment by varying the amplitudes of control signals $\phi_0$ through $\phi_5$.

FIG. 25 is a circuit diagram of an exemplary drive circuit for generating control signals $\phi_0$ through $\phi_5$ for the circuit of FIG. 23. Note that no reference potential is used for varying the amplitudes as in the case of FIG. 19. The potential of $\phi_0$ of this embodiment is lowered by means of charge distribution from $V_{CC}$. Note also that the circuit of FIG. 25 can also be used for drive operation of FIG. 16B.

(Embodiment 7)

Figures 26A, 26B:
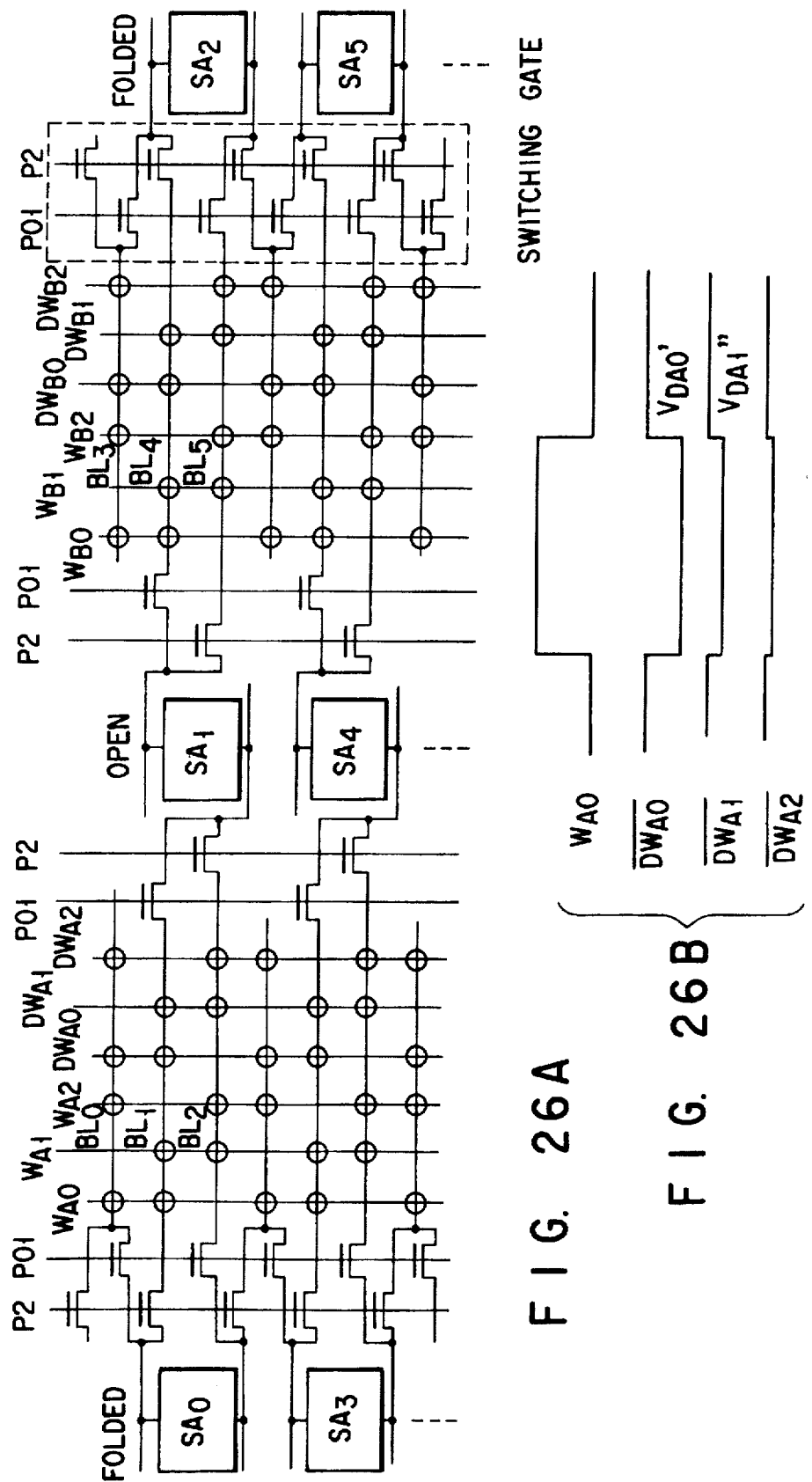
FIGS. 26A and 26B are circuit diagrams of a seventh embodiment of DRAM according to the invention.

FIGS. 26A and 26B are circuit diagrams of a seventh embodiment of DRAM according to the invention, showing two cell arrays (A, B) as examples.

With this embodiment, the level of ease of reading "1" and "0" can be corrected by arranging dummy cells in the cell arrays and selecting two or more than two values for lowering each of /DW$_{A0}$ through /DW$_{A2}$ and /DW$_{B0}$ through /DW$_{B2}$ or selecting three values for lowering one of /DW$_{A0}$ through /DW$_{A2}$.

Assume, for example, that $BL_0$ is raised more than $BL_2$ by VX as a result of various coupling operations when $W_{A0}$ is selected.

If $BL_0$ and $BL_1$ are lowered by $V_Y$ when dummy word line /DW$_{A0}$ is lowered from $V_{CC}$ to $V_{SS}$, then $BL_1$ and $BL_2$ will be lowered by $V_Y$ when $/DW_{A1}$ is lowered from $V_{CC}$ to $V_{SS}$. $BL_0$ and $BL_2$ will also be lowered by $V_Y$ when $/DW_{A2}$ is lowered from $V_{CC}$ to $V_{SS}$. Thus, if $/DW_{A0}$ through $/DW_{A2}$ are lowered by voltages $V_{A0}/V_{CC}$, $V_{A1}/V_{CC}$ and $V_{A2}/V_{CC}$, the difference between $BL_0$ and $BL_2$ after the correction of moving the dummy word lines will be expressed by the equation below.

$$BL_0 - BL_2 = (V_{A0} \times V_Y + V_{A2} \times V_Y) -$$
$$(V_{A1} \times V_Y + V_{A2} \times V_Y)$$
$$= (V_{A0} - V_{A1})V_Y$$

On the open $SA_1$ side, the following equation holds true.

$$BL_1 - BL_4 = (V_{A0} + V_{A1})V_Y$$

Thus, corrections can be carried out by selecting an appropriate value for $V_{A0}+V_{A1}$.

(Embodiment 8)

Figure 27:
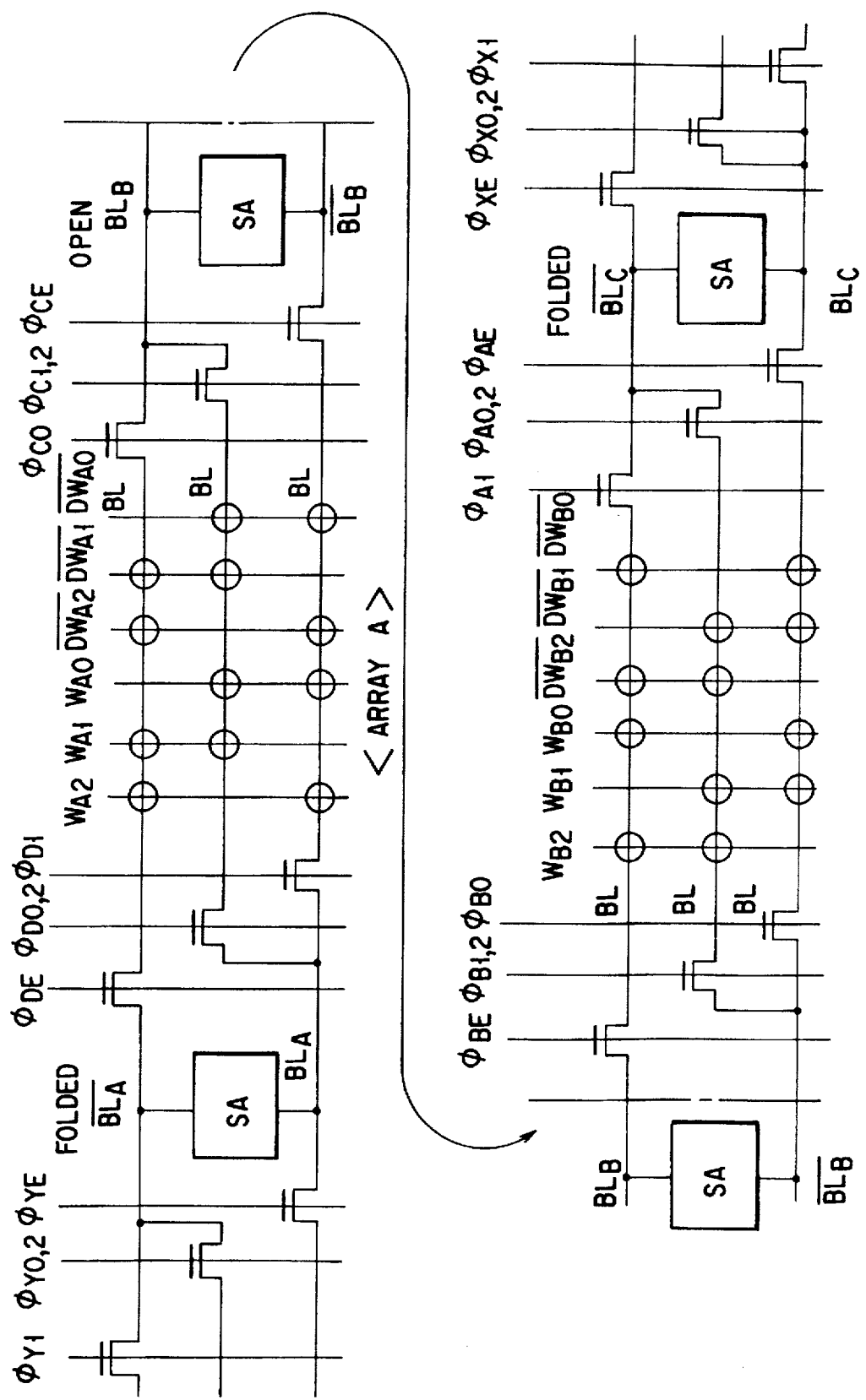
FIG. 27 is a circuit diagram of an eighth embodiment of DRAM according to the invention.

FIG. 27 is a circuit diagram of an eighth embodiment of DRAM according to the invention, showing two cell arrays (A, B) as examples.

With this embodiment again, the level of ease of reading "1" and "0" can be corrected by arranging dummy cells in the cell arrays and selecting two or more than two values for lowering each of $/DW_{A0}$ through $/DW_{A2}$ and $/DW_{B0}$ through $/DW_{B2}$ or selecting three values for lowering one of $/DW_{A0}$ through $/DW_{A2}$.

This embodiment operates essentially same as Embodiment 7 above. When $W_{A0}$ is selected, the following equations hold true.

$$BL_0 - BL_1 = (V_{A0}' + V_{A1}')V_Y - (V_{A1}' + V_{A2}')V_Y$$
$$= (V_{A0}' - V_{A2}')V_Y$$
$$BL_0 - BL_2 = (V_{A0}' + V_{A2}')V_Y - (V_{A1}' + V_{A2}')V_Y$$
$$= (V_{A0}' - V_{A1}')V_Y$$

So, the level of ease of reading "1" and that of reading "0" can be corrected appropriately.

(Embodiment 9)

Figure 28:
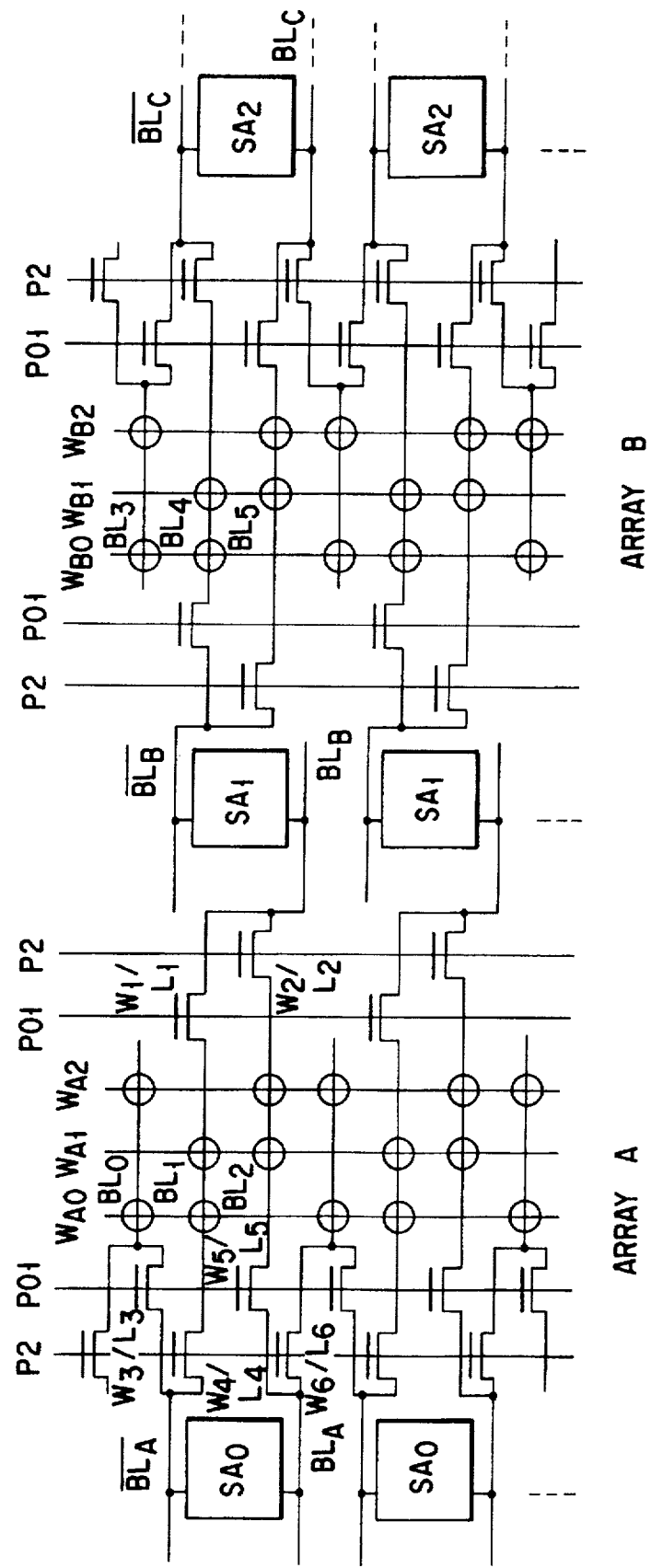
FIG. 28 is a circuit diagram of a ninth embodiment of DRAM according to the invention.

FIG. 28 is a circuit diagram of a ninth embodiment of DRAM according to the invention, showing two cell arrays (A, B) as examples.

While capacitors are connected to the bit lines in the embodiment of FIG. 12, the same effect is achieved in this embodiment by modifying the gate length and the gate width of the switches arranged between the cell arrays and the sense amplifiers for the operation of the device. Since the switches are arranged to switch "H" and "L" for selected cells, the effect of the capacitors can be achieved simply by varying the degree of coupling without using additional clocks.

(Embodiment 10)

Figure 29:
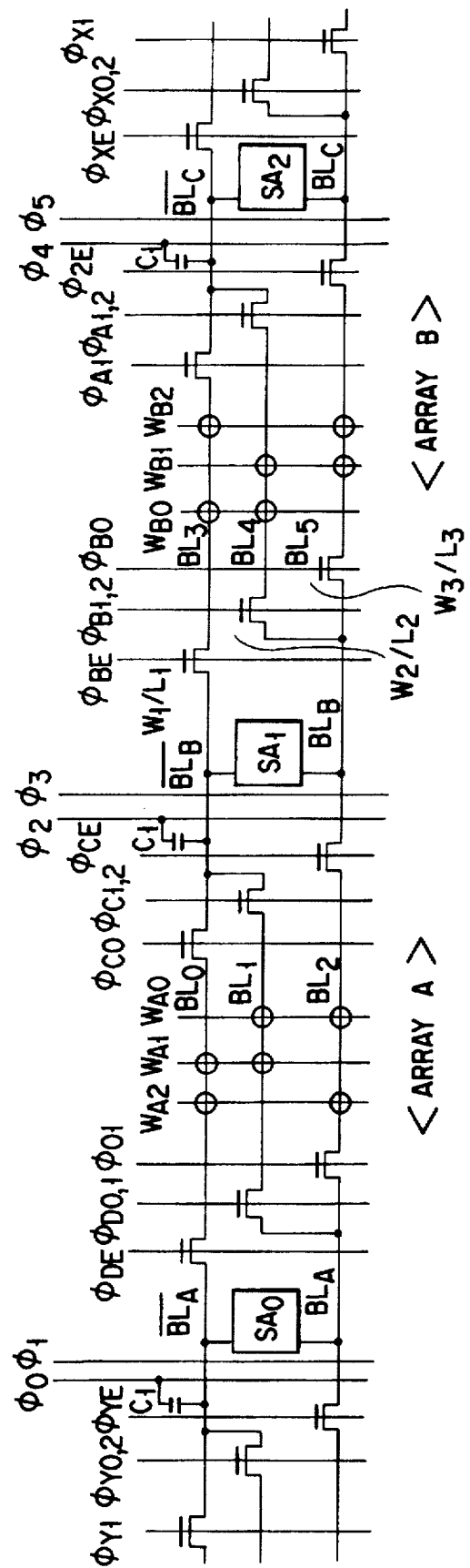
FIG. 29 is a circuit diagram of a tenth embodiment of DRAM according to the invention.

FIG. 29 is a circuit diagram of a tenth embodiment of DRAM according to the invention, showing two cell arrays (A, B) as examples.

While capacitors are connected to the bit lines in the embodiment of FIG. 20, the same effect is achieved in this embodiment by modifying the length and the width of the gate of the switches arranged between the cell arrays and the sense amplifiers for the operation of the device.

(Embodiment 11)

FIG. 30 is a circuit diagram of an eleventh embodiment of DRAM according to the invention, showing two cell arrays (A, B) as examples. FIG. 31 is a timing charts for driving the embodiment.

Referring to FIG. 30, there are shown sense amplifiers $SA_0$ through $SA_5$, word lines $W_{A0}$ through $W_{A2}$ and $W_{B0}$ through $W_{B2}$, bit lines $BL_0$ through $BL_{15}$ arranged in cell arrays and bit lines $/BL_{A0}$, $BL_{A0}$, $/BL_{A1}$, $BL_{A1}$, $/BL_{B0}$, $BL_{B0}$, $/BL_{B1}$, $BL_{B1}$, $/BL_{C0}$, $BL_{C0}$, $/BL_{C1}$ and $BL_{C1}$ arranged in sense amplifier sections. There are also shown control signals $P_{A0}$, $P_{A12}$, $P_{B11}$, $P_{B1}$, $P_{B020}$, $P_{B022}$, $P_{C11}$, $P_{C1}$, $P_{C020}$, $P_{C022}$, $P_{D0}$ and $P_{D12}$ for switches designed to switch over the connections of the bit lines of memory cells and the bit line pairs of sense amplifiers.

Sense amplifier (SA) with a folded BL configuration are arranged at the right end of cell array B and at the left end of cell array A. The SAs at the right end of cell array B are shared by the cell array located to the right of cell array B to form a shared SA system there. Likewise, the SAs at the left end of cell array A are shared by the cell array located to the left of the cell array A also to form a shared SA system there.

As for the word lines of cell array A, assume now that $W_{A0}$ is selected. Then, of $SA_0$, $SA_2$ and $SA_3$, $SA_0$ forms a pair of bit lines, using one of the three bit lines that has a memory cell, say $BL_1$, and one of the bit line pair $BL_3$ and $BL_5$ of $SA_3$ having a folded BL configuration, say $BL_3$ located on the reference side, as folded BLs to operate the SA. Similarly, $SA_2$ forms a pair of bit lines of $BL_2$ and $BL_0$ as folded BLs to operate the SA and $SA_3$ forms a pair of bit lines of $BL_5$ and $BL_3$ as folded BLs to operate the SA. $BL_3$ is used as a reference bit line to be commonly used for $SA_0$ and $SA_3$.

For rewriting data into a memory cell, the shared state of the reference bit line is suspended and bit line pair $BL_1$, $BL_3$ connected to sense amplifier $SA_0$ are used as folded BLs to carry out the rewriting operation, while one of the three bit lines of array B located next to $BL_2$ of array A, say $BL_8$, is used as a reference bit line to be used for a bit line pair having an open BL configuration and connected to sense amplifier $SA_2$. Likewise, one of the three bit lines of array B located next to $BL_5$ of array A, say $BL_{11}$, is used as a reference bit line to be used for a bit line pair having an open BL configuration and connected to sense amplifier $SA_3$.

With the above arrangement, no noise that is specific to open BLs is generated by ways of word lines during reading operations to bring forth the effect of the folded BL configuration of canceling noises generated by way of unselected word lines to consequently reduce the overall noise level.

Additionally, since the open BL configuration and the folded BL configuration are combined for rewriting data, it allows ordinary rewriting operations and equalization of bit lines to take place. Likewise, when a word line of array B is selected, a bit line of the array is used as a common reference for reading operation to effectuate a folded BL configuration. For a rewriting operation, on the other hand, one of the bit line pairs is used to effectuate a folded BL configuration, while the use of the other bit line pair as shared reference BLs is suspended and the bit line of array B through which the memory cell data is read out and the bit line (reference BL) of array A located adjacent thereto are used to form a pair of an open BL configuration for rewriting operation.

The cell arrays have memory cells on two-third of the intersections of their word lines and bit lines so that, while the ratio of the number of memory cells to that of intersections is lower than that of cell arrays of an open BL configuration, it is higher than that of cell arrays of a folded BL configuration on which memory cells are arranged only on a half of the intersections of the word lines and the bit lines. Consequently, a memory device according to the invention can reduce the area of the memory cells if compared with a comparable memory device with a folded BL configuration. Additionally, a sense amplifier (SA) is arranged for every three bit lines (BL) to mollify the design requirements for SAs if compared with a device having an open BL configuration.

Looking at a particular bit line pair of the embodiment of FIG. 30 having a cell array arrangement as described above when it is used for reading data with the folded BL configuration, it will be understood that the bit line through which the data in a memory cell is read is placed between the bit line pair to change over the connection between the bit line of the memory cell and the bit line of the corresponding sense amplifier regardless of the location of the selected word line.

For example, assume that word line $W_{A0}$ is selected, it is raised after bringing $P_{A12}$, $P_{B11}$ and $P_{B1}$ to level "L" and keeping $P_{A0}$, $P_{B020}$ and $P_{B022}$ to level "H" as shown in FIG. 31. Then, the memory cell data are read onto $BL_1$, $BL_2$, $BL_3$ and $BL_4$. Then, data are taken into $SA_0$ by using $BL_1$ through which the corresponding cell data is read out and reference bit line $BL_3$ as a folded BL pair because $P_{A0}$, $P_{B020}$ and $P_{B022}$ are held to "H".

Similarly, data are taken into $SA_1$ by using $BL_4$ through which the corresponding cell data is read out and reference bit line $BL_6$ as a folded BL pair and also taken into $SA_2$ by using $BL_5$ through which cell data is read out and reference bit line $BL_3$ as a folded BL pair. Note that reference bit line $BL_3$ is shared by the bit line pairs of $SA_0$ and $SA_3$.

While only four columns and hence only one shared reference bit line are shown in FIG. 30, it will be understood that a shared reference bit line appears for every three bit lines. This arrangement apparently differs from that of FIG. 4 since, in this embodiment, bit line $BL_2$ through which the cell data of $SA_2$ is read out is placed between bit line pair $BL_1$, $BL_3$ of $SA_0$ and bit line $BL_5$ through which the cell data of $SA_3$ is placed between bit line pair $BL_4$, $BL_6$ of $SA_3$ while bit line $BL_1$ through which the cell data of $SA_0$ is read out is placed between bit line pair $BL_0$, $BL_2$ of $SA_2$ and bit line $BL_4$ through which the cell data of $SA_1$ is read out is placed between bit line pair $BL_3$, $BL_5$.

Figure 32:
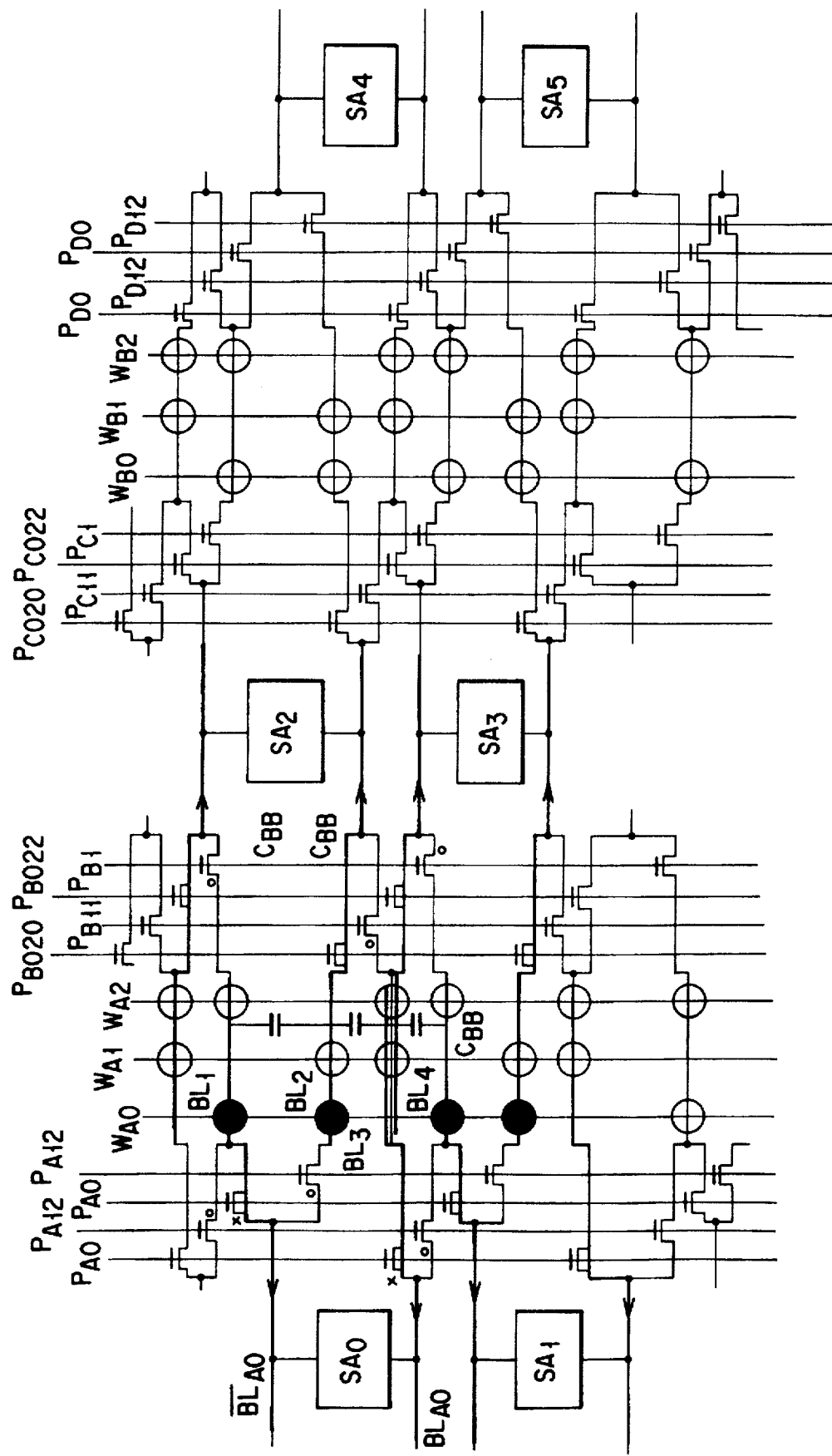
FIG. 32 is a circuit diagram of the eleventh embodiment showing how the connections of the bit lines are switched.
Figure 33:
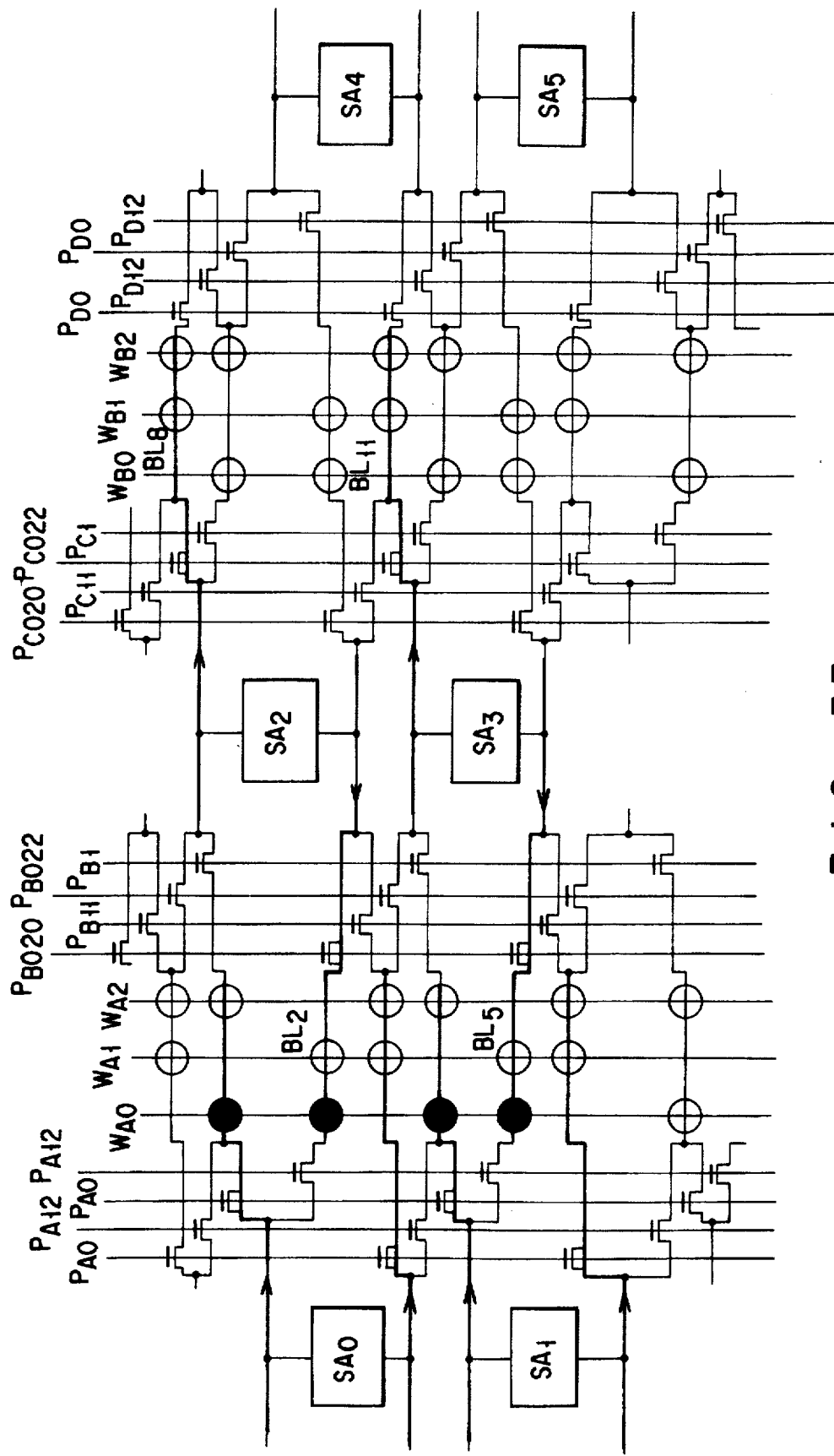
FIG. 33 is another circuit diagram of the eleventh embodiment also showing how the connections of the bit lines are switched.

The above described data reading operation that takes place when word line $W_{A0}$ is selected may be understood more clearly by referring to emphatically drawn solid lines of FIG. 32. As $BL_2$ through which the memory cell data that is put into $SA_2$ is read out is subjected to a change equal to the volume of the read signal to give rise to a noise that is applied to the adjacent bit lines by way of the coupling capacitance $C_{BB}$ between the bit lines (FIG. 32). Now, since the bit line pair $BL_1$ and $BL_3$ of $SA_0$ are located on the both sides of $BL_2$, they are subjected to an equal amount of noise with a same phase. If seen from $SA_0$, the potential difference between $BL_1$ and $BL_3$ that form a bit line pair does not change and the effect of the array noise of $BL_2$ is canceled.

Thus, the net noise that bit line pair of $BL_1$, $BL_3$ is subjected to is the inter-bit line noise of $C_{BB}V_S$ ($V_S$ representing the volume of the read signal of $BL_4$) generated by $BL_4$ through which the memory cell data is read out for $SA_1$. In other words, the net noise can be reduced to one-third of the inter-bit line noise of $3C_{BB}V_S$ of FIG. 4 and, because the noise level can be lowered without using twisted bit lines, the overall chip size can be significantly reduced.

For the same token, the inter-bit line noise attributable to the read out signals from the bit lines placed between the bit line pairs of $SA_1$, $SA_2$ and SA can be canceled so that the inter-bit line noise of $C_{BB}V_S$ on any of the bit lines can be reduced to one-third of the inter-bit line noise of $3C_{BB}V_S$ of FIG. 4.

After the date of a memory cell is read out onto a corresponding sense amplifier, $P_{A0}$, $P_{B020}$ and $P_{B022}$ are brought to level "L" as shown in FIG. 31 to activate the sense amplifier to amplify a minute signal.

Now, let us look into the operation of putting back or rewriting the data onto the original memory cell. $P_{A0}$ is brought to level "H" for $SA_0$ and $SA_1$ and data are rewritten into the corresponding memory cells by using $BL_1$ and $BL_3$ and $BL_4$ and $BL_6$ as bit line pairs with a folded BL configuration.

Under this condition, since $BL_3$ is used for $SA_0$ and cannot be used for the rewriting operation of $SA_3$. $P_{B020}$ is brought back to level "H", $P_{B022}$ is held to level "L" and $P_{CO22}$ connected to adjacent array B is brought to level "H" for the rewriting operation on $SA_2$ and $SA_3$. In other words, $SA_2$ uses $BL_2$ and $BL_8$ for a bit line pair with an open BL configuration and $SA_3$ uses $BL_5$ and $BL_{11}$ for a bit line pair also with an open BL configuration.

Figure 34:
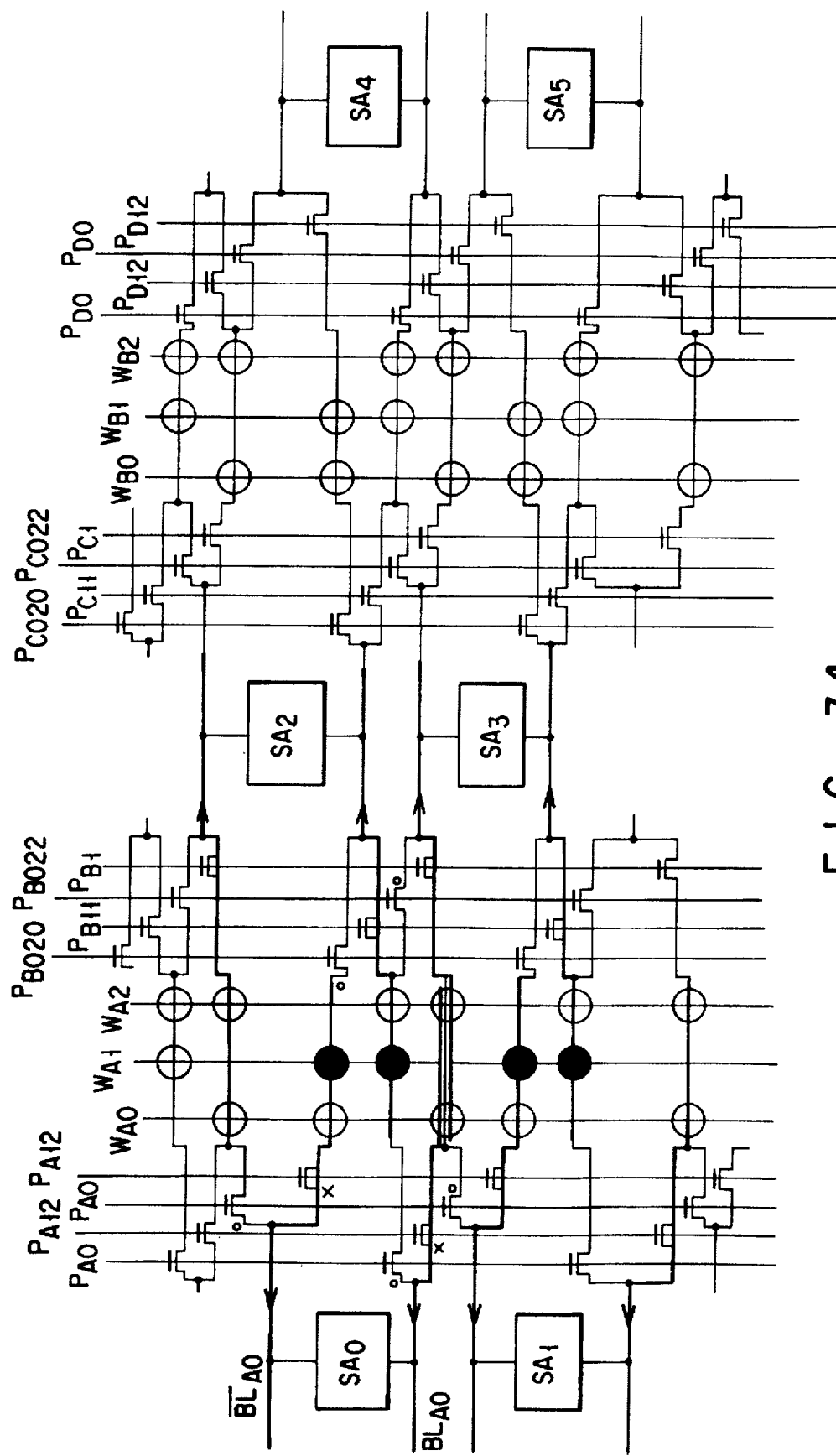
FIG. 34 is still another circuit diagram of the eleventh embodiment also showing how the connections of the bit lines are switched.
Figure 35:
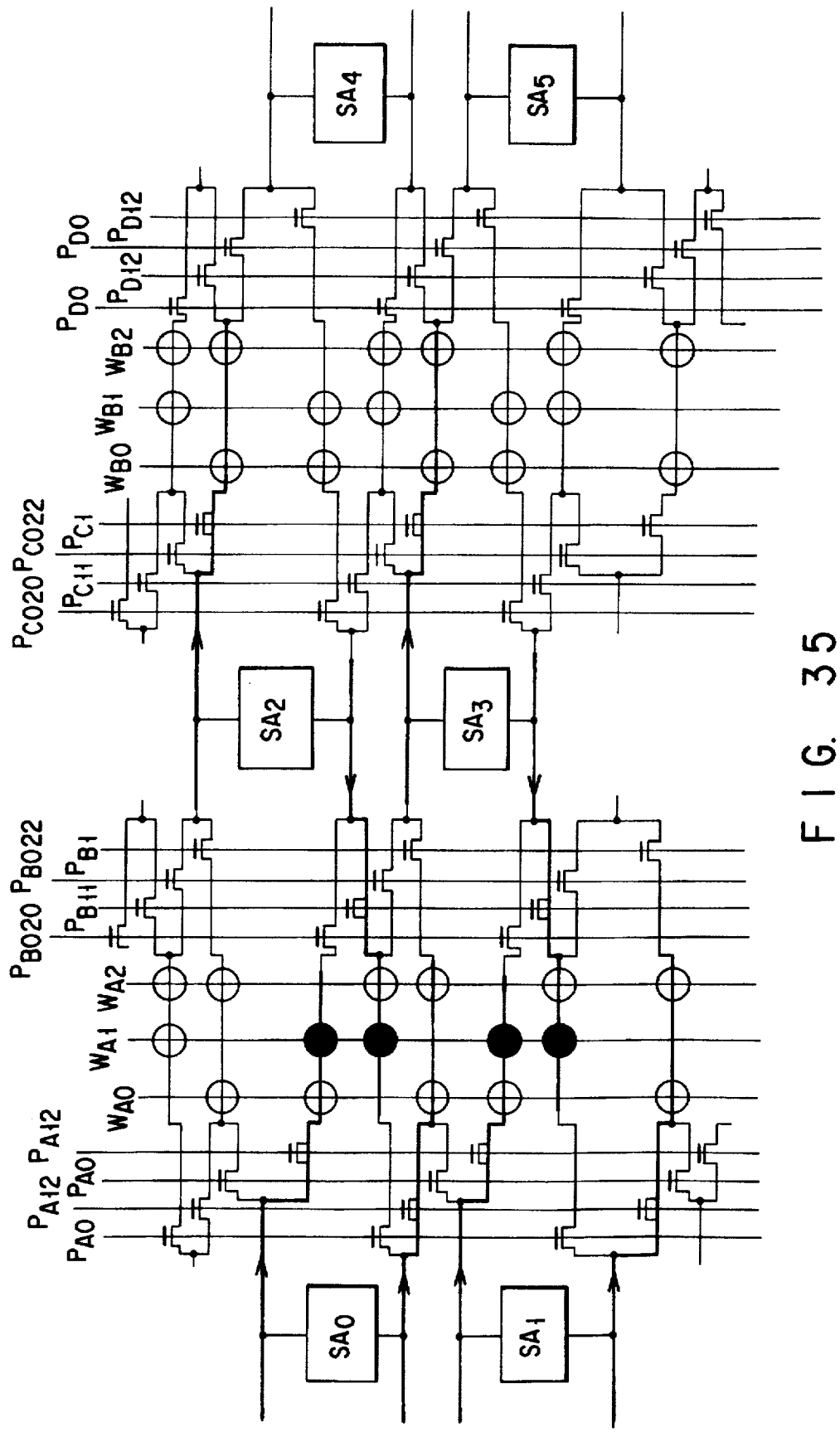
FIG. 35 is still another circuit diagram of the eleventh embodiment also showing how the connections of the bit lines are switched.

Likewise, when word lines $W_{A1}$, and $W_{A2}$ are selected, control signals $P_{A0}$, $P_{A12}$, $P_{B1}$, $P_{B11}$, $P_{B020}$, $P_{B022}$, $P_{C11}$, $P_{C1}$, $P_{CO20}$ and $P_{CO22}$ are controlled appropriately as shown in FIG. 31 so that, when $W_{A1}$ is selected, the connection between the bit line for reading the data of the memory cell and the bit line of the corresponding sense amplifier is switched to that of FIG. 34, while it is switched to that of FIG. 35 for a rewriting operation.

Figure 36:
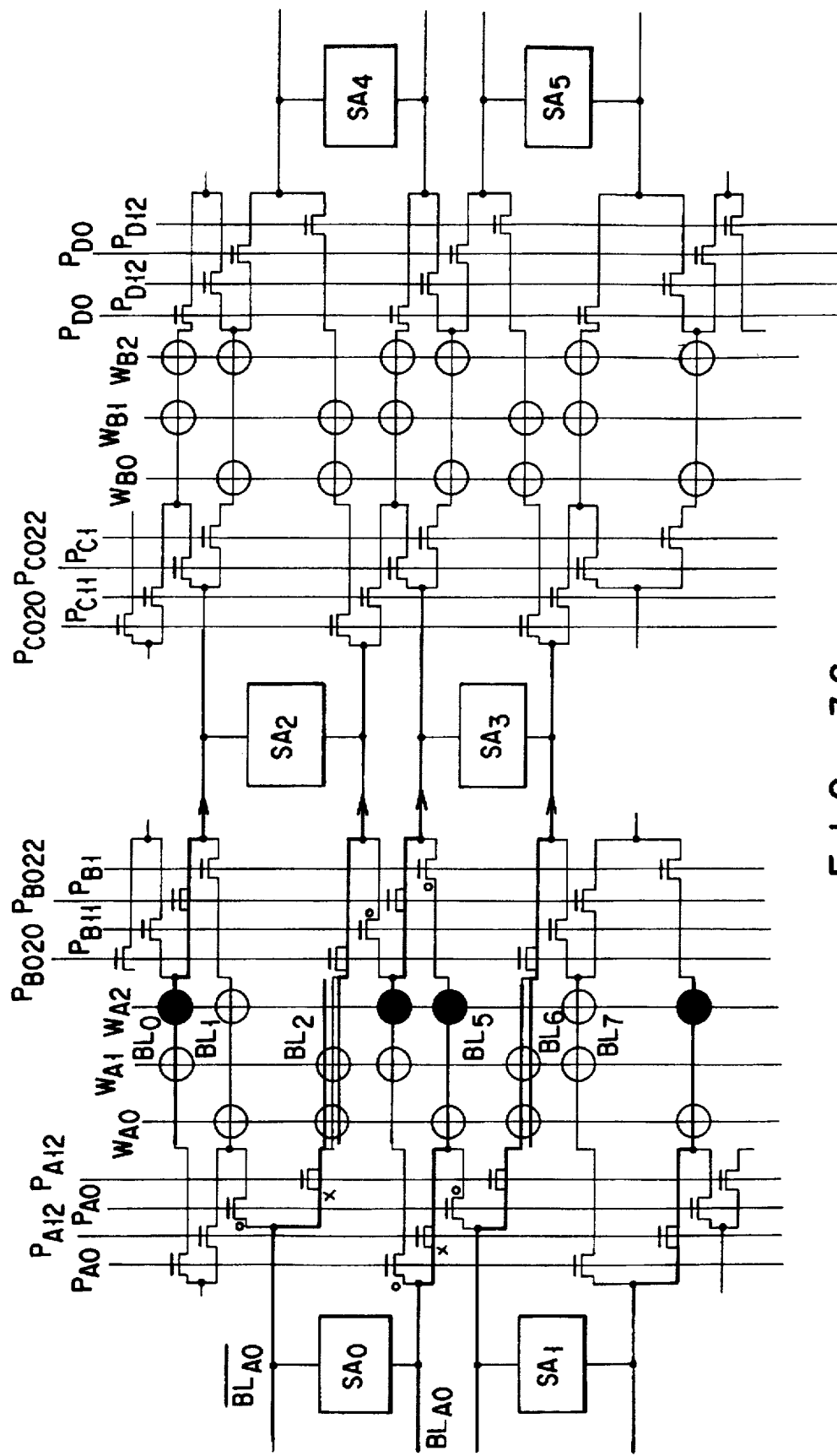
FIG. 36 is still another circuit diagram of the eleventh embodiment also showing how the connections of the bit lines are switched.
Figure 37:
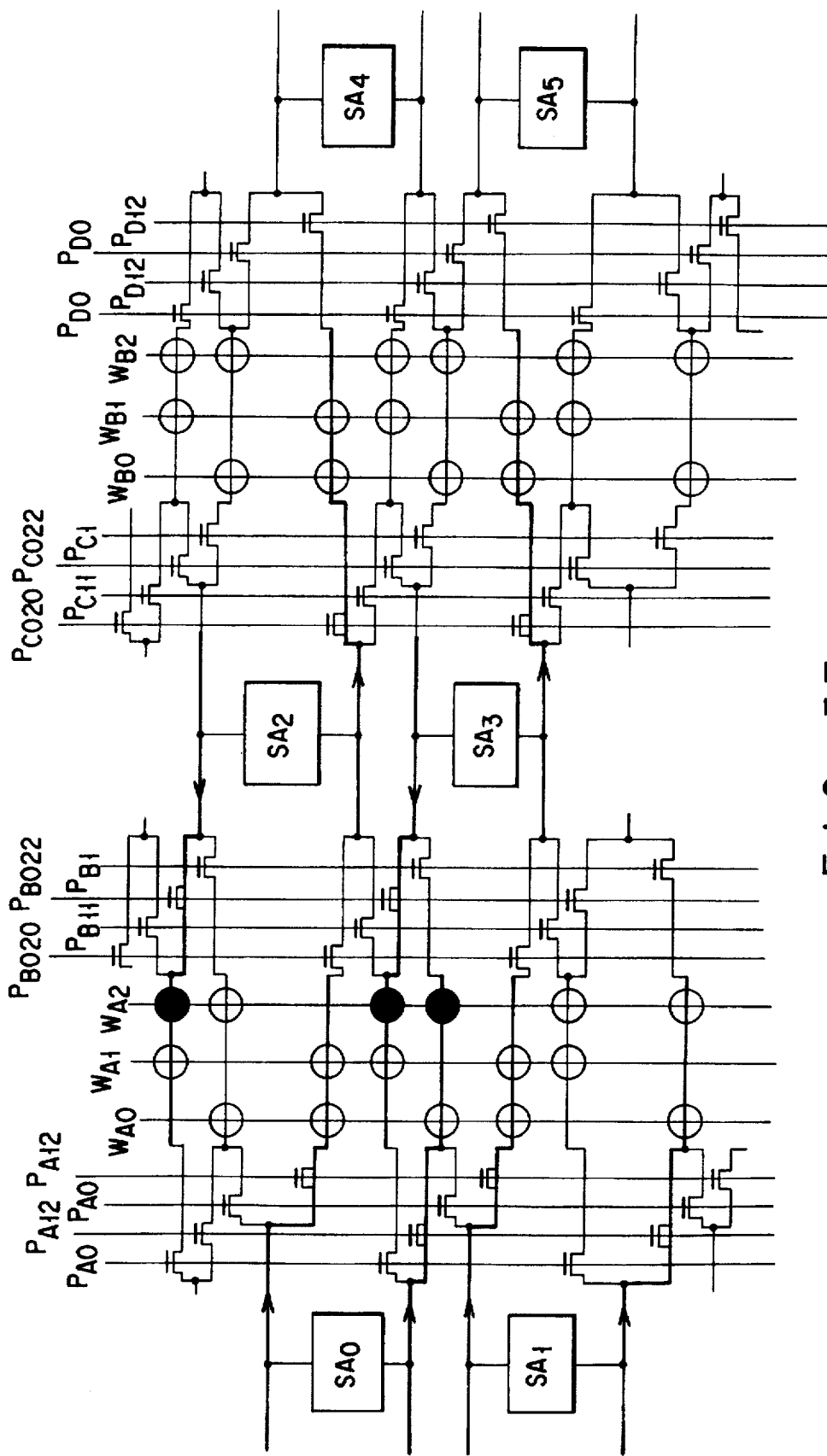
FIG. 37 is still another circuit diagram of the eleventh embodiment also showing how the connections of the bit lines are switched.

Similarly, when $W_{A2}$ is selected, the connection between the bit line for reading the data of the memory cell and the bit line of the corresponding sense amplifier is switched to that of FIG. 36, while it is switched to that of FIG. 35 for a rewriting operation.

In either case, a bit line through which data is read out of a memory cell is switched and placed between a bit line pair for every data reading operation to reduce the maximum array noise may be always reduced to $C_{BB}V_S$.

In FIG. 36, $BL_1$ and BL6 are respectively placed between bit line pair $BL_0$ and $BL_2$ of the outermost sense amplifier $SA_2$ and bit line pair $BL_5$ and $BL_7$ of sense amplifier $SA_1$ These bit lines are not used for reading out memory cell data onto any sense amplifier when $W_{A2}$ is selected and hence do not affect bit line pairs of $BL_0$ and $BL_2$ and $BL_5$ and BL7 with reading out noises.

It may be understood by comparing FIGS. 32, 34 and 36 that, by switching the word line from $W_{A0}$ to $W_{A1}$, the selected memory cell moves downward by a bit line in the memory cell and, correspondingly, the connection of the bit line of the memory cell array and that of the sense amplifier is also switched downward by a bit line when $W_{A1}$, is selected. When $W_{A2}$ is selected, however, the connection of bit lines is lowered by a bit line on the side of $SA_0$ and $SA_1$, although it is made same as when $W_{A0}$ is selected on the side of $SA_2$ and $SA_3$. With this arrangement of switching the connection of the bit line of the cell array and that of the sense amplifier according to the selected word line, the noise level can be significantly reduced.

(Embodiment 12)

Figure 38:
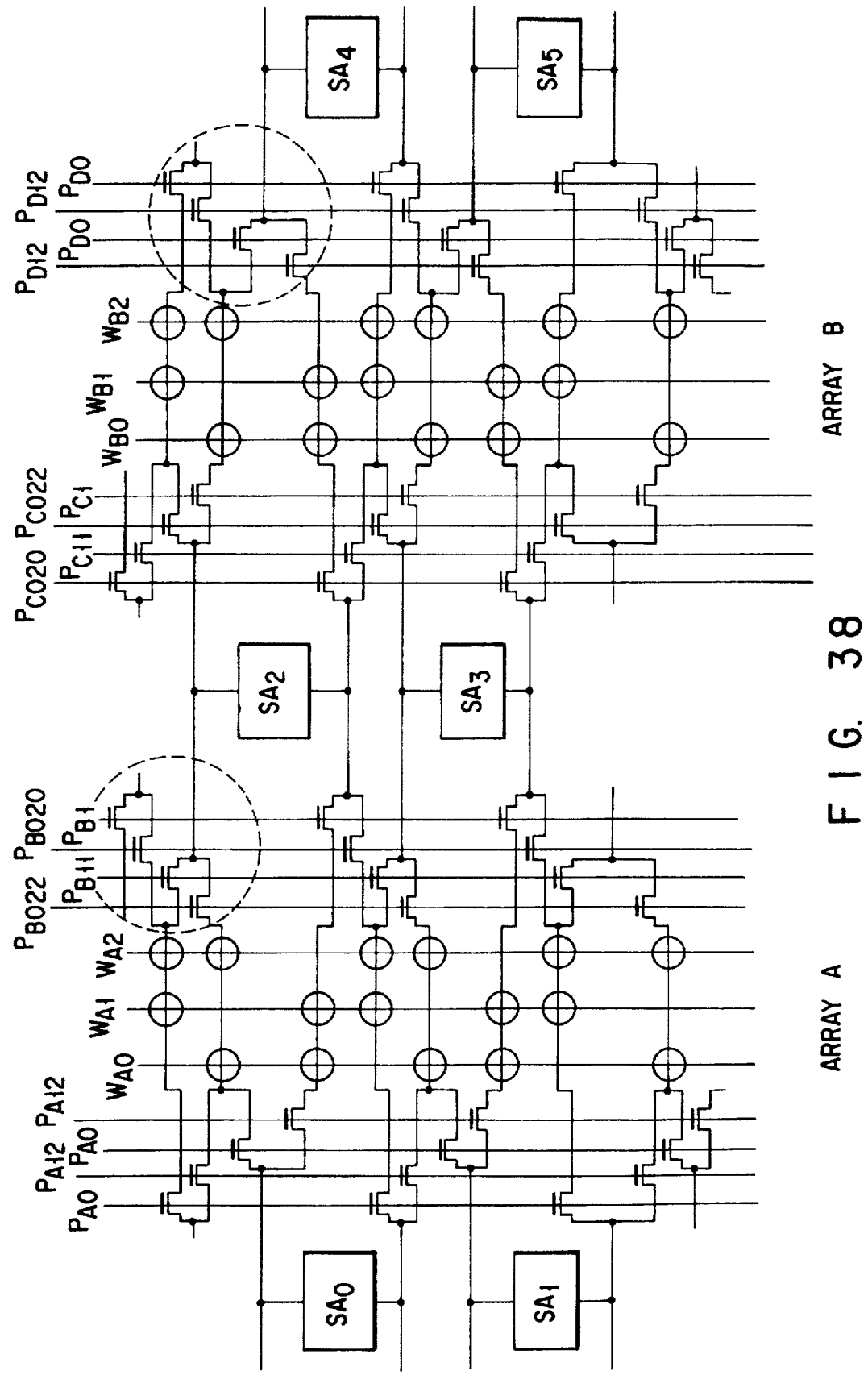
FIG. 38 is a circuit diagram of a twelfth embodiment of DRAM according to the invention.

FIG. 38 is a circuit diagram of a twelfth embodiment of DRAM according to the invention, showing two cell arrays (A, B) as examples.

This embodiment is the same as the tenth embodiment shown in FIG. 30 in terms of equivalent circuit and differs from it in that the switches for connecting the sense amplifiers and the memory cells show a mirror image of those of FIG. 30 in the sense of word lines within the broken circles. In other words, the switches may be located differently without changing the equivalent circuit. Since the operation of the circuit of FIG. 38 operates exactly same as that of the circuit of FIG. 30, it will not be described here any further.

(Embodiment 13)

Figure 39:
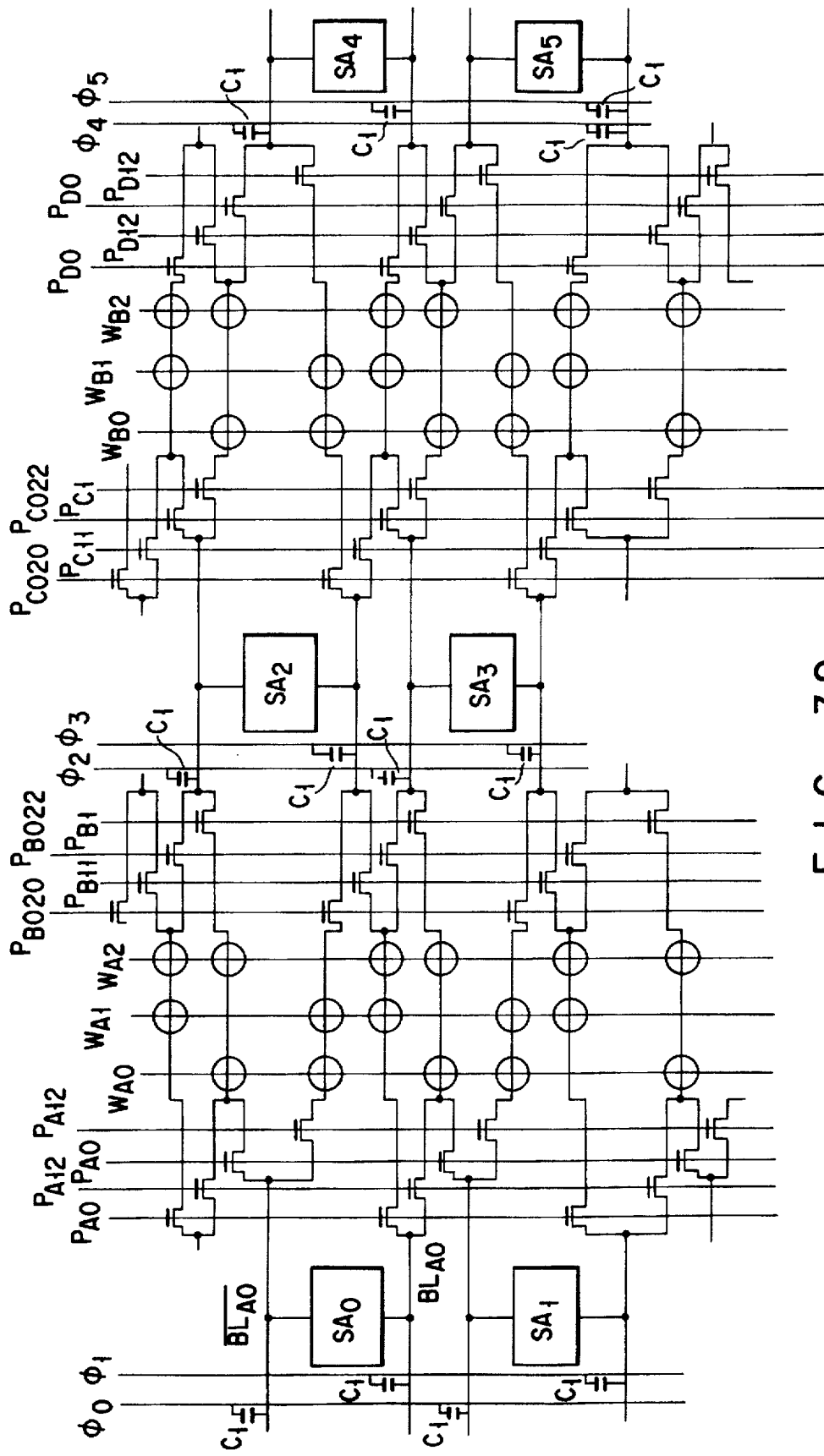
FIG. 39 is a circuit diagram of a thirteenth embodiment of DRAM according to the invention.
Figure 40:
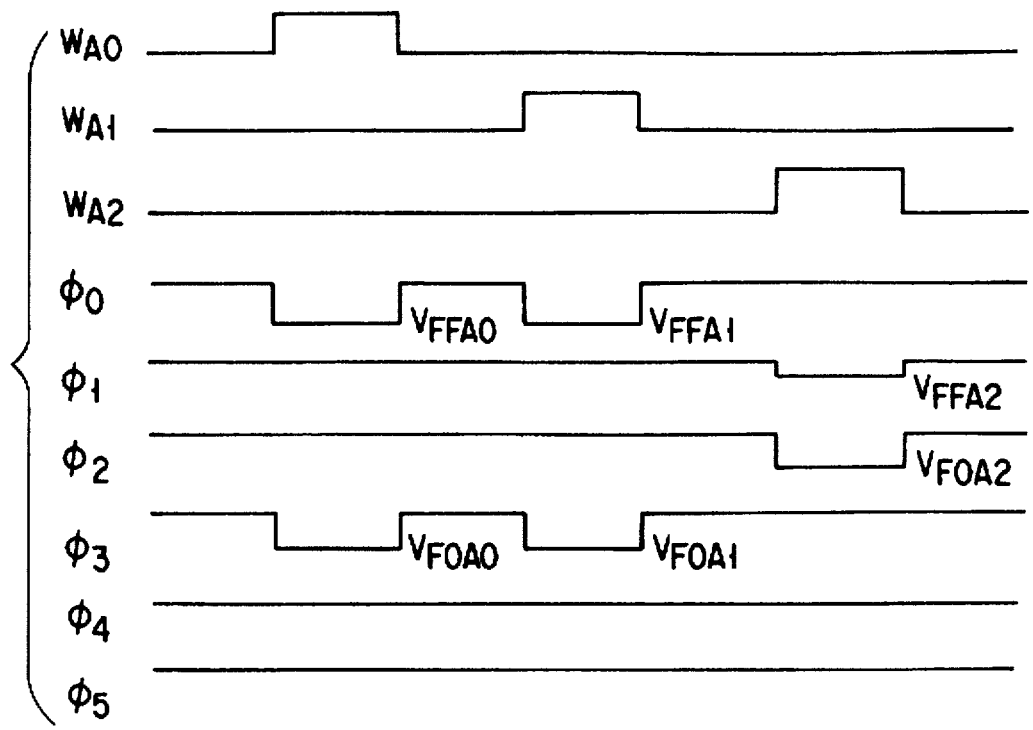
FIG. 40 is a timing chart for driving the thirteenth embodiment.

FIG. 39 is a circuit diagram of a thirteenth embodiment of DRAM according to the invention, showing two cell arrays (A, B) as examples. FIG. 40 is a timing charts for driving the embodiment.

This embodiment is free from the following problem of the eleventh embodiment. By looking into the operation of $SA_0$ when word line $W_{A0}$ is selected in FIG. 32, it will be understood that $P_{A12}$, $P_{B11}$ and $P_{B1}$ are brought down from "H" to "L" before the word line is raised for reading data. Under this condition, the bit line connected to the source or drain is slightly lowered by capacitive coupling of the gate and the source or the gate and the drain of the transistor of the switch between the cell array and the sense amplifier. This is indicated by "." in FIG. 32. Additionally, since the cell data is latched to $SA_0$ after the word line is raised and it is moved into $SA_0$, $P_{A0}$, $P_{B020}$ and $P_{B022}$ are lowered. The locations to be affected by coupling are indicated by "x". Note that bit line /$BL_{A0}$ through which the memory cell data of $SA_0$ is read out carries three "."s and a "x" and reference bit line $BL_{A0}$ also carries three "."s and a "x".

On the other hand, when $W_{A1}$ is selected as shown in FIG. 34, bit line /$BL_{A0}$ on the cell data side of $SA_0$ carries two "."s and a "x", while bit line $BL_{A0}$ on the reference side carries three "."s and a "x". When $W_{A2}$ is selected as shown in FIG. 36, bit line $BL_{A0}$ on the cell data side of $SA_0$ carries three "."s and a "x", while bit line /$BL_{A0}$ on the reference side carries two "."s and a "x". Thus, the influence of coupling differs depending on the selected one of bit lines $W_{A0}$ through $W_{A2}$ and consequently the level of ease of reading data "1" differs from that of reading data "0".

For instance, when a bit line through which memory cell data is read out is lowered as it is influenced by coupling, "1" becomes less easy to be read, whereas "0" becomes easier to be read. Additionally, the level of ease of reading data "1" may differ from that of reading data "0" when some of the components such as switches are arranged differently as in the case of FIGS. 30 and 38.

The arrangement of FIG. 39 can dissolve such problems. In FIG. 39, capacitors having a coupling capacitance of $C_1$ are connected to bit line pairs of the sense amplifier sections and control signals $\phi_0$ through $\phi_5$ are connected to the opposite terminals of the respective capacitors so that the above described unbalance of bit line pairs is compensated by using $\phi_0$ through $\phi_5$ when data are read out from memory cells. It will be understood that the idea is the same as that of the first embodiment described earlier.

Since the degree of unbalance of bit line pairs may vary depending on the selected one of word lines $W_{A0}$ through $W_{A2}$, the amplitudes of $\phi 0$ through $\phi 5$ are differentiated depending on the selected one of word lines $W_{A0}$ through $W_{A2}$ as shown in FIG. 40. Thus, the technique used in this embodiment differs from any known dummy cell techniques or coupling techniques of a single correction type with which all the amplitudes of the control signals are made same and identical.

Referring to FIG. 40, as the data of a memory cell is read out, the control signal connected to $C_1$ of the bit line of the sense amplifier section located on the bit line side of the memory cell from which the data is read out is lowered. For example, when $W_{A0}$ is selected, the memory cell data is read out onto /$BL_{A0}$ so that $\phi_0$ is lowered to $V_{FFA0}$. FIGS. 41A through 41D illustrate exemplary circuits that can realize such a variable amplitude.

Signal $\phi_0$ is precharged to $V_{CC}$ because $\phi_{FFA0}$ and $\phi_{FFA1}$ are at level "L". When $W_{A0}$ is selected, only $V_{FFA0}$ is raised to level "H" and $\phi_0$ is lowered to the source voltage of $V_{FFA0}$.

Figure 42:
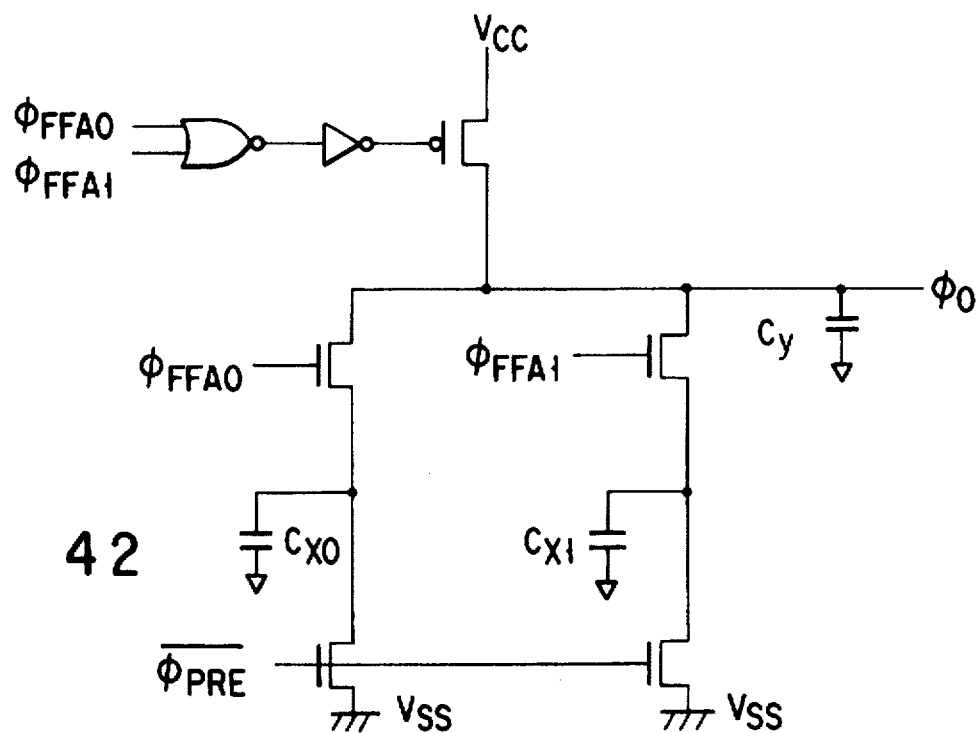
FIG. 42 is a circuit diagram of another exemplary drive circuit for generating control signals $\phi_0$ through $\phi_4$ to be used for the thirteenth embodiment.

When different source voltages of $V_{FFA0}$, $V_{FFA1}$, $V_{FFA2}$, $V_{FOA0}$, $V_{FOA1}$ and $V_{FOA2}$ are generated in the chip in FIGS. 41A through 41D, the circuit of FIG. 42 can generate any desired voltage from $V_{CC}$ and $V_{SS}$ in a simple manner.

Referring to FIG. 42, at the time of precharging, /$\phi_{PRE}$ is at "H" and $C_{X0}$ and $C_{X1}$ are precharged to $V_{SS}$, while $\phi$ is precharged $V_{CC}$ because $\phi_{FFA0}$ and $\phi_{FFA1}$ are at level "L". Then, as /$\phi_{PRE}$ goes to level "L" and $\phi_{FFA0}$ rises to level "H" as a result of the selection of $W_{A0}$, output $\phi_0$ falls as a result of charge distribution of capacitance $C_{X0}$ and negative capacitance $C_Y$.

The amplitude of $\phi_0$ can be varied freely by changing the values of $C_{X0}$ and $C_{X1}$. This technique can be applied to the arrangement of FIG. 38.

It should be noted that, not only the amplitudes of $\phi_0$ through $\phi_2$ can be independently varied but also the location of the word line used to select the value of capacitance $C_1$ of the sense amplifier, the locations of the sense amplifiers for receiving $\phi_0$ and $\phi_1$, capacitance $C_1$ of the sense amplifiers for receiving $\phi_2$, $\phi_3$, $\phi_4$ and $\phi_5$, the amplitude of dummy word lines and the potentials of dummy cells if they are of the type of external data writing in order to correct any undesired unbalances.

Note that the above embodiments may be modified within the scope of the invention.

The following embodiments are designed to improve the logic circuit for determining the remainder of the division of the address of a word line by three, the output of which logic circuit is used as a signal for driving memory cell arrays for the purpose of the invention. Note that such a logic circuit may also be used for Embodiments 1 through 13 described above.

(Embodiment 14)

Figure 43:
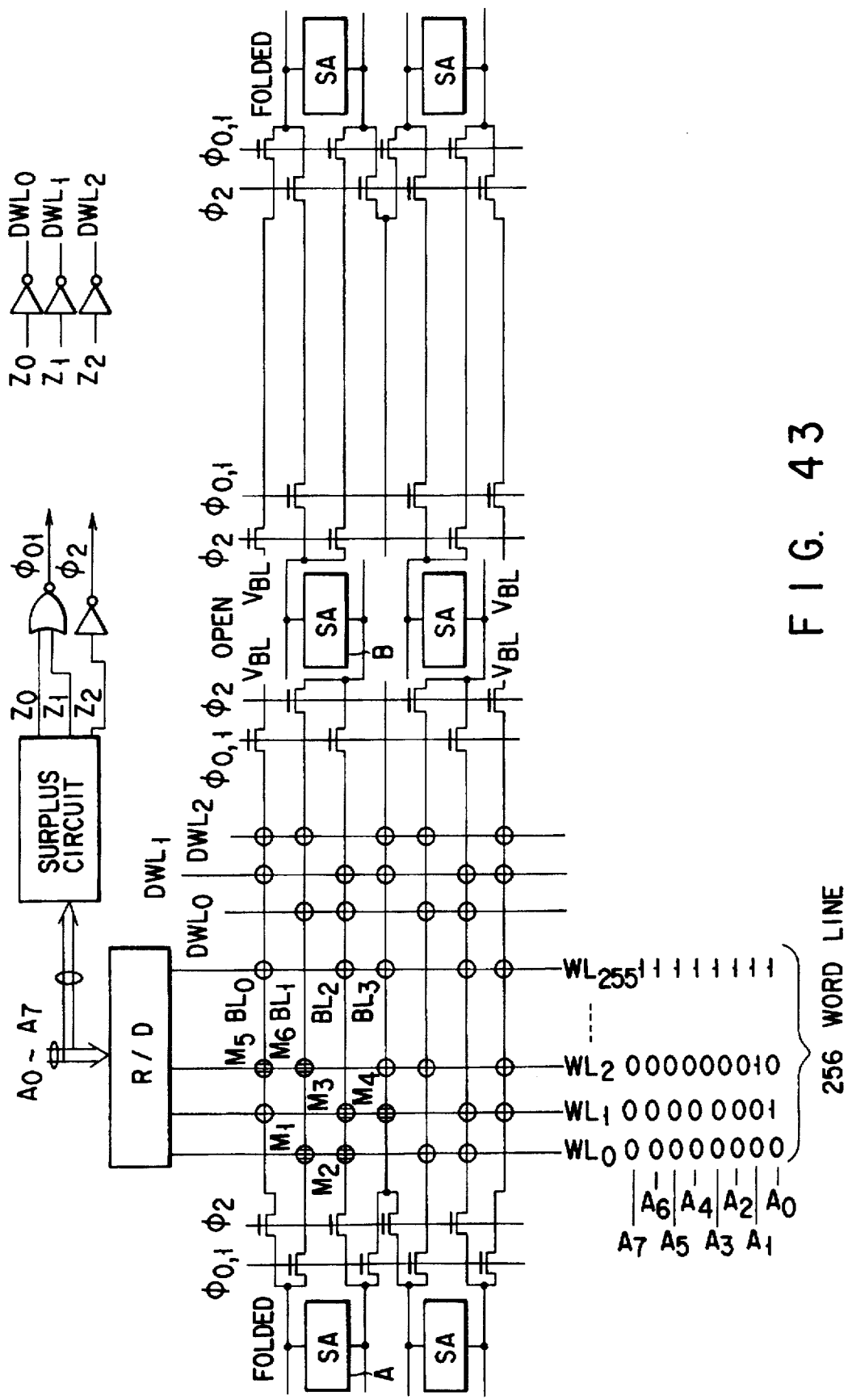
FIG. 43 is a circuit diagram of a fourteenth embodiment of DRAM according to the invention.

FIG. 43 is a circuit diagram of a fourteenth embodiment of DRAM according to the invention. This embodiment is a dynamic semiconductor memory device with an open/folded hybrid BL configuration, wherein each of the cell arrays comprises a total of 256 word lines. The basic configuration of the device is not particularly different from that of any comparable conventional devices.

A 8-bit address of $A_0$ through $A_7$ is used for the word lines. FIG. 44 is a circuit diagram of a surplus circuit for determining the remainder produced by dividing the address of the selected word line by three.

In the embodiment, three signal lines $Z_0$, $Z_1$ and $Z_2$ are used for the output of the surplus circuit as in the case of the known surplus circuit described earlier. More specifically, $Z_0$="1" is used if the remainder of the division by three of the address is equal to 0 and $Z_1$="1" is used if the remainder of the division by three of the address is equal to 1, whereas $Z_2$="1" is used if the remainder of the division by three of the address is equal to 2. In addition, that the chip is in a stand-by state is expressed by $Z_0=Z_1=Z_2$="0".

The relationship between the output of the surplus circuit and the input address is shown in Table 2 below.

TABLE 2

| $A_7$ | $A_6$ | $A_5$ | $A_4$ | $A_3$ | $A_2$ | $A_1$ | $A_0$ | $Z_0$ | $Z_1$ | $Z_2$ |
|---|---|---|---|---|---|---|---|---|---|---|
| 0 | 0 | 0 | 0 | 0 | 0 | 0 | 0 | 1 | 0 | 0 |
| 0 | 0 | 0 | 0 | 0 | 0 | 0 | 1 | 0 | 1 | 0 |
| 0 | 0 | 0 | 0 | 0 | 0 | 1 | 0 | 0 | 0 | 1 |
| 0 | 0 | 0 | 0 | 0 | 0 | 1 | 1 | 1 | 0 | 0 |
| 0 | 0 | 0 | 0 | 0 | 1 | 0 | 0 | 0 | 1 | 0 |
| 0 | 0 | 0 | 0 | 0 | 1 | 0 | 1 | 0 | 0 | 1 |
| 0 | 0 | 0 | 0 | 1 | 1 | 0 | 1 | 0 | 0 | |
| 0 | 0 | 0 | 0 | 1 | 1 | 1 | 0 | 1 | 0 | |

23

TABLE 2-continued

| A7 | A6 | A5 | A4 | A3 | A2 | A1 | A0 | Z0 | Z1 | Z2 |
|----|----|----|----|----|----|----|----|----|----|----|
| 0 | 0 | 0 | 0 | 1 | 0 | 0 | 0 | 0 | 0 | 1 |
| ... | | | | | | | | ... | | |
| 1 | 1 | 1 | 1 | 1 | 1 | 1 | 1 | 0 | 1 | 0 |
| when chip is in a stand-by state | | | | | | | | 0 | 0 | 0 |

The surplus circuit of this embodiment comprises circuits A and B. The eight bits of each address is divided into four 2-bits, each of which is divided by three and the remainder is determined by circuit A, whereas circuit B adds two 3-phase signals and divides the sum by three to produce the remainder. FIGS. 45A and 45B shows exemplary circuit configurations of circuit A and circuit B respectively.

Address signal $A_1$ and its complementary signal $/A_i$ are used as inputs to the surplus circuit. These address signals are held to "L" when the chip is in a stand-by state and either $A_i$ or $/A_i$ goes to "H" when the chip is activated.

When the chip is in a stand-by state and hence $A_i$ and $/A_i$ are held to "L", any outputs from circuit A are at "L" to make any outputs from circuit B that uses the outputs of circuit A are also at "L" to consequently make all the outputs of $Z_0$, $Z_1$ and $Z_2$ of the surplus circuit stay at "L". When the chip is activated and either $A_i$ or $/A_i$ is brought up to "H", only one of the three outputs of circuit A goes to "H". Then, the result is conveyed to circuit B and, in the end, only one of the three outputs of the surplus circuit changes from "L" to "H".

Figure 11:
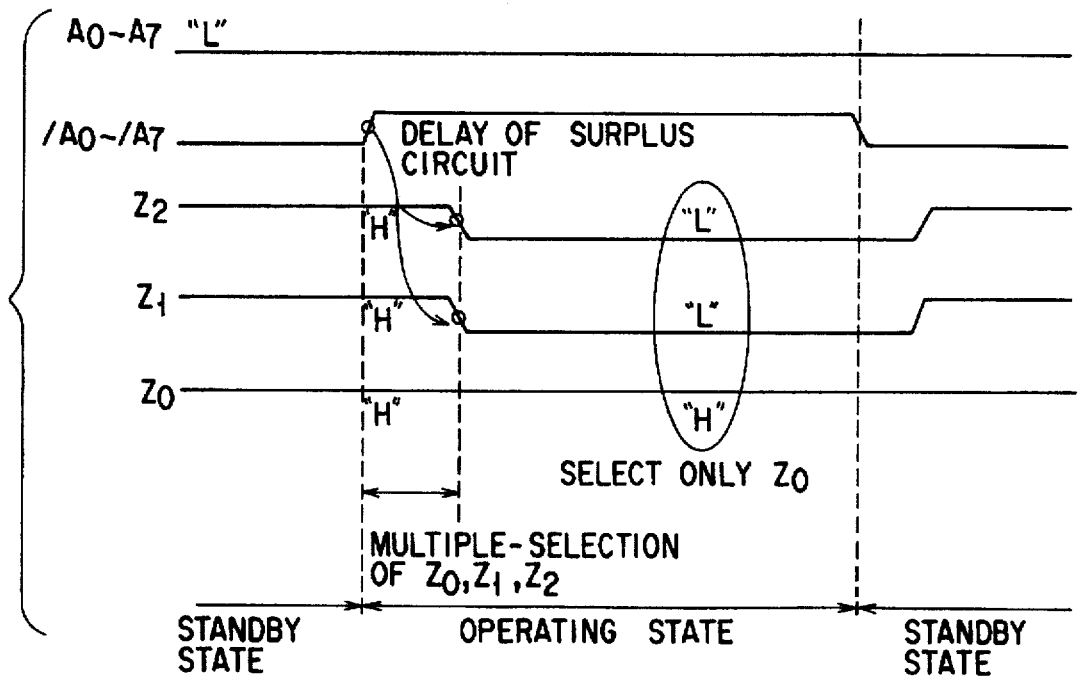
FIG. 11 is a graph of waveforms showing the operation of a conventional surplus circuit.
Figure 10:
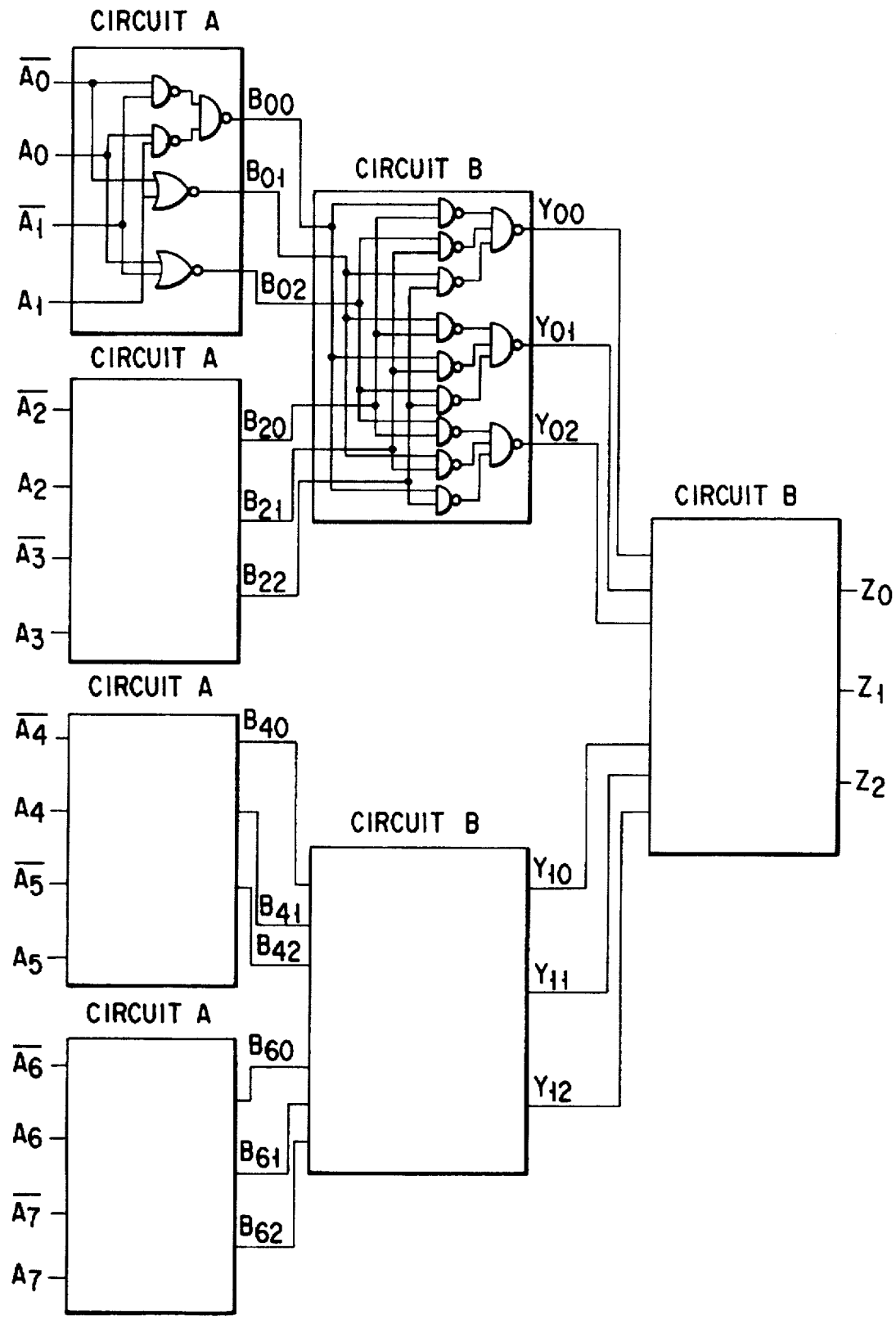
FIG. 10 is a schematic circuit diagram of the surplus circuit used for a conventional DRAM.

FIG. 46 illustrates the above description. Since $Z_0$, $Z_1$, and $Z_2$ are all at "L" in a stand-by state, no problem of multiple selection as illustrated in FIG. 11 occurs when the chip is activated so that the chip is made to operate stably at any time.

(Embodiment 15)

Figure 47:
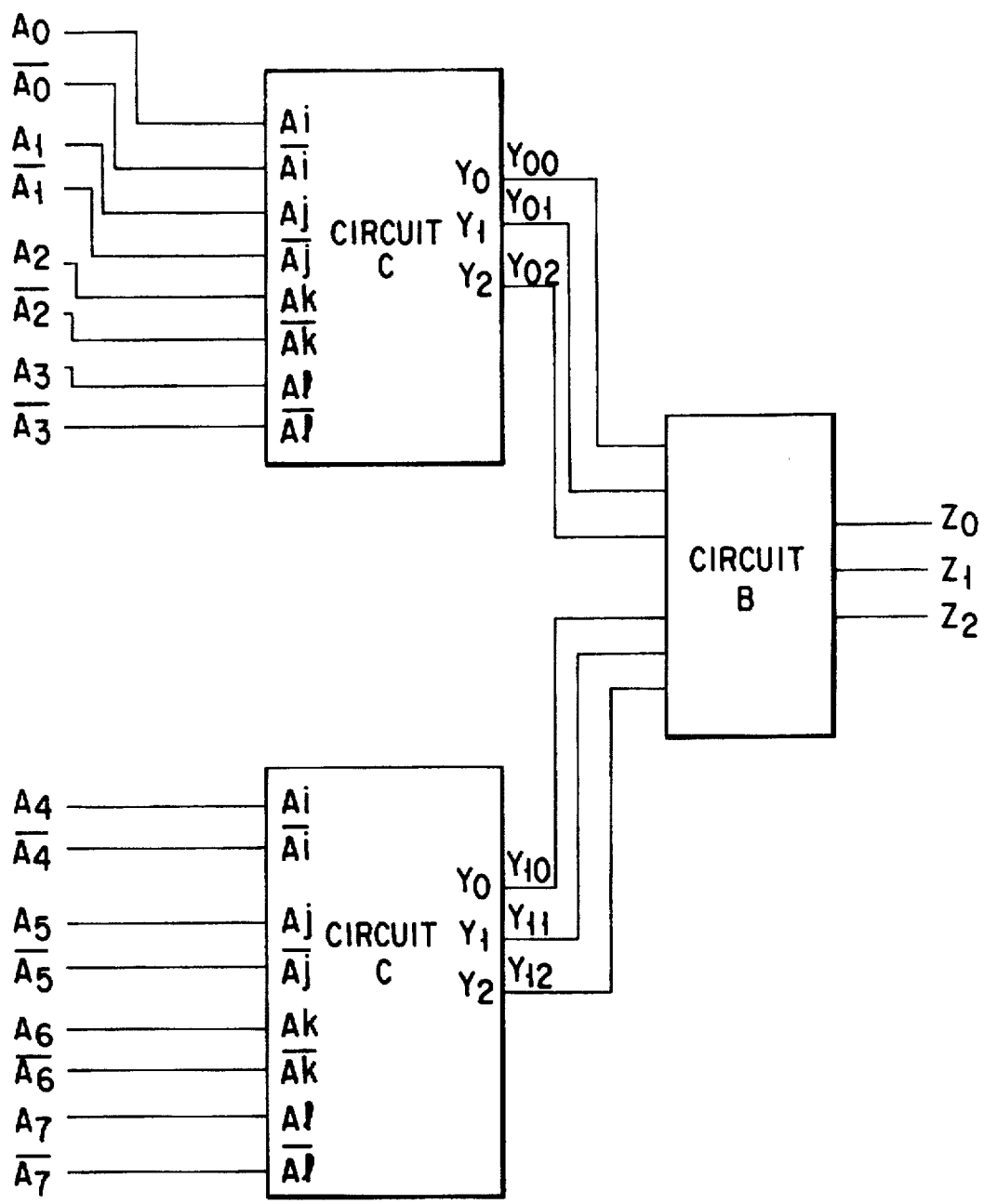
FIG. 47 is a schematic circuit diagram of the surplus circuit used for a fifteenth embodiment.

FIG. 47 illustrates a fifteenth embodiment of the invention, which is a surplus circuit having circuit A that uses 4-bit addresses as inputs. FIGS. 48A through 48S illustrates exemplary circuit diagrams of circuits C of the surplus circuit of FIG. 47.

The surplus circuit of this embodiment comprises circuits C for receiving a 4-bit address signal and its complementary signal and produces the remainders obtained by dividing them by three respectively and circuit B for receiving the outputs of two circuits C and produces the remainder obtained by dividing the sum by three. Note that circuit B is identical with the one used in the fourteenth embodiment.

In this embodiment, three outputs $Y_{00}$, $Y_{01}$ and $Y_{02}$ of the first circuit C that receives address signals $A_0$ through $A_3$ and three outputs $Y_{10}$, $Y_{11}$ and $Y_{12}$ of the second circuit C that receives their complementary signals $A_4$ through $A_7$ are applied to circuit B that is identical with that of the fourteenth embodiment and outputs $Z_0$, $Z_1$ and $Z_2$ of circuit B represents the remainders obtained by dividing addresses $A_0$ through $A_7$ by three.

As in the case of the preceding embodiment, when the chip is in a stand-by state and address signal $A_i$ and its complementary signal $/A_i$ is held to "L", any outputs from circuit C is held to "L" so that, consequently, all the outputs $Z_0$, $Z_1$, and $Z_2$ of circuit C is held to "L". The relationship between the input address and the output of the surplus circuit is the same as that of the preceding embodiment.

Note that each address is divided into 2-bits in the fourteenth embodiment and the remainders obtained by dividing them by three are added by the addition circuit of circuit B, whereas each address is divided into 4-bits, which

24 are then added in the fifteenth embodiment. Likewise, addresses may be divided into even-bits such as 2-bits, 4-bits, 6-bits and so on for determining the remainders of the division by 3 of addresses.

On the other hand, the maximum number of addresses from which remainders are obtained is typically the number of the word lines comprises in a memory cell array. In other words, the number of bits of addresses is typically eight (256 word lines) to ten (1,024 word lines). Thus, an address is preferably divided into 2-bits or 4-bits.

(Embodiment 16)

Figure 49:
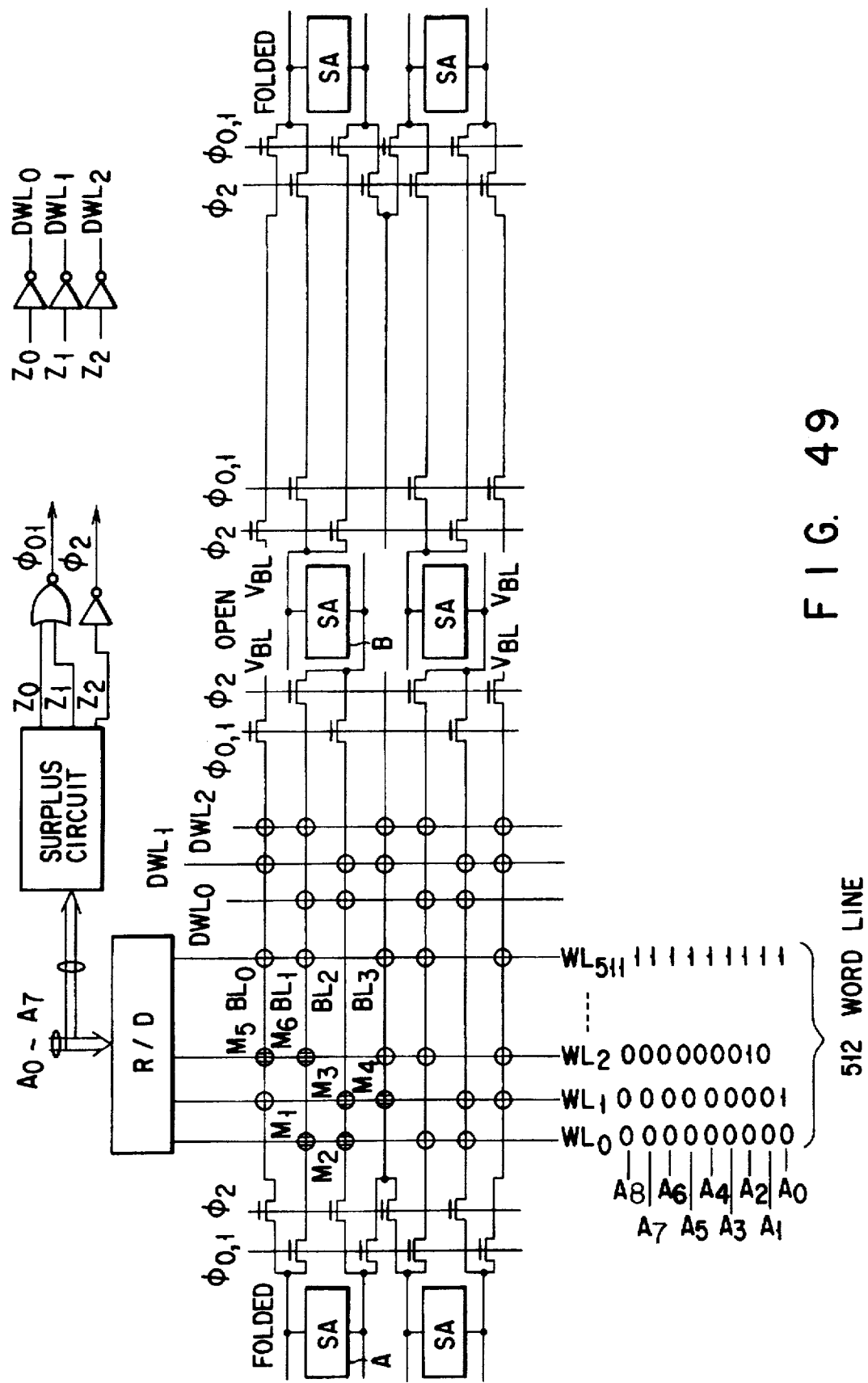
FIG. 49 is a circuit diagram of a sixteenth embodiment of DRAM according to the invention.

FIG. 49 is a circuit diagram of a sixteenth embodiment of DRAM according to the invention. In this embodiment, each memory cell array comprises 512 word lines, although it is a dynamic semiconductor memory device with an open/folded hybrid BL configuration like Embodiments 14 and 15.

Addresses $A_0$ through $A_8$ of the word lines are 9-bit addresses. FIG. 50 shows a circuit diagram of the surplus circuit for determining the remainder obtained by dividing the address of a selected word line by three.

The relationship between the output of the surplus circuit and the input address is shown in Table 3 below.

TABLE 3

| A8 | A7 | A6 | A5 | A4 | A3 | A2 | A1 | A0 | Z0 | Z1 | Z2 |
|----|----|----|----|----|----|----|----|----|----|----|----|
| 0 | 0 | 0 | 0 | 0 | 0 | 0 | 0 | 0 | 1 | 0 | 0 |
| 0 | 0 | 0 | 0 | 0 | 0 | 0 | 0 | 1 | 0 | 1 | 0 |
| 0 | 0 | 0 | 0 | 0 | 0 | 0 | 1 | 0 | 0 | 0 | 1 |
| 0 | 0 | 0 | 0 | 0 | 0 | 1 | 1 | 1 | 0 | 0 | |
| 0 | 0 | 0 | 0 | 0 | 0 | 1 | 0 | 0 | 0 | 1 | 0 |
| 0 | 0 | 0 | 0 | 0 | 0 | 1 | 0 | 1 | 0 | 0 | 1 |
| 0 | 0 | 0 | 0 | 0 | 0 | 1 | 1 | 0 | 1 | 0 | 0 |
| 0 | 0 | 0 | 0 | 0 | 1 | 1 | 1 | 0 | 1 | 0 | |
| 0 | 0 | 0 | 0 | 0 | 1 | 0 | 0 | 0 | 0 | 0 | 1 |
| ... | | | | | | | | | ... | | |
| 1 | 1 | 1 | 1 | 1 | 1 | 1 | 1 | 0 | 0 | 0 | 1 |
| when chip is in a stand-by state | | | | | | | | | 0 | 0 | 0 |

(Embodiment 17)

Figure 51:
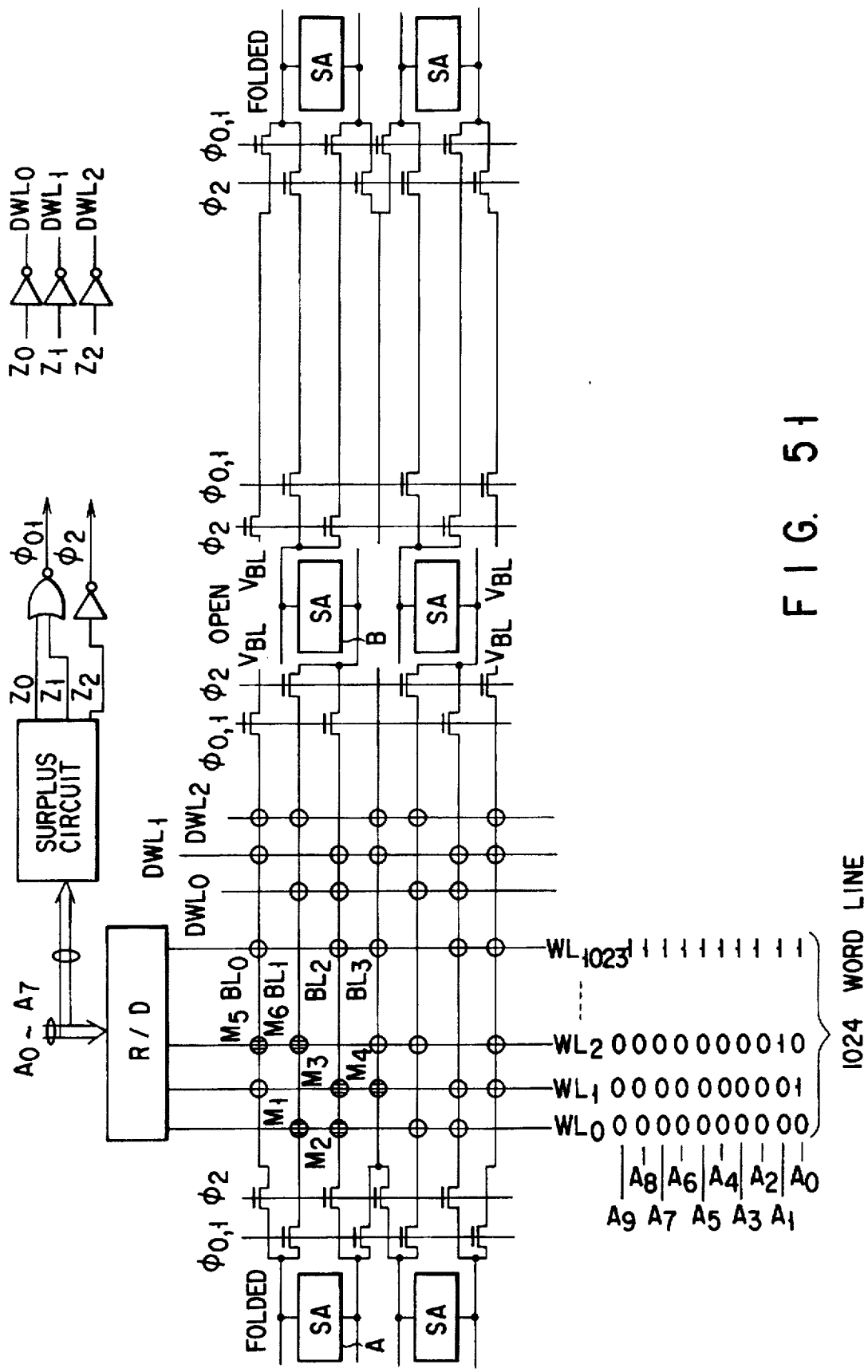
FIG. 51 is a circuit diagram of a seventeenth embodiment of DRAM according to the invention.

FIG. 51 is a circuit diagram of a seventeenth embodiment of DRAM according to the invention. In this embodiment, each memory cell array comprises 1,024 word lines, although it is a dynamic semiconductor memory device with an open/folded hybrid BL configuration like Embodiments 14 through 16.

Addresses $A_0$ through $A_9$ of the word lines are 10-bit addresses. FIG. 52 shows a circuit diagram of the surplus circuit for determining the remainder obtained by dividing the address of a selected word line by three.

The relationship between the output of the surplus circuit and the input address is shown in Table 4 below.

TABLE 4

| A9 | A8 | A7 | A6 | A5 | A4 | A3 | A2 | A1 | A0 | Z0 | Z1 | Z2 |
|----|----|----|----|----|----|----|----|----|----|----|----|----|
| 0 | 0 | 0 | 0 | 0 | 0 | 0 | 0 | 0 | 0 | 1 | 0 | 0 |
| 0 | 0 | 0 | 0 | 0 | 0 | 0 | 0 | 0 | 1 | 0 | 1 | 0 |
| 0 | 0 | 0 | 0 | 0 | 0 | 0 | 0 | 1 | 0 | 0 | 0 | 1 |
| 0 | 0 | 0 | 0 | 0 | 0 | 0 | 0 | 1 | 1 | 1 | 0 | 0 |
| 0 | 0 | 0 | 0 | 0 | 0 | 0 | 1 | 0 | 0 | 0 | 1 | 0 |
| 0 | 0 | 0 | 0 | 0 | 0 | 0 | 1 | 0 | 1 | 0 | 0 | 1 |
| 0 | 0 | 0 | 0 | 0 | 0 | 0 | 1 | 1 | 0 | 1 | 0 | 0 |
| 0 | 0 | 0 | 0 | 0 | 0 | 0 | 1 | 1 | 1 | 0 | 1 | 0 |
| 0 | 0 | 0 | 0 | 0 | 0 | 1 | 0 | 0 | 0 | 0 | 0 | 1 |
| ... | | | | | | | | | | ... | | |
| 1 | 1 | 1 | 1 | 1 | 1 | 1 | 1 | 1 | 1 | 0 | 1 | 0 |
| when chip is in a stand-by state | | | | | | | | | | 0 | 0 | 0 |

(Embodiment 18)

FIGS. 53 and 54A through 54C illustrate an eighteenth embodiment of the invention, which is a surplus circuit comprising barrel shifters utilizing a pass transistor logic for switching first three inputs $X_0$, $X_2$ and $X_2$ and three outputs $Y_0$, $Y_1$ and $Y_2$ depending on the value of a second input.

Figure 53:
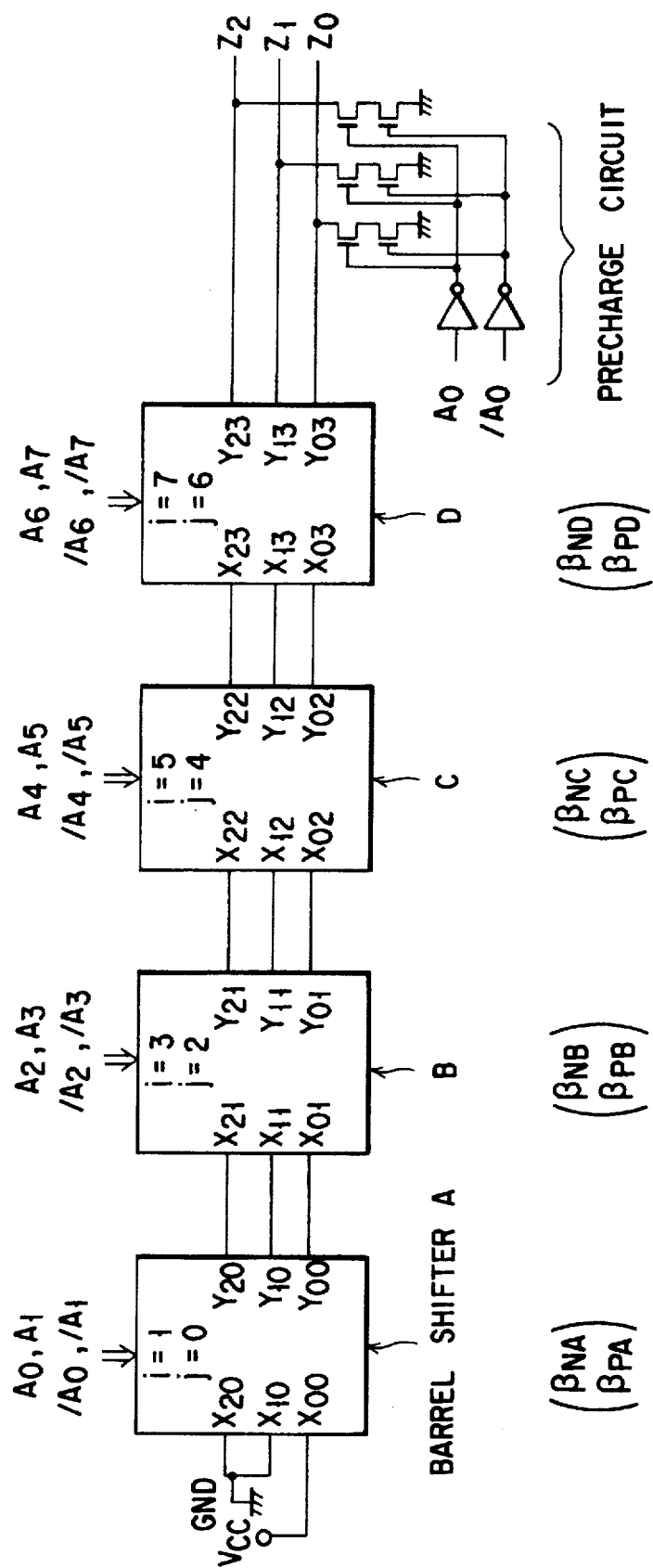
FIG. 53 is a schematic circuit diagram of the surplus circuit used for an eighteenth embodiment.
Figure 54A:
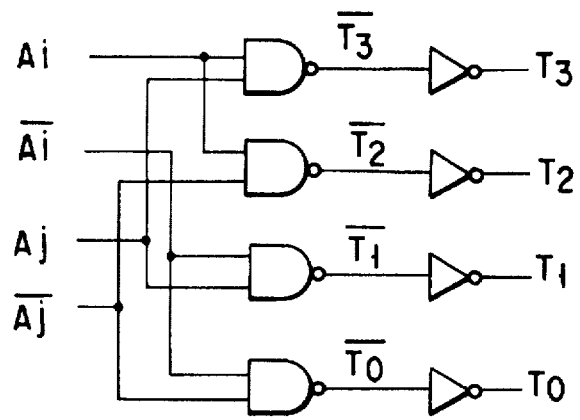
FIGS. 54A through 54C are circuit diagrams of exemplary barrel shifters that can be used for the surplus circuit of the eighteenth embodiment.
Figure 54B:
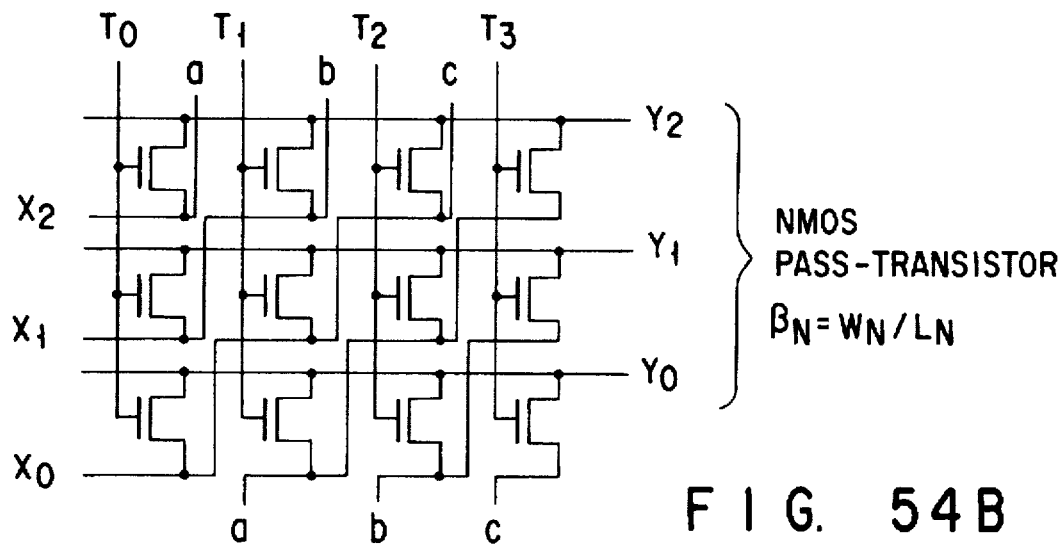
Figure 54C:
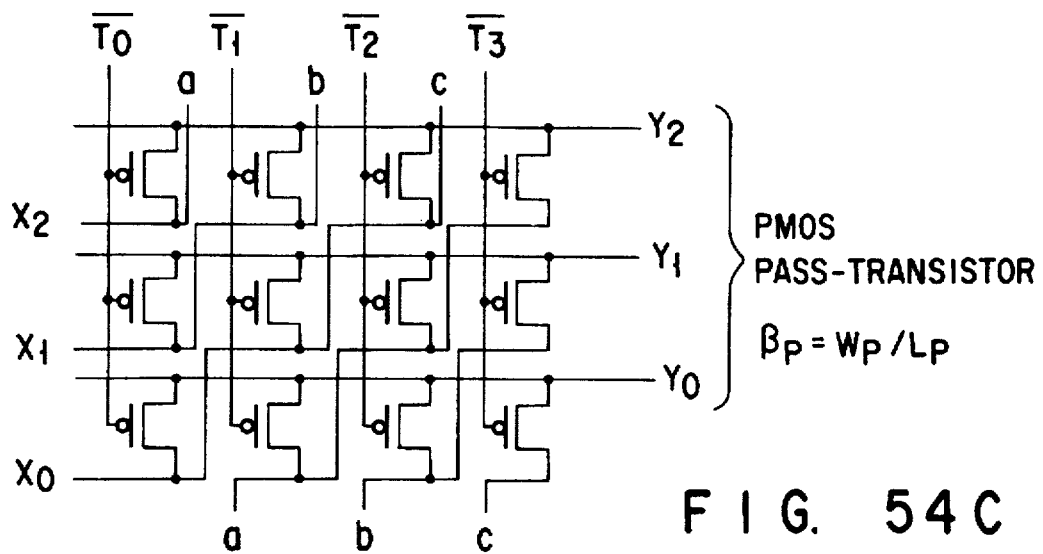

FIG. 53 is a circuit diagram illustrating the connection of barrel shifters and a precharge circuit connected to the output nodes of the barrel shifters, whereas FIGS. 54A through 54C illustrate individual barrel shifters respectively. The barrel shifters of FIGS. 54A through 54C control the connection of first inputs $X_0$, $X_2$ and $X_2$ and outputs $Y_0$, $Y_1$ and $Y_2$ by means of second inputs of 2-bit address signals $A_i$ and $A_j$ and their complementary signals $/A_i$ and $/A_j$.

In this embodiment, $X_0$, $X_2$ and $X_2$ and $Y_0$, $Y_1$ and $Y_2$ are connected by means of nMOS and pMOS transistors. The nMOS transistor has a gate length of LN and a gate width of WN, whereas pMOS transistor has a gate length of LP and a gate width of WP. While a CMOS comprising an nMOS and a pMOS is effective for transmitting all input voltages without discrimination using a threshold value, the same effect can be achieved to produce similar outputs simply by means of either an nMos or a pMOS.

The relationship between inputs $X_0$, $X_2$ and $X_2$ and outputs $Y_0$, $Y_1$ and $Y_2$ is shown in Table 4 below.

TABLE 4

|  | $Y_0$ | $Y_1$ | $Y_2$ |
| --- | --- | --- | --- |
| $A_1 = 0, A_j = 0$ (0) | $X_0$ | $X_2$ | $X_2$ |
| $A_1 = 0, A_j = 1$ (1) | $X_2$ | $X_0$ | $X_2$ |
| $A_1 = 1, A_j = 0$ (1) | $X_2$ | $X_2$ | $X_0$ |
| $A_1 = 1, A_j = 1$ (3) | $X_0$ | $X_2$ | $X_2$ |

When the chip is in a stand-by state, all address signals $A_i$, $A_j$, $/A_i$ and $/A_j$ are at "L" so that the first input and the output of circuit A are electrically isolated from each other. Since the output of the fourth barrel shifter in FIG. 53 is brought into an electrically floating state under this condition, the potentials of output $Z_0$, $Z_1$ and $Z_2$ are held stationary by means of a precharge circuit. More specifically, since address signal $A_0$ and its complementary signal $/A_0$ is held to "L" in a stand-by state, outputs $Z_0$, $Z_1$ and $Z_2$ are short-circuited to show the ground potential under this condition.

When the chip is activated, either $A_0$ or $/A_0$ is brought up to "H" and, therefore, $Z_0$, $Z_1$ and $Z_2$ are isolated from the ground by the precharge circuit. However, their output nodes are connected to the input potentials by the barrel shifter connected thereto in series under the activated condition, the output potential would not become unstable. The relationship between address signals $A_0$ through $A_7$ and outputs $Z_0$, $Z_1$ and $Z_2$ of the surplus circuit is shown in Table 6 below.

TABLE 6

| $A_7$ | $A_6$ | $A_5$ | $A_4$ | $A_3$ | $A_2$ | $A_1$ | $A_0$ | $Z_0$ | $Z_1$ | $Z_2$ |
| --- | --- | --- | --- | --- | --- | --- | --- | --- | --- | --- |
| 0 | 0 | 0 | 0 | 0 | 0 | 0 | 0 | H | L | L |
| 0 | 0 | 0 | 0 | 0 | 0 | 0 | 1 | L | H | L |
| 0 | 0 | 0 | 0 | 0 | 0 | 1 | 0 | L | L | H |
| 0 | 0 | 0 | 0 | 0 | 0 | 1 | 1 | H | L | L |
| 0 | 0 | 0 | 0 | 0 | 1 | 0 | 0 | L | H | L |
| 0 | 0 | 0 | 0 | 0 | 1 | 0 | 1 | L | L | H |
| 0 | 0 | 0 | 0 | 0 | 1 | 1 | 0 | H | L | L |
| 0 | 0 | 0 | 0 | 0 | 1 | 1 | 1 | L | H | L |
| 0 | 0 | 0 | 0 | 1 | 0 | 0 | 0 | L | L | H |
| ... | | | | | | | | | | |
| 1 | 1 | 1 | 1 | 1 | 1 | 1 | 1 | L | H | L |
| when the chip is in a stand-by state | | | | | | | | L | L | L |

(Embodiment 19)

Figure 55:
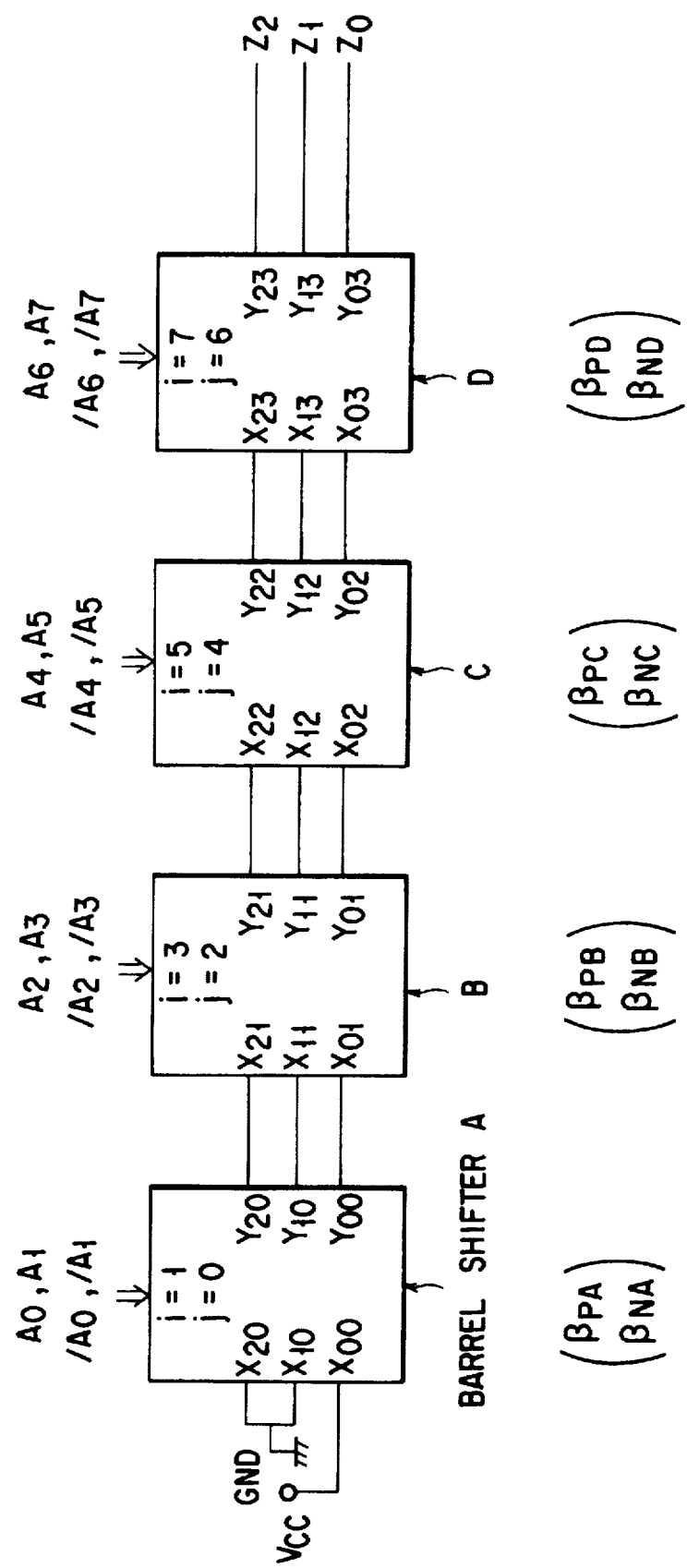
FIG. 55 is a schematic circuit diagram of the surplus circuit used for a nineteenth embodiment.

FIGS. 55 and 56A through 56D shows a nineteenth embodiment of the invention. FIG. 55 shows the connection of barrel shifters and FIGS. 56A through 56D are circuit diagrams of the individual barrel shifters.

In this embodiment, each of the barrel shifters is provided with a precharge circuit for holding the output voltage to a fixed level in a stand-by state. More specifically, when all input signals $A_i$, $A_j$, $/A_i$ and $/A_j$ are at "L", $X_0$, $X_2$ and $X_2$ and $Y_0$, $Y_1$ and $Y_2$ are electrically insulated from each other and only the outputs are held to the ground potential. The relationship between the addresses and the outputs is exactly same as those of Embodiments 14 through 16.

Note that, with circuit configuration of this embodiment, the gate length and the gate width of each of the barrel shifters that are connected in series are not necessarily be held constant. The ratio of gate width W to gate length L, or $\beta=W/L$, is normally proportional to the drive capacity of transistor so that the delay time from the input to the output of the surplus circuit can be reduced by varying the ratios of the four barrel shifters connected in series slightly for each of them.

More specifically, the delay time can be minimized by selecting $\beta$ values of the pMOS transistors of the four barrel shifters A, B, C and D that are connected in series so as to satisfy the following relationship.

$$\beta_{PA} > \beta_{PB} > \beta_{PC} > \beta_{PD}$$

This is because each of the barrel shifters has its own electric capacitance and, therefore, the electric charge it has to allow to pass therethrough for electric charge from "L" in the precharge stage to "H" for a selected condition increases with the distances from outputs $Z_0$, $Z_1$ and $Z_2$.

Note that the operating speed of nMOS transistor is not related to this embodiment in terms of $\beta$. So, the following relationship may well be satisfied.

$$\beta_{NA} = \beta_{NB} = \beta_{NC} = \beta_{ND}$$

(Embodiment 20)

FIG. 57 shows a twentieth embodiment of the invention.

In this embodiment, the outputs of the circuit A of Embodiment 14 are applied as input to the barrel shifters of Embodiment 18. The relationship between addresses and outputs is exactly same as those of Embodiments 14 through 17.

(Embodiment 21)

Figure 58:
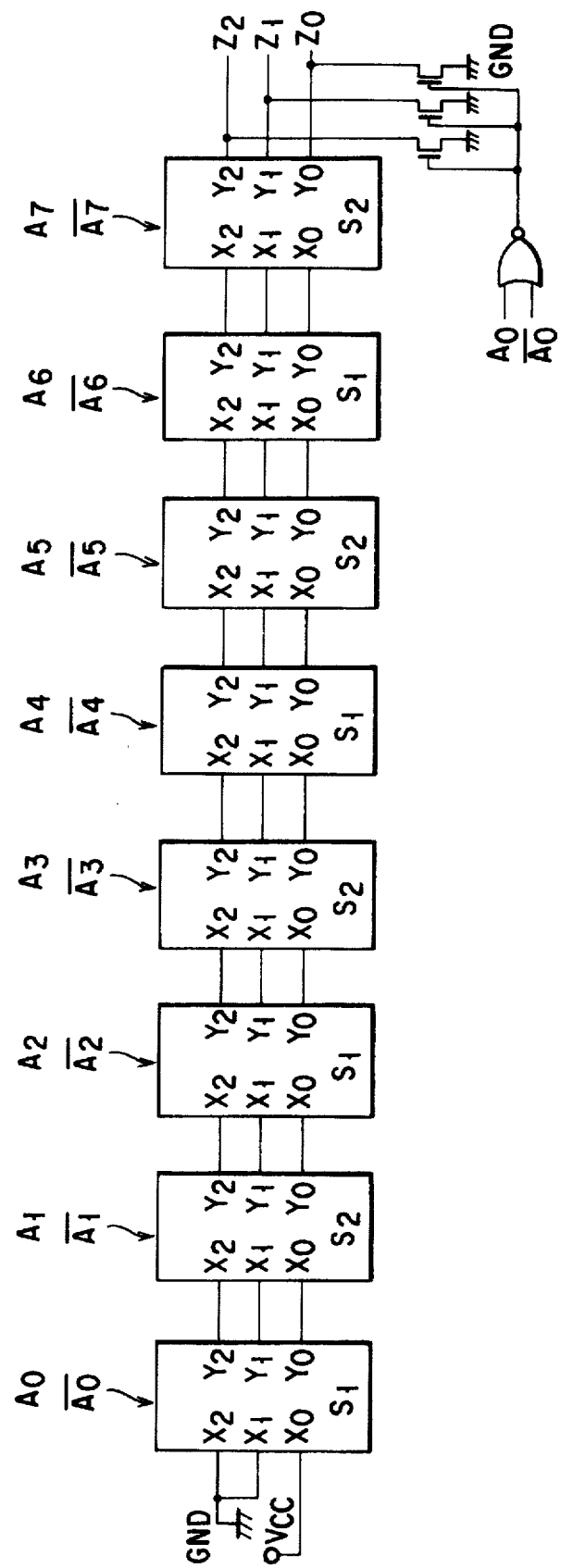
FIG. 58 is a schematic circuit diagram of the surplus circuit used for a twenty first embodiment.

FIGS. 58, 59A and 59B show a twenty first embodiment of the invention.

Unlike Embodiments 18 through 20, where 2-bit addresses are applied to a barrel shifter, it has barrel shifters to show a one-to-one correspondence with addresses.

Note, however, two types of shifters are provided in this embodiment. A first shifter S1 shifts the output by +1 relative to the input for address $A_i$="1" ($Y_2=X_2$, $Y_1=X_0$, $Y_0=X_2$) but does not shift the output relative to the input for address $A_i$="0" ($Y_2=X_2$, $Y_1=X_2$, $Y_0=X_0$) and a second shifter S2 shifts the output by −1 relative to the input for address $A_i$="1" ($Y_2=X_0$, $Y_1=X_2$, $Y_0=X_2$) but does not shift the output relative to the input when address $A_i$="0".

The first shifter S1 is used for even number addresses ($A_0$, $A_2$, $A_4$, $A_6$), whereas the second shifter S2 is used for odd number addresses ($A_1$, $A_3$, $A_5$, $A_7$). FIGS. 59A and 59B are circuit diagrams of the shifters S1 and S2.

As in the case of Embodiment 18, a precharge circuit is provided at the final stage ($Z_0$, $Z_1$, $Z_2$) of output of the surplus circuit. When the chip is in a stand-by state, the relationship of $Z_2=Z_1=Z_0$="L" is secured. However, note that the single precharge circuit may be replaced by individual precharge circuits as in the case of Embodiment 19.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A dynamic semiconductor memory device comprising:
   at least first and second memory cell arrays having a plurality of memory cells selectively arranged at respective intersections of a plurality of word lines and a plurality of bit lines;
   a first sense amplifier section connected at an end of the first cell array to a first plurality of bit line pairs formed by part of said plurality of bit lines of said first cell array, said first plurality of bit line pairs having a folded bit line configuration;
   a second sense amplifier section connected to sets of second bit line pairs, each of the second bit line pairs being formed by a remaining one of the bit lines of said first cell array and one bit line of the plurality of bit lines of said second cell array, said second plurality of bit line pairs having an open bit line configuration; and
   a correction means for correcting an imbalance in a reading level or noise level of data being read, said imbalance arising relative to reading data indicating different binary data levels.

2. A dynamic semiconductor memory device according to claim 1, wherein the bit lines having the folded bit line configuration and those having the open bit line configuration change positions depending on the positions of the selected word lines.

3. A dynamic semiconductor memory device according to claim 1, wherein two-thirds of the bit lines have a folded bit line configuration and a remaining one-third have an open bit line configuration.

4. A dynamic semiconductor memory device according to claim 1, wherein a bit line with an open bit line configuration is placed between each bit line pair with a folded bit line configuration.

5. A dynamic semiconductor memory device according to claim 1, wherein a set of lines is formed by every three bit lines, two of which form a bit line pair with a folded bit line configuration and a remaining bit line forms an open bit line pair with a bit line of an adjacent cell array.

6. A dynamic semiconductor memory device according to claim 1, wherein said correction means performs at least either a capacitor coupling operation or an electric charge distributing operation for either the bit line or the reference bit line of a memory cell selected for reading data therefrom.

7. A dynamic semiconductor memory device according to claim 1, wherein said correction means provide two or more than two levels of ease of reading data.

8. A dynamic semiconductor memory device according to claim 1, wherein correction amounts corrected by said correction means are different between an open bit line structure and a folded bit line structure.

9. A dynamic semiconductor memory device according to claim 1, wherein correction amounts corrected by said correction means are different in types of selected word lines.

10. A dynamic semiconductor memory device according to claim 1, wherein two-thirds of the intersections of the plurality of word lines and the plurality of bit lines carry respective memory cells.

11. A dynamic semiconductor memory device comprising:
   at least first and second memory cell arrays having a plurality of memory cells selectively arranged at respective intersections of a plurality of word lines and a plurality of bit lines;
   a sense amplifier section connected at an end of the first cell array to a first plurality of bit line pairs formed by part of said plurality of bit lines of said first cell array; and
   a correction means for correcting an imbalance in a reading level or noise level of data being read said imbalance arising relative to reaching data indicating different binary data levels, wherein
   said first plurality of bit line pairs have a folded bit line configuration, and
   a controller for controlling remaining bit lines of said first cell array to form a second set of bit line pairs with reference side bit lines of said second set of bit line pairs having a folded bit line configuration until sense amplifiers start operating and then to form bit line pairs having an open bit lines configuration with part of plurality of bit lines from a second cell array located adjacent to said first cell array with a further sense amplifier section interposed between said cell arrays, said open bit lines configuration being formed during a subsequent restoring operation for rewriting data into the memory cells after operation of the sense amplifiers.

12. A dynamic semiconductor memory device according to claim 11, wherein the bit lines having the folded bit line configuration and those having the open bit line configuration change positions depending on positions of selected word lines.

13. A dynamic semiconductor memory device according to claim 11, wherein two-thirds of the bit lines have a folded bit line configuration and a remaining one-third have an open bit line configuration.

14. A dynamic semiconductor memory device according to claim 11, wherein a bit line with an open bit line configuration is placed between each bit line pair with a folded bit line configuration.

15. A dynamic semiconductor memory device according to claim 11, wherein a set of lines is formed by every three bit lines, two of which form a bit line pair with a folded bit line configuration and a remaining bit line form an open bit line pair with a bit line of an adjacent cell array.

16. A dynamic semiconductor memory device according to claim 11, wherein said correction means performs at least either a capacitor coupling operation or an electric charge distributing operation for either the bit line or a reference bit line of a memory cell selected for reading data therefrom.

17. A dynamic semiconductor memory device according to claim 11, wherein said correction means provides two or more than two levels correcting read data.

18. A dynamic semiconductor memory device according to claim 11, wherein two-thirds of the intersections of the plurality of word lines and the plurality of bit lines carry respective memory cells.

19. A dynamic semiconductor memory device comprising:
   a plurality of memory cell arrays having a plurality of memory cells selectively arranged at respective intersections of a plurality of word lines and a plurality of bit lines;
   a sense amplifier section connected at an end of a first cell array to a first plurality of bit line pairs formed by two-thirds of a plurality of bit lines in said first cell array, said plurality of first bit line pairs having a folded bit line configuration; and a switch and controller for changing over the connection between the bit lines in the first cell array and said sense amplifier section to make a bit line selected for reading a memory cell to be disposed between a folded bit line pair regardless of a position of a selected word line, wherein a remaining one-third of the bit lines of said plurality of bit lines in said first cell array form second bit line pairs, with reference side bit lines of said second bit line pairs having a folded bit line configuration until sense amplifiers start operating to put a neighboring bit line, to which cell data is read out, between said folded bit line pair, and then form bit line pairs having an open bit lines configuration respectively with one-third of a plurality of bit lines of a second cell array located adjacent to said first cell array with a further sense amplifier section interposed between said cell arrays, said open bit lines configuration being formed during a subsequent restoring operation for rewriting data into the memory cells after the operation of the sense amplifiers.

20. A dynamic semiconductor memory device according to claim 19, further comprising a correction means for correcting voltage differences between read data indicating one binary data value and read data indicating an opposite binary data value.

21. A dynamic semiconductor memory device according to claim 20, wherein said correction means performs at least either a capacitor coupling operation or an electric charge distributing operation for either the bit line or a reference bit line of a memory cell selected for reading data therefrom.

22. A dynamic semiconductor memory device according to claim 20, wherein said correction means provide two or more than two levels of ease of reading data.

23. A dynamic semiconductor memory device according to claim 19, wherein two-thirds of the intersections of the plurality of word lines and the plurality of bit lines carry respective memory cells.

24. A dynamic semiconductor memory device comprising:

a logic circuit for receiving a binary number having a plurality of digits as input, dividing it by three and producing a signal representing the remainder of "0", "1" or "2" as output to be used as a signal representing different states for driving memory cell arrays;

said logic circuit provides a fourth state except for the state of "0", "1" nor "2".

25. A dynamic semiconductor memory device according to claim 24, wherein the output of said logic circuit comprises three signal lines, which are equal to (1, 0, 0) when the remainder obtained by dividing the input by three is 0, (0, 1, 0) when the remainder obtained by dividing the input by three is 1, (0, 0, 1) when the remainder obtained by dividing the input by three is 2 and (0, 0, 0) in a stand-by state of the memory cell arrays.

* * * * *